United States Patent
Thiruvenkatanathan

(10) Patent No.: US 11,859,488 B2
(45) Date of Patent: Jan. 2, 2024

(54) DAS DATA PROCESSING TO IDENTIFY FLUID INFLOW LOCATIONS AND FLUID TYPE

(71) Applicant: BP Exploration Operating Company Limited, Middlesex (GB)

(72) Inventor: Pradyumna Thiruvenkatanathan, Richmond (GB)

(73) Assignee: BP EXPLORATION OPERATING COMPANY LIMITED, Middlesex (GB)

(*) Notice: Subject to any disclaimer, the term of this patent is extended or adjusted under 35 U.S.C. 154(b) by 223 days.

(21) Appl. No.: 16/698,335

(22) Filed: Nov. 27, 2019

(65) Prior Publication Data

US 2020/0173273 A1 Jun. 4, 2020

(51) Int. Cl.
*E21B 47/107* (2012.01)
*E21B 47/14* (2006.01)
(Continued)

(52) U.S. Cl.
CPC .......... *E21B 47/107* (2020.05); *E21B 47/14* (2013.01); *G01V 1/001* (2013.01); *G01V 1/282* (2013.01);
(Continued)

(58) Field of Classification Search
CPC ...... G06F 30/20; E21B 47/14; E21B 2200/20; E21B 47/135; E21B 2200/22;
(Continued)

(56) References Cited

U.S. PATENT DOCUMENTS

| 3,563,311 A | 2/1971 | Stein |
| 3,841,144 A | 10/1974 | Baldwin |

(Continued)

FOREIGN PATENT DOCUMENTS

| CA | 2760662 A1 | 12/2010 |
| CA | 2953938 A1 | 1/2016 |

(Continued)

OTHER PUBLICATIONS

Chhantyal et al., Upstream Ultrasonic Level Based Soft Sensing of Volumetric Flow of Non-Newtonian Fluids in Open Venturi Channels, IEEE Sensors Journal, vol. 18, No. 12, Jun. 15, 2018, p. 5002-5013 (Year: 2018).*

(Continued)

*Primary Examiner* — Michael Edward Cocchi
(74) *Attorney, Agent, or Firm* — CONLEY ROSE, P.C.

(57) ABSTRACT

A method of identifying inflow locations along a wellbore includes obtaining an acoustic signal from a sensor within the wellbore, determining a plurality of frequency domain features from the acoustic signal, and identifying, using a plurality of fluid flow models, a presence of at least one of a gas phase inflow, an aqueous phase inflow, or a hydrocarbon liquid phase inflow at one or more fluid flow locations. The acoustic signal includes acoustic samples across a portion of a depth of the wellbore, and the plurality of frequency domain features are obtained across a plurality of depth intervals within the portion of the depth of the wellbore. Each fluid flow model of the plurality of fluid inflow models uses one or more frequency domain features of the plurality of the frequency domain features, and at least two of the plurality of fluid flow models are different.

20 Claims, 9 Drawing Sheets

(51) Int. Cl.
  *G01V 1/50* (2006.01)
  *G06F 30/20* (2020.01)
  *G01V 1/28* (2006.01)
  *G01V 1/30* (2006.01)
  *G06F 30/28* (2020.01)
  *G01V 1/00* (2006.01)
  *G01V 99/00* (2009.01)
  *G06N 7/01* (2023.01)

(52) U.S. Cl.
  CPC .............. *G01V 1/288* (2013.01); *G01V 1/307* (2013.01); *G01V 1/50* (2013.01); *G01V 99/005* (2013.01); *G06F 30/20* (2020.01); *G06F 30/28* (2020.01); *G06N 7/01* (2023.01); *E21B 2200/20* (2020.05); *E21B 2200/22* (2020.05); *G01V 2210/21* (2013.01); *G01V 2210/324* (2013.01)

(58) Field of Classification Search
  CPC .......... G01V 1/288; G01V 1/307; G01V 1/50; G01V 2210/21; G06N 7/005
  See application file for complete search history.

(56) References Cited

U.S. PATENT DOCUMENTS

| | | |
|---|---|---|
| 3,854,323 A | 12/1974 | Hearn et al. |
| 5,042,297 A | 8/1991 | Lessi |
| 5,113,941 A | 5/1992 | Donovan |
| 5,257,530 A | 11/1993 | Beattie et al. |
| 5,812,493 A | 9/1998 | Robein et al. |
| 5,825,017 A | 10/1998 | Pryor |
| 5,971,095 A | 10/1999 | Ozbek |
| 6,075,611 A | 6/2000 | Dussan V. et al. |
| 6,151,556 A | 11/2000 | Allen |
| 6,201,765 B1 | 3/2001 | Ireson |
| 6,450,037 B1 | 9/2002 | McGuinn et al. |
| 6,501,067 B2 | 12/2002 | Jones et al. |
| 6,516,275 B2 | 2/2003 | Lazaratos |
| 6,550,342 B2 | 4/2003 | Croteau et al. |
| 6,555,807 B2 | 4/2003 | Clayton et al. |
| 6,587,798 B2 | 7/2003 | Kersey et al. |
| 6,601,458 B1 | 8/2003 | Gysling et al. |
| 6,601,671 B1 | 8/2003 | Zhao et al. |
| 6,651,007 B2 | 11/2003 | Ozbek |
| 6,672,131 B1 | 1/2004 | Aldal et al. |
| 6,738,715 B2 | 5/2004 | Shatilo et al. |
| 6,751,559 B2 | 6/2004 | Fookes et al. |
| 6,782,150 B2 | 8/2004 | Davis et al. |
| 6,813,403 B2 | 11/2004 | Tennyson |
| 6,829,538 B2 | 12/2004 | de Kok |
| 6,837,098 B2 | 1/2005 | Gysling et al. |
| 6,904,368 B2 | 6/2005 | Reshef et al. |
| 6,933,491 B2 | 8/2005 | Maida, Jr. |
| 7,028,543 B2 | 4/2006 | Hardage et al. |
| 7,030,971 B1 | 4/2006 | Payton |
| 7,072,044 B2 | 7/2006 | Kringlebotn et al. |
| 7,088,639 B2 | 8/2006 | Walls et al. |
| 7,130,496 B2 | 10/2006 | Rogers |
| 7,219,762 B2 | 5/2007 | James et al. |
| 7,355,923 B2 | 4/2008 | Reshef et al. |
| 7,357,021 B2 | 4/2008 | Blacklaw |
| 7,395,864 B2 | 7/2008 | Ramachandran et al. |
| 7,398,697 B2 | 7/2008 | Allen et al. |
| 7,404,456 B2 | 7/2008 | Weaver et al. |
| 7,503,217 B2 | 3/2009 | Johansen |
| 7,652,245 B2 | 1/2010 | Crickmore et al. |
| 7,659,828 B2 | 2/2010 | Wehrs et al. |
| 7,660,200 B2 | 2/2010 | Tang |
| 7,872,736 B2 | 1/2011 | Rogers et al. |
| 7,890,280 B2 | 2/2011 | Fomme |
| 7,896,069 B2 | 3/2011 | Dria et al. |
| 7,940,389 B2 | 5/2011 | Rogers et al. |
| 7,946,341 B2 | 5/2011 | Hartog et al. |
| 3,020,616 A1 | 9/2011 | Greenaway |
| 8,023,829 B2 | 9/2011 | Nash et al. |
| 8,131,121 B2 | 3/2012 | Huffman |
| 8,200,049 B2 | 6/2012 | Kaplan et al. |
| 8,245,780 B2 | 8/2012 | Fidan et al. |
| 8,248,589 B2 | 8/2012 | DeFreitas et al. |
| 8,264,676 B2 | 9/2012 | Kanellopoulos et al. |
| 8,408,064 B2 | 4/2013 | Hartog et al. |
| 8,520,197 B2 | 8/2013 | Handerek |
| 8,534,114 B2 | 9/2013 | Ellson |
| 8,564,786 B2 | 10/2013 | Crickmore et al. |
| 8,576,386 B2 | 11/2013 | Jones et al. |
| 8,605,542 B2 | 12/2013 | Coates et al. |
| 8,614,795 B2 | 12/2013 | Duncan et al. |
| 8,634,681 B2 | 1/2014 | Rogers |
| 8,661,907 B2 | 3/2014 | Davis et al. |
| 8,755,643 B2 | 6/2014 | Nash et al. |
| 8,797,824 B2 | 8/2014 | Crickmore et al. |
| 8,902,704 B2 | 12/2014 | Zamow et al. |
| 8,923,663 B2 | 12/2014 | Hill et al. |
| 8,941,821 B2 | 1/2015 | Coupe et al. |
| 8,950,482 B2 | 2/2015 | Hill et al. |
| 8,973,444 B2 | 3/2015 | Hill et al. |
| 8,996,298 B2 | 3/2015 | Yamada |
| 8,997,585 B2 | 4/2015 | Hayward |
| 9,002,149 B2 | 4/2015 | Rogers |
| 9,052,230 B2 | 6/2015 | Kutlik et al. |
| 9,075,155 B2 | 7/2015 | Luscombe et al. |
| 9,109,944 B2 | 8/2015 | Den Boer et al. |
| 9,110,018 B2 | 8/2015 | Handerek |
| 9,140,582 B2 | 9/2015 | Farhadiroushan et al. |
| 9,140,815 B2 | 9/2015 | Lopez et al. |
| 9,146,151 B2 | 9/2015 | Kupershmidt |
| 9,228,889 B2 | 1/2016 | McCann |
| 9,243,949 B2 | 1/2016 | Crickmore et al. |
| 9,250,112 B2 | 2/2016 | Godfrey |
| 9,250,120 B2 | 2/2016 | Smith et al. |
| 9,255,836 B2 | 2/2016 | Taverner et al. |
| 9,304,017 B2 | 4/2016 | Handerek |
| 9,341,731 B2 | 5/2016 | Biswas |
| 9,347,313 B2 | 5/2016 | Wills et al. |
| 9,354,338 B1 | 5/2016 | Psaila |
| 9,377,551 B2 | 6/2016 | Hartog et al. |
| 9,377,559 B2 | 6/2016 | Cooper |
| 9,388,685 B2 | 7/2016 | Ravi et al. |
| 9,416,644 B2 | 8/2016 | McEwen-King et al. |
| 9,423,523 B2 | 8/2016 | McEwen-King |
| 9,429,466 B2 | 8/2016 | Barfoot et al. |
| 9,430,507 B2 | 8/2016 | Stowe et al. |
| 9,435,668 B2 | 9/2016 | Lewis et al. |
| 9,435,902 B2 | 9/2016 | Hill et al. |
| 9,453,821 B2 | 9/2016 | Minto et al. |
| 9,459,329 B2 | 10/2016 | McEwen-King et al. |
| 9,465,126 B2 | 10/2016 | Lewis et al. |
| 9,478,937 B1 | 10/2016 | Kupershmidt et al. |
| 9,507,030 B2 | 11/2016 | Godfrey |
| 9,512,711 B2 | 12/2016 | Sobolewski et al. |
| 9,523,790 B1 | 12/2016 | Valishin |
| 9,541,425 B2 | 1/2017 | Farhadiroushan et al. |
| 9,557,195 B2 | 1/2017 | Barfoot et al. |
| 9,561,812 B2 | 2/2017 | Godfrey |
| 9,575,196 B2 | 2/2017 | Ji et al. |
| 9,594,002 B2 | 3/2017 | Godfrey et al. |
| 9,599,489 B2 | 3/2017 | Nash et al. |
| 9,605,537 B2 | 3/2017 | Hull et al. |
| 9,606,250 B2 | 3/2017 | Hull et al. |
| 9,625,348 B2 | 4/2017 | Hill et al. |
| 9,631,972 B2 | 4/2017 | Hill et al. |
| 9,651,474 B2 | 5/2017 | Farhadiroushan et al. |
| 9,651,709 B2 | 5/2017 | Jaaskelainen |
| 9,677,956 B2 | 6/2017 | Hill et al. |
| 9,702,244 B2 | 7/2017 | Willis et al. |
| 9,719,846 B2 | 8/2017 | Ellmauthaler et al. |
| 9,733,120 B2 | 8/2017 | Stokely et al. |
| 9,739,645 B2 | 8/2017 | Hill et al. |
| 9,746,393 B2 | 8/2017 | Godfrey |
| 9,759,824 B2 | 9/2017 | Lumens et al. |
| 9,766,371 B2 | 9/2017 | Barfoot et al. |
| 9,778,097 B2 | 10/2017 | McEwen-King |

(56) References Cited

U.S. PATENT DOCUMENTS

| | | |
|---|---|---|
| 9,784,642 B2 | 10/2017 | Strong et al. |
| 9,797,239 B2 | 10/2017 | Godfrey |
| 9,810,809 B2 | 11/2017 | Farhadiroushan et al. |
| 9,816,853 B2 | 11/2017 | Crickmore et al. |
| 9,823,114 B2 | 11/2017 | Farhadiroushan et al. |
| 9,829,368 B2 | 11/2017 | Kutlik et al. |
| 9,850,749 B2 | 12/2017 | Finfer et al. |
| 9,869,795 B2 | 1/2018 | Jaaskelainen |
| 9,880,047 B2 | 1/2018 | Martin et al. |
| 9,896,929 B2 | 2/2018 | Farhadiroushan et al. |
| 9,909,903 B2 | 3/2018 | Lewis et al. |
| 9,945,215 B2 | 4/2018 | Godfrey |
| 9,945,979 B2 | 4/2018 | Stokely et al. |
| 9,983,293 B2 | 5/2018 | Farhadiroushan et al. |
| 9,989,388 B2 | 6/2018 | Farhadiroushan et al. |
| 10,018,036 B2 | 7/2018 | Ellmauthaler et al. |
| 10,031,044 B2 | 7/2018 | Kumar et al. |
| 10,067,030 B2 | 9/2018 | Hartog et al. |
| 10,101,182 B2 | 10/2018 | Barfoot |
| 10,120,104 B2 | 11/2018 | Roy et al. |
| 10,139,268 B2 | 11/2018 | Nunes et al. |
| 10,145,821 B2 | 12/2018 | Farhadiroushan et al. |
| 10,151,626 B2 | 12/2018 | Godfrey et al. |
| 10,175,374 B2 | 1/2019 | Dusterhoft et al. |
| 10,180,515 B2 | 1/2019 | Ellmauthaler et al. |
| 10,197,693 B2 | 2/2019 | Kalyanraman et al. |
| 10,198,946 B2 | 2/2019 | Crickmore et al. |
| 10,215,017 B2 | 2/2019 | Hull et al. |
| 10,221,681 B2 | 3/2019 | McEwen-King et al. |
| 10,234,345 B2 | 3/2019 | Hull et al. |
| 10,247,584 B2 | 4/2019 | Crickmore et al. |
| 10,260,937 B2 | 4/2019 | Dankers et al. |
| 10,267,141 B2 | 4/2019 | Nunes et al. |
| 10,274,381 B2 | 4/2019 | Kulkarni et al. |
| 10,275,402 B2 | 4/2019 | Guerriero et al. |
| 10,281,341 B2 | 5/2019 | Hull et al. |
| 10,310,113 B2 | 6/2019 | Sun et al. |
| 10,317,262 B2 | 6/2019 | Kippersund et al. |
| 10,379,239 B2 | 8/2019 | Udengaard |
| 10,393,921 B2 | 8/2019 | Cuny et al. |
| 10,401,519 B2 | 9/2019 | Willis et al. |
| 10,416,328 B2 | 9/2019 | Walters et al. |
| 10,422,365 B2 | 9/2019 | Hull et al. |
| 10,422,901 B2 | 9/2019 | Walters et al. |
| 10,429,530 B2 | 10/2019 | Rickett et al. |
| 10,444,388 B2 | 10/2019 | Dusterhoft et al. |
| 10,444,391 B2 | 10/2019 | Ellmauthaler et al. |
| 10,444,393 B2 | 10/2019 | Cheng et al. |
| 10,458,224 B2 | 10/2019 | Dickenson et al. |
| 10,520,625 B2 | 12/2019 | Walters et al. |
| 10,578,757 B2 | 3/2020 | Dong et al. |
| 2001/0037883 A1 | 11/2001 | Veneruso et al. |
| 2002/0125009 A1 | 9/2002 | Wetzel et al. |
| 2002/0139929 A1 | 10/2002 | Mullins et al. |
| 2002/0195246 A1 | 12/2002 | Davidson |
| 2003/0010126 A1 | 1/2003 | Romanet et al. |
| 2003/0014199 A1 | 1/2003 | Toomey |
| 2003/0029241 A1 | 2/2003 | Mandal |
| 2004/0059505 A1 | 3/2004 | Gallagher |
| 2004/0252748 A1 | 12/2004 | Gleitman |
| 2005/0100172 A1 | 5/2005 | Schliep et al. |
| 2005/0246111 A1 | 11/2005 | Gysling et al. |
| 2006/0113089 A1 | 6/2006 | Henriksen et al. |
| 2006/0165239 A1 | 7/2006 | Langner et al. |
| 2006/0165344 A1 | 7/2006 | Mendez et al. |
| 2007/0047867 A1 | 3/2007 | Goldner |
| 2007/0163780 A1 | 7/2007 | Onodera et al. |
| 2007/0199696 A1 | 8/2007 | Walford |
| 2007/0215345 A1 | 9/2007 | Lafferty et al. |
| 2007/0234789 A1 | 10/2007 | Glasbergen et al. |
| 2007/0247631 A1 | 10/2007 | Paulson |
| 2007/0253561 A1 | 11/2007 | Williams et al. |
| 2008/0137475 A1 | 6/2008 | Maisons |
| 2008/0154510 A1 | 6/2008 | Scott |
| 2008/0232748 A1 | 9/2008 | Nash |
| 2008/0314142 A1 | 12/2008 | Davies |
| 2009/0010104 A1 | 1/2009 | Leaney |
| 2009/0055098 A1 | 2/2009 | Mese et al. |
| 2009/0132183 A1 | 5/2009 | Hartog et al. |
| 2009/0202192 A1 | 8/2009 | Taverner et al. |
| 2009/0213692 A1 | 8/2009 | Martinez et al. |
| 2010/0163223 A1 | 7/2010 | Brown |
| 2010/0243241 A1 | 9/2010 | Hampton et al. |
| 2010/0258304 A1 | 10/2010 | Hegeman |
| 2010/0268489 A1 | 10/2010 | Lie et al. |
| 2011/0030467 A1 | 2/2011 | Bakulin |
| 2011/0042071 A1 | 2/2011 | Hsu et al. |
| 2011/0085415 A1 | 4/2011 | Morton et al. |
| 2011/0110191 A1 | 5/2011 | Williams-Stroud et al. |
| 2011/0139538 A1 | 6/2011 | Hill et al. |
| 2011/0149688 A1 | 6/2011 | Hill et al. |
| 2011/0188346 A1 | 8/2011 | Hull |
| 2011/0255077 A1 | 10/2011 | Rogers |
| 2011/0301882 A1 | 12/2011 | Andersen |
| 2011/0315369 A1 | 12/2011 | Holderman et al. |
| 2012/0020184 A1 | 1/2012 | Wilson et al. |
| 2012/0043079 A1 | 2/2012 | Wassouf et al. |
| 2012/0057432 A1 | 3/2012 | Hill et al. |
| 2012/0092960 A1 | 4/2012 | Gaston et al. |
| 2012/0096922 A1 | 4/2012 | Ellson |
| 2012/0111560 A1 | 5/2012 | Hill et al. |
| 2012/0137781 A1 | 6/2012 | Hill et al. |
| 2012/0152024 A1 | 6/2012 | Johansen |
| 2012/0155218 A1 | 6/2012 | Beasley et al. |
| 2012/0257475 A1 | 10/2012 | Luscombe et al. |
| 2012/0290213 A1 | 11/2012 | Huo et al. |
| 2013/0139600 A1 | 6/2013 | McEwen-King et al. |
| 2013/0151203 A1 | 6/2013 | McEwen-King et al. |
| 2013/0166227 A1 | 6/2013 | Hermann et al. |
| 2013/0167628 A1 | 7/2013 | Hull et al. |
| 2013/0170519 A1 | 7/2013 | Alliot |
| 2013/0298665 A1 | 11/2013 | Minchau |
| 2013/0299165 A1 | 11/2013 | Crow |
| 2013/0319121 A1 | 12/2013 | Hill et al. |
| 2014/0025319 A1 | 1/2014 | Farhadiroushan et al. |
| 2014/0036627 A1 | 2/2014 | Hull et al. |
| 2014/0036628 A1 | 2/2014 | Hill et al. |
| 2014/0069173 A1 | 3/2014 | Roy et al. |
| 2014/0086009 A1 | 3/2014 | Yoneshima |
| 2014/0150523 A1 | 6/2014 | Stokely et al. |
| 2014/0150548 A1 | 6/2014 | Childers et al. |
| 2014/0204368 A1 | 7/2014 | Lewis et al. |
| 2014/0216151 A1 | 8/2014 | Godfrey et al. |
| 2014/0334253 A1 | 11/2014 | Lumens et al. |
| 2014/0362668 A1 | 12/2014 | McEwen-King |
| 2015/0000415 A1 | 1/2015 | Kelley |
| 2015/0085610 A1 | 3/2015 | Raum et al. |
| 2015/0144333 A1 | 5/2015 | Lee et al. |
| 2015/0146759 A1 | 5/2015 | Johnston |
| 2015/0234526 A1 | 8/2015 | Chalubert et al. |
| 2015/0235544 A1 | 8/2015 | Hernandez et al. |
| 2015/0308191 A1 | 10/2015 | Zhan et al. |
| 2015/0308909 A1 | 10/2015 | Carneal et al. |
| 2016/0123798 A1 | 5/2016 | Godfrey et al. |
| 2016/0138386 A1 | 5/2016 | Stokely et al. |
| 2016/0146962 A1 | 5/2016 | Hayward |
| 2016/0223389 A1 | 8/2016 | Farhadiroushan et al. |
| 2016/0259079 A1 | 9/2016 | Wilson et al. |
| 2016/0265345 A1 | 9/2016 | In T Panhuis et al. |
| 2016/0281494 A1 | 9/2016 | Shirdel et al. |
| 2016/0312552 A1 | 10/2016 | Early et al. |
| 2016/0312604 A1 | 10/2016 | Hull et al. |
| 2016/0327419 A1 | 11/2016 | Hellevang et al. |
| 2016/0342569 A1 | 11/2016 | Al Marzouqi |
| 2016/0356665 A1 | 12/2016 | Felemban et al. |
| 2016/0369590 A1 | 12/2016 | Tonkin et al. |
| 2016/0369607 A1 | 12/2016 | Roy et al. |
| 2017/0010385 A1 | 1/2017 | Englich et al. |
| 2017/0016312 A1 | 1/2017 | Clarke et al. |
| 2017/0039826 A1 | 2/2017 | Cojocaur |
| 2017/0045410 A1 | 2/2017 | Crickmore et al. |
| 2017/0052049 A1 | 2/2017 | Crickmore et al. |
| 2017/0052050 A1 | 2/2017 | Crickmore et al. |
| 2017/0074998 A1 | 3/2017 | McColpin et al. |

(56) References Cited

U.S. PATENT DOCUMENTS

| | | |
|---|---|---|
| 2017/0074999 A1 | 3/2017 | Walters et al. |
| 2017/0075001 A1 | 3/2017 | McColpin et al. |
| 2017/0075002 A1 | 3/2017 | Ranjan et al. |
| 2017/0075003 A1 | 3/2017 | Dusterhoft et al. |
| 2017/0075004 A1 | 3/2017 | McColpin et al. |
| 2017/0075005 A1 | 3/2017 | Ranjan et al. |
| 2017/0082766 A1 | 3/2017 | Milne et al. |
| 2017/0119255 A1 | 5/2017 | Mahajan et al. |
| 2017/0123089 A1 | 5/2017 | Walters et al. |
| 2017/0153154 A1 | 6/2017 | Hull et al. |
| 2017/0205253 A1 | 7/2017 | Handerek |
| 2017/0241830 A1 | 8/2017 | Jaaskelainen |
| 2017/0241831 A1 | 8/2017 | Jaaskelainen |
| 2017/0275986 A1 | 9/2017 | Nunes et al. |
| 2017/0292862 A1 | 10/2017 | Godfrey |
| 2017/0315261 A1 | 11/2017 | Bartling et al. |
| 2017/0342814 A1 | 11/2017 | Krueger et al. |
| 2017/0343389 A1 | 11/2017 | Parker et al. |
| 2017/0350234 A1 | 12/2017 | Xia et al. |
| 2017/0363756 A1 | 12/2017 | El Allouche et al. |
| 2017/0371057 A1 | 12/2017 | Mateeva et al. |
| 2018/0024260 A1 | 1/2018 | Hornman et al. |
| 2018/0031413 A1 | 2/2018 | Stokely et al. |
| 2018/0045543 A1 | 2/2018 | Farhadiroushan et al. |
| 2018/0045768 A1 | 2/2018 | Godfrey et al. |
| 2018/0058196 A1 | 3/2018 | Jaaskelainen et al. |
| 2018/0066490 A1 | 3/2018 | Kjos |
| 2018/0087372 A1 | 3/2018 | Stokely et al. |
| 2018/0094952 A1 | 4/2018 | Handerek |
| 2018/0112519 A1 | 4/2018 | Duan et al. |
| 2018/0112520 A1 | 4/2018 | Duan |
| 2018/0112523 A1 | 4/2018 | Yang et al. |
| 2018/0136354 A1 | 5/2018 | Haldorsen |
| 2018/0172860 A1 | 6/2018 | Wilson et al. |
| 2018/0180658 A1 | 6/2018 | Godfrey |
| 2018/0203144 A1 | 7/2018 | Karrenbach et al. |
| 2018/0222498 A1 | 8/2018 | Kelley |
| 2018/0224572 A1 | 8/2018 | Farhadiroushan et al. |
| 2018/0230797 A1 | 8/2018 | Seshadri et al. |
| 2018/0231658 A1 | 8/2018 | Jalilian et al. |
| 2018/0238167 A1 | 8/2018 | Ravi et al. |
| 2018/0252097 A1 | 9/2018 | Skinner et al. |
| 2018/0259662 A1 | 9/2018 | Srinivasan |
| 2018/0266854 A1 | 9/2018 | Moore et al. |
| 2018/0267201 A1 | 9/2018 | Lewis |
| 2018/0284752 A1 | 10/2018 | Cella et al. |
| 2018/0292569 A1 | 10/2018 | LeBlanc et al. |
| 2018/0320827 A1 | 11/2018 | Hull et al. |
| 2018/0340801 A1 | 11/2018 | Kelley et al. |
| 2018/0342156 A1 | 11/2018 | Martin et al. |
| 2018/0354534 A1 | 12/2018 | Cole |
| 2018/0356210 A1 | 12/2018 | Moore et al. |
| 2019/0003499 A1 | 1/2019 | Logan et al. |
| 2019/0003903 A1 | 1/2019 | Godfrey |
| 2019/0025094 A1 | 1/2019 | Lewis et al. |
| 2019/0026634 A1 | 1/2019 | Homeyer et al. |
| 2019/0064030 A1 | 2/2019 | Sundermann |
| 2019/0072379 A1 | 3/2019 | Jalilian et al. |
| 2019/0113641 A1 | 4/2019 | Fang et al. |
| 2019/0120044 A1 | 4/2019 | Langnes et al. |
| 2019/0137045 A1 | 5/2019 | Jalilian et al. |
| 2019/0169985 A1 | 6/2019 | Dickenson et al. |
| 2019/0186958 A1 | 6/2019 | Godfrey |
| 2019/0197846 A1 | 6/2019 | Englund |
| 2019/0225250 A1 | 7/2019 | Esprey et al. |
| 2019/0257169 A1 | 8/2019 | Grimsbo et al. |
| 2019/0257699 A1 | 8/2019 | Handerek et al. |
| 2019/0323863 A1 | 10/2019 | Shatalin et al. |
| 2019/0324444 A1 | 10/2019 | Cella et al. |
| 2019/0331819 A1 | 10/2019 | Wu et al. |
| 2019/0339688 A1 | 11/2019 | Cella et al. |
| 2019/0353814 A1 | 11/2019 | Cha et al. |
| 2019/0390546 A1 | 12/2019 | Langnes et al. |
| 2020/0018149 A1 | 1/2020 | Luo et al. |
| 2020/0024942 A1 | 1/2020 | Lolla et al. |
| 2020/0032639 A1 | 1/2020 | Langnes et al. |
| 2020/0032645 A1 | 1/2020 | LeBlanc et al. |
| 2020/0048999 A1 | 2/2020 | Langnes et al. |
| 2020/0056907 A1 | 2/2020 | Godfrey |
| 2020/0057220 A1 | 2/2020 | Hull et al. |
| 2020/0070862 A1 | 3/2020 | Bilodeau et al. |
| 2020/0081145 A1 | 3/2020 | Padhi et al. |
| 2020/0088022 A1 | 3/2020 | Shen et al. |
| 2020/0102821 A1 | 4/2020 | Willis et al. |
| 2020/0124489 A1 | 4/2020 | Godfrey |
| 2020/0131900 A1 | 4/2020 | Leblanc et al. |
| 2020/0158594 A1 | 5/2020 | Dankers et al. |
| 2020/0172130 A1 | 6/2020 | Esprey |
| 2020/0173818 A1 | 6/2020 | Handerek et al. |
| 2020/0174149 A1 | 6/2020 | Thiruvenkatanathan |
| 2020/0182047 A1 | 6/2020 | Langnes et al. |
| 2020/0184556 A1 | 6/2020 | Cella |
| 2020/0190971 A1 | 6/2020 | Thiruvenkatanathan |
| 2020/0200000 A1 | 6/2020 | Langnes et al. |
| 2020/0200943 A1 | 6/2020 | Adeyemi et al. |
| 2020/0233107 A1 | 7/2020 | Constantinou et al. |
| 2020/0256834 A1 | 8/2020 | Langnes et al. |
| 2020/0291772 A1 | 9/2020 | Thiruvenkatanathan et al. |
| 2021/0047916 A1 | 2/2021 | Thiruvenkatanathan et al. |

FOREIGN PATENT DOCUMENTS

| | | | |
|---|---|---|---|
| CA | 2866274 A1 | 3/2016 | |
| CN | 101769442 A | 7/2010 | |
| CN | 102226390 A | 10/2011 | |
| CN | 203561437 U | 4/2014 | |
| CN | 105135219 A | 12/2015 | |
| CN | 105676267 A | 6/2016 | |
| CN | 205746047 U | 11/2016 | |
| CN | 108918405 A | 11/2018 | |
| CN | 109000157 A | 12/2018 | |
| CN | 110231409 A | 9/2019 | |
| CN | 209858753 U | 12/2019 | |
| EP | 2418466 A2 | 2/2012 | |
| EP | 3006908 A1 | 4/2016 | |
| EP | 3032441 A2 | 6/2016 | |
| EP | 3073051 A1 | 9/2016 | |
| EP | 3314308 A1 | 5/2018 | |
| EP | 3440314 A2 | 2/2019 | |
| GB | 1299843 A | 12/1972 | |
| GB | 2354782 A | 4/2001 | |
| GB | 2359834 A | 9/2001 | |
| GB | 2522061 A | 7/2015 | |
| GB | 2555550 A | 5/2018 | |
| GB | 2555637 A | 5/2018 | |
| JP | 5518424 B2 | 6/2014 | |
| NL | 9000577 A | 10/1990 | |
| WO | 9721116 A1 | 6/1997 | |
| WO | 2004031738 A1 | 4/2004 | |
| WO | 2007024763 A2 | 3/2007 | |
| WO | 2008147953 A1 | 12/2008 | |
| WO | 2009048340 A2 | 4/2009 | |
| WO | 2009086279 A2 | 7/2009 | |
| WO | 2009109747 A1 | 9/2009 | |
| WO | 2010099484 A2 | 9/2010 | |
| WO | 2012011831 A1 | 1/2012 | |
| WO | 2013114135 A2 | 8/2013 | |
| WO | 2015011394 A1 | 1/2015 | |
| WO | 2015025216 A2 | 2/2015 | |
| WO | 2015060981 A1 | 4/2015 | |
| WO | 2015170113 A1 | 11/2015 | |
| WO | 2015170116 A1 | 11/2015 | |
| WO | 2016010550 A1 | 1/2016 | |
| WO | 2016020654 A1 | 2/2016 | |
| WO | 2016115030 A1 | 7/2016 | |
| WO | 2016207341 A1 | 12/2016 | |
| WO | 2017009606 A1 | 1/2017 | |
| WO | 2017064472 A1 | 4/2017 | |
| WO | WO-2017/174750 A2 * | 4/2017 | ........... E21B 47/107 |
| WO | 2017078536 A1 | 5/2017 | |
| WO | 2017109467 A1 | 6/2017 | |
| WO | 2017156339 A1 | 9/2017 | |
| WO | 2017174746 A1 | 10/2017 | |
| WO | 2017174750 A2 | 10/2017 | |

(56) References Cited

FOREIGN PATENT DOCUMENTS

| | | | | | |
|---|---|---|---|---|---|
| WO | WO-2017/174750 | A2 * | 10/2017 | ............ | E21B 47/10 |
| WO | WO-2017174750 | A2 * | 10/2017 | ............ | E21B 43/26 |
| WO | 2017203271 | A1 | 11/2017 | | |
| WO | 2017214729 | A1 | 12/2017 | | |
| WO | 2018044309 | A1 | 3/2018 | | |
| WO | 2018057029 | A1 | 3/2018 | | |
| WO | 2018088994 | A1 | 5/2018 | | |
| WO | 2018136050 | A1 | 7/2018 | | |
| WO | 2018154275 | A1 | 8/2018 | | |
| WO | 2018178279 | A1 | 10/2018 | | |
| WO | 2018195661 | A1 | 11/2018 | | |
| WO | 2019005050 | A1 | 1/2019 | | |
| WO | 2019027466 | A1 | 2/2019 | | |
| WO | 2019038401 | A1 | 2/2019 | | |
| WO | 2019072899 | A2 | 4/2019 | | |
| WO | 2019094140 | A1 | 5/2019 | | |
| WO | 2019094474 | A1 | 5/2019 | | |
| WO | 2019136556 | A1 | 7/2019 | | |
| WO | 2019139564 | A1 | 7/2019 | | |
| WO | 2020109426 | A2 | 6/2020 | | |
| WO | 2020109427 | A2 | 6/2020 | | |
| WO | 2020119957 | A1 | 6/2020 | | |
| WO | 2021037586 | A1 | 3/2021 | | |

OTHER PUBLICATIONS

Lashgari, Hamid R., Sepehrnoori, Kamy, and Mojdeh Delshad. "A Four-Phase Chemical/Gas Model in an Implicit-Pressure/Explicit-Concentration Reservoir Simulator." SPE J. 21 (2016): 1086-1105. (Year: 2016).*
L. Salas, "Computational Methods for Oil Recovery", Instituto de Geofisica Universidad Nacional Autonoma de Mexico, Jan. 2011, Slides 1-97 (Year: 2011).*
International Search Report and Written Opinion dated Oct. 5, 2017, PCT Application No. PCT/EP2017/058300. (500843-00401).
International Preliminary Report on Patentability dated Oct. 18, 2018, PCT Application No. PCT/EP2017/058300. (500843-00401).
Intention to Grant dated Dec. 12, 2019, EP Application No. 17715935.7. (500843-00409).
Decision to Grant dated May 8, 2020, EP Application No. 17715935.7. (500843-00409).
Office Action dated Dec. 29, 2019, U.S. Appl. No. 16/563,544, filed Sep. 16, 2019. (500843-00411).
Notice of Allowance dated Apr. 22, 2020, U.S. Appl. No. 16/563,544, filed Sep. 16, 2019. (500843-00411).
European Search Report dated Aug. 10, 2020, EP Application No. 20170700.7. (500843-DIV-00412).
International Search Report and Written Opinion dated Sep. 22, 2017, PCT Application No. PCT/EP2017/058292. (501061-02701).
International Preliminary Report on Patentability dated Oct. 18, 2018, PCT Application No. PCT/EP2017/058292. (501061-02701).
Office Action dated Dec. 4, 2019, U.S. Appl. No. 16/563,689, filed Sep. 6, 2019. (501061-02713).
Notice of Allowance dated May 20, 2020, U.S. Appl. No. 16/563,689, filed Sep. 6, 2019. (501061-02713).
Corrected Notice of Allowability dated Jun. 19, 2020, U.S. Appl. No. 16/563,689, filed Sep. 6, 2019. (501061-02713).
European Search Report dated Apr. 22, 2020, for European Application No. 20154638.9 (501061-02714).
International Search Report and Written Opinion dated Jun. 29, 2018, PCT Application No. PCT/EP2018/058174. (501107-02801).
International Preliminary Report on Patentability dated Oct. 10, 2019, PCT Application No. PCT/EP2018/058174. (501107-02801).
Office Action dated Jan. 24, 2020, U.S. Appl. No. 16/566,711, filed Sep. 10, 2019. (501107-02802).
Final Office Action dated Aug. 4, 2020, U.S. Appl. No. 16/566,711, filed Sep. 10, 2019. (501107-02802).
Advisory Action dated Oct. 16, 2020, U.S. Appl. No. 16/566,711, filed Sep. 10, 2019. (501107-02802).
European Article 94(3) Examination Report dated Jan. 15, 2020, for European Application No. 18714513.1. (501107-02803).
European Article 94(3) Examination Report dated Jul. 29, 2020, for European Application No. 18714513.1. (501107-02803).
European Search Report dated Dec. 4, 2019, for European Application No. 19198488.9. (501107-02804).
European Article 94(3) Examination Report dated Feb. 3, 2020, for European Application No. 19198488.9. (501107-02804).
Intention to Grant dated Aug. 10, 2020, for European Application No. 19198488.9. (501107-02804).
Eurasian Office Action dated Sep. 3, 2020, for Eurasian Application No. 201992243/31. (501107-02805).
International Search Report and Written Opinion dated Nov. 28, 2018, PCT Application No. PCT/EP2018/072811. (501197-03501).
International Preliminary Report on Patentability dated Mar. 5, 2020, PCT Application No. PCT/EP2018/072811. (501197-03501).
International Search Report and Written Opinion dated Feb. 14, 2020, PCT Application No. PCT/EP2019/057149. (501375-03801).
Office Action dated Mar. 4, 2020, U.S. Appl. No. 16/710,237, filed Dec. 11, 2019 (501375-03802).
International Search Report and Written Opinion dated Jun. 4, 2019, PCT Application No. PCT/EP2018/077568. (501220-04301).
International Preliminary Report on Patentability date Apr. 23, 2020, PCT Application No. PCT/EP2018/077568. (501220-04301).
International Search Report and Written Opinion dated Jul. 9, 2020, PCT Application No. PCT/EP2018/082985. (501288-05400 and 08300).
International Search Report and Written Opinion dated Jul. 9, 2020, PCT Application No. PCT/EP2019/082808. (501288-05401).
Folkestad, Trond, et al., "Acoustic measurements detect sand in North Sea flow lines," Oil and Gas Journal; (USA), Journal vol. 88:35; Journal ID: ISSN 0030-1388.
Molenaar, Mathieu, et al., "Downhole tests show benefits of distributed acoustic sensing," Oil and Gas Journal 109 (1):82-85, Jan. 2011.
Restriction Requirement dated Dec. 15, 2020, U.S. Appl. No. 16/291,929, filed Oct. 5, 2018. (501061-02702).
Notice of Allowance dated Dec. 11, 2020, U.S. Appl. No. 16/566,711, filed Sep. 10, 2019. (501107-02802).
Final Office Action dated Sep. 3, 2020, U.S. Appl. No. 16/710,237, filed Dec. 11, 2019 (501375-03802).
Office Action dated Feb. 11, 2021, U.S. Appl. No. 16/710,237, filed Dec. 11, 2019 (501375-03802).
International Search Report and Written Opinion dated Nov. 6, 2020, PCT Application No. PCT/EP2020/072811. (501406-07201).
International Search Report and Written Opinion dated Jul. 9, 2020, PCT Application No. PCT/EP2019/078195. (501410-07400).
Office Action dated Jan. 7, 2021, U.S. Appl. No. 17/071,031, filed Oct. 15, 2020. (501410-07401).
Office Action dated Jan. 14, 2021, U.S. Appl. No. 17/071,021, filed Oct. 20, 2020 (501433-08101).
Office Action dated Dec. 30, 2020, U.S. Appl. No. 17/091,940, filed Nov. 6, 2020 (501438-08401).
International Search Report and Written Opinion dated Feb. 3, 2021, PCT Application No. PCT/EP2020/066171. (501440-08600).
International Search Report and Written Opinion dated Dec. 11, 2020, PCT Application No. PCT/EP2020/051814 (501442-08700).
International Search Report and Written Opinion dated Dec. 20, 2020, PCT Application No. PCT/EP2020/051817 (501444-08800).
International Search Report and Written Opinion dated Dec. 9, 2020, PCT Application No. PCT/EP2020/067043 (501480-08902).
International Search Report and Written Opinion dated Jan. 27, 2020, PCT Application No. PCT/EP2019/056425. (501312-06000).
International Search Report and Written Opinion dated Feb. 28, 2020, PCT Application No. PCT/IB2019/055355. (501378-06400).
International Search Report and Written Opinion dated Jun. 16, 2020, PCT Application No. PCT/EP2019/075385. (501400-06700).
International Search Report and Written Opinion dated Jun. 16, 2020, PCT Application No. PCT/EP2019/075378. (501401-06800).
International Search Report and Written Opinion dated Jun. 17, 2020, PCT Application No. PCT/US2019/046759 (501405-06900).
International Search Report and Written Opinion dated May 12, 2020, PCT Application No. PCT/EP2019/072891 (501406-07200).

(56) References Cited

OTHER PUBLICATIONS

International Search Report and Written Opinion dated Jun. 16, 2020, PCT Application No. PCT/EP2019/075387. (501412-07500).
International Search Report and Written Opinion dated Jun. 16, 2020, PCT Application No. PCT/EP2019/075382. (501428-07600).
Partial International Search Report Search Report dated Sep. 10, 2020, PCT Application No. PCT/EP2019/085454 (501431-08000).
International Search Report and Written Opinion dated Jul. 9, 2020, PCT Application No. PCT/EP2019/078197 (501433-08100).
International Search Report and Written Opinion dated May 29, 2020, PCT Application No. PCT/EP2019/082809. (501435-08301).
Office Action dated Mar. 12, 2020, U.S. Appl. No. 16/698,407, filed Nov. 27, 2019. (501435-08302).
Final Office Action dated Jun. 30, 2020, U.S. Appl. No. 16/698,407, filed Nov. 27, 2019. (501435-08302).
Examination Report dated Jul. 15, 2020, GCC Application No. GC 2019-38726. (501435-08303).
International Search Report and Written Opinion dated Jul. 24, 2020, PCT Application No. PCT/EP2019/081542 (501438-08400).
International Search Report and Written Opinion dated Jul. 24, 2020, PCT Application No. PCT/EP2019/081545 (501439-08500).
Abdelgaward, Ahemd, "Distributed Sand Monitoring Framework Using Wireless Sensor Networks," School of Engineering Technology, Central Michigan University, Mount Pleasant, MI 48859, US, Oct. 2013, vol. 1 Is. 1, pp. 1-10.
Abukhamsin, Ahmed Yasin, et al., "In Flow Profiling and Production Optimization in Smart Wells Using Di Stri but Ed Acoustic and Temperature Measurements," Jun. 1, 2017 (Jun. 1, 2017), XP055604495, Retrieved from the Internet: URL: https://pangea.stanrord.edu/ERE/pdf/pereports/PhD/Abukhamsin2016.pdf [retrieved on Jul. 11, 2019] paragraphs [0001], [0002], [0004].
Bakku, Sudhish K., et al., "Vertical Seismic Profiling Using Distributed Acoustic Sensing in a Hydrofrac Treatment Well," SEG Technical Program Expanded Abstracts Denver 2014 ISSN (print): 1052-3812, ISSN (online): 1949-4645, https://doi.org/10.1190/segam2014-1559.1.
Broesch, James "Digital Signal Processing: Instant Access," Chapter 7, www.newnespress.com.
Brown, Gerald K., "External Acoustic Sensors and Instruments for the Detection of Sand in Oil and Gas Wells," Offshore Technology Conference, May 5-8, 1997, Houston, Texas, US, OTC-8478-MS, https://doi.org/10.4043/8478-MS.
Brown, Gerald K., et al., "Solids and Sand Monitoring—An Overview," Corrosion 2000, Mar. 26-31, Orlando, Florida, US, NACE International, NACE-00091.
Cannon, Robert Thayer, et al., "Distributed Acoustic Sensing: State of the Art," SPE Digital Energy Conference, Mar. 5-7, 2013, The Woodlands, Texas, US, SPE-163688-MS, https://doi.org/10.2118/163688-MS.
Chen, Jianyou, et al., "Distributed acoustic sensing coupling noise removal based on sparse optimization," Society of Exploration Geophysicists and American Association of Petroleum Geologists, vol. 7, Issue 2, May 2019, pp. 1M-T563, ISSN (print): 2324-8858, ISSN (online): 2324-8866, https://doi.org/10.1190/INT-2018-0080.1.
ClampOn DSP-06 Particle Monitor, Aug. 2009.
ClampOn SandQ® Monitor, Aug. 2014.
Conway, Chris, et al., "An introduction to fiber optic Intelligent Distributed Acoustic Sensing (iDAS) technology for power industry applications," 9th International Conference on Insulated Power Cables, Jicable15—Versailles Jun. 21-25, 2015, A3.4.
Correa, Julia, et al., "3D vertical seismic profile acquired with distributed acoustic sensing on tubing installation: A case study from the CO2CRC Otway Project," Interpretation-a Journal of Subsurface Characterization, 7(1), ISSN 2324-8858, Feb. 1, 2019, DOI 10.1190/INT-2018-0086.1, https://escholarship.org/uc/item/2br8g398.
Finfer, D.C., et al., "Borehole Flow Monitoring using a Non-intrusive Passive Distributed Acoustic Sensing (DAS)," Society of Petroleum Engineers, SPE-170844-MS, SPE Annual Technical Conference and Exhibition held in Amsterdam, The Netherlands, Oct. 27-29, 2014.
Gardner, Neil, et al., "Distributed Fiber-Optic Technologies Drive New Intervention Applications," SPE JPT-7975, vol. 67 | Issue: 1, Jan. 1, 2015.
Hill, David, Permanent real-time full wellbore flow monitoring using distributed fiber-optic sensing, OptaSense, 2015.
Hofman, Joachim, et al., "Analysis of the acoustic response in water and sand of different fiber optic sensing cables," SPIE Sensing Technology + Applications, 2015, Baltimore, Maryland, U.S., Proceedings vol. 9491, Sensors for Extreme Harsh Environments II; 94910E (2015) https://doi.org/10.1117/12.2178282.
Hull, John William, et al., "Well-Integrity Monitoring and Analysis Using Distributed Fiber-Optic Acoustic Sensors," IADC/SPE Drilling Conference and Exhibition, Feb. 2-4, 2010, New Orleans, Louisiana, US, SPE-128304-MS, https://doi.org/10.2118/128304-MS.
Isensys, "Sand Alert—Fixed and Portable Sand Monitoring," Isensys LLP, Sep. 2016, www.isensys.co.uk.
Johannessen, Kjetil, et al., "Distributed Acoustic Sensing—A New Way of Listening to Your Well/Reservoir," SPE Intelligent Energy International, Mar. 27-29, 2012, Utrecht, NL, SPE-149602-MS, https://doi.org/10.2118/149602-MS.
Li, Meng, et al., "Current and Future Applications of Distributed Acoustic Sensing as a New Reservoir Geophysics Fool," The Open Petroleum Engineering Journal, 2015, 8, (Suppl 1: M3) 272-281.
Ma, King, et al. "Deep Learning on Temporal-Spectral Data for Anomaly Detection," Department of Electrical and Computer Engineering, University of Calgary, Proc. of SPIE vol. 10190, 2017.
Martin, Shawn, "Can Oil Well Monitoring Systems Withstand Stimulation Treatments," Feb. 26, 2015, https://insights.globalspec.com/article/601/can-oil-well-monitoring-systems-withstand-stimulation-treatments [retrieved on Aug. 18, 2020].
Martinez, Roberto Jr., "Diagnosis of Fracture Flow Conditions With Acoustic Sensing," SPE Hydraulic Fracturing Technology Conference, Feb. 4-6, The Woodlands, Texas, US, Publication Date 2014.
Miller, Douglas E., et al., "Vertical Seismic Profiling Using a Fiber-optic Cable as a Distributed Acoustic Sensor," 74th EAGE Conference Exhibition incorporating SPE EUROPEC 2012, Copenhagen, Denmark, Jun. 4-7, 2012.
Mohd Daud, Farik, et al., "Successful Application of Ultrasound Technology to Detect Sand Producing Intervals in the Wellbore," International Petroleum Technology Conference, Nov. 15-17, 2011, Bangkok, Thailand, PTC-14737-MS, https://doi.org/10.2523/IPTC-14737-MS.
Molenaar, Menno M., et al., "First Downhole Application of Distributed Acoustic Sensing for Hydraulic-Fracturing Monitoring and Diagnostics," SPE Drilling Completion, vol. 27, Is. 1, Mar. 2012, SPE-140561-PA, https://doi.org/10.2118/140561-PA.
Mullens, Stephen, et al., "Fiber-Optic Distributed Vibration Sensing Provides Technique for Detecting Sand Production," Offshore Technology Conference, May 3-6, 2010, Houston, Texas, US, OTC-20429-MS, https://doi.org/10.4043/20429-MS.
Naldrett, G., et al., "Production Monitoring Using Next-Generation Distributed Sensing Systems," Petrophysics, vol. 59, No. 4 (Aug. 2018); pp. 496-510; 16 Figures. DOI: 10.30632/PJV59V4-2018a5.
Paleja, Rakesh, et al., "Velocity Tracking for Flow Monitoring and Production Profiling Using Distributed Acoustic Sensing," SPE Annual Technical Conference and Exhibition, Sep. 28-30, 2015, Houston, Texas, US, SPE-174823-MS, https://doi.org/10.2118/174823-MS.
Roxar sand monitor, https://www.emerson.com/en-us/automation/roxar.
Roxar, "Sand Monitor, Non-intrusive acoustic sensor," Draft 1-120209, Sundheim-Madison Feb. 2009.
Schuliz, Whitney H., "Time-Lapse Multicomponent Geophone and DAS VSP Processing and Analysis," Colorado School of Mines, Geo-Physics Department, 2019.
Silixa, "Fracture Monitoring," https://silixa.com/solutions/oil-and-gas-downhole/frac-services/fracture-monitoring/.

(56) References Cited

OTHER PUBLICATIONS

Silixa, "Well Integrity," https://silixa.com/solutions/oil-and-gas-downhole/permanent-reservoir-and-well-surveillance/well-integrity/.

Silkina, Tatiana, "Application of Distributed Acoustic Sensing to Flow Regime Classification," Natural Gas Technology, Norwegian University of Science and Technology, Jun. 2014.

Stokely, Christopher L., "Acoustics-Based Flow Monitoring During Hydraulic Fracturing," SPE-179151-MS, Society of Petroleum Engineers, SPE Hydraulic Fracturing Technology Conference, Feb. 9-11, 2016, The Woodlands, Texas, USA, https://doi.org/10.2118/179151-MS.

Susilo, Yoliandri, et al., "Significant Increase in Sand Control Reliability of Open Hole Gravel Pack Completions in ACG Field—Azerbaijan," SPE European Formation Damage Conference Exhibition, Jun. 5-7, 2013, Noordwijk, NL, SPE-165206-MS, https://doi.org/10.2118/165206-MS.

Tiffin, David L., et al., "Drawdown Guidelines for Sand Control Completions", SPE International, SPE 84495, Oct. 5, (Oct. 5, 2003), pp. 1-10, XP002361435.

Van der Horst, Juun, et al., "Fibre Optic Sensing For Improved Wellbore Production Surveillance," International Petroleum Technology Conference, Jan. 19-22, 2014, Doha, Qatar, IPTC-17528-MS, https://doi.org/10.2523/IPTC-17528-MS.

Wang, Fang, et al., "Pipeline Leak Detection by Using Time-Domain Statistical Features," IEEE Sensors Journal, vol. 17, No. 19, Oct. 2017.

Wang, Kai, et al., "Vibration Sensor Approaches for the Monitoring of Sand Production in Bohai Bay," Hindawi Publishing Corporation, Shock and Vibration, vol. 2015, Article ID 591780, http://dx.doi.org/10.1155/2015/591780.

World first installation of a fiber optic acoustic sensor for reservoir monitoring, Oil and Gas Product News, Oct. 30, 2009.

WorldOil.com, "Adelous unveils distributed acoustic sensor solution for upstream oil gas," May 28, 2015. https://www.worldoil.com/news/2015/5/28/adelos-unveils-distributed-acoustic-sensor-solution-for-upstream-oil-gas.

Xiao, J., et al., "Dynamic Water Injection Profiling in Intelligent Wells Using Distributed Acoustic Sensor with Multimode Optical Fibers," SPE Annual Technical Conference and Exhibition, Sep. 28-30, 2015, Houston, Texas, US, SPE-174865-MS, https://doi.org/10.2118/174865-MS.

Xiao, J.J., et al., "Intelligent Distributed Acoustic Sensing for In-well Monitoring," SPE Saudi Arabia Section Technical Symposium and Exhibition, Apr. 21-24, 2014, Al-Khobar, SA, SPE-172197-MS, https://doi.org/10.2118/172197-MS.

Williams, J., "Distributed acoustic sensing for pipeline monitoring," Pipeline and Gas Journal Jul. 2012, vol. 239 No. 7.

Partial International Search Report Search Report dated Oct. 20, 2020, PCT Application No. PCT/EP2020/051814 (501442-08700).

Partial International Search Report Search Report dated Oct. 16, 2020, PCT Application No. PCT/EP2020/051817 (501444-08800).

\* cited by examiner

DAS DATA PROCESSING TO IDENTIFY FLUID INFLOW LOCATIONS AND FLUID TYPE

CROSS-REFERENCE TO RELATED APPLICATIONS

This application claims the benefit of and priority to International Application No. PCT/EP2018/082985 filed Nov. 29, 2018 with the European Receiving office and entitled "DAS Data Processing to Identify Fluid Inflow Locations and Fluid Type" as a foreign priority claim, where such application is hereby incorporated herein by reference in its entirety for all purposes.

STATEMENT REGARDING FEDERALLY SPONSORED RESEARCH OR DEVELOPMENT

Not applicable.

BACKGROUND

Within a hydrocarbon production well, various fluids such as hydrocarbons, water, gas, and the like can be produced from the formation into the wellbore. The production of the fluid can result in the movement of the fluids in various downhole regions, including within the subterranean formation, from the formation into the wellbore, and within the wellbore itself. For example, some subterranean formations can release water that can be produced along with the hydrocarbons into the wellbore. Such water inflow can cause a number of problems including erosion, clogging of wells due to resulting sand inflow, contamination and damage of the surface equipment, and the like. Significant water production can result in the need to choke back production from the well to bring water production down to acceptable levels. This can lead to reduced oil production, and potentially result in a deferral of substantial amounts of the production from the well.

Efforts have been made to detect the movement of various fluids including hydrocarbon liquids, water, and gas within the wellbore. For example, a production logging system utilizing a Production Logging System (PLS) can be employed to determine flow profile in wells. A PLS can be utilized to assess what fluids (oil/water/gas) are present in a well at a given depth, where there is inflow, and what fluid is inflowing. A PLS can also provide data regarding what the flow rate of inflowing fluid is and the flow regime (e.g., slug flow, bubble flow, etc.).

A typical PLS utilizes capacitive and resistive sensors to assess whether the inflowing fluid comprises oil, water, or gas, and radially facing "spinners" to measure an inflow rate. The sensors can be distributed around the circumference of the PLS so that the fluid profile and inflow rate can be assessed circumferentially. Thus, information on the background flow profile, inflow profile, background flow rate and inflow flow rate and flow regime can be obtained with a PLS.

When utilizing a PLS, measurements are recorded for a depth at the front of the PLS tool. Since the PLS tool can be ten to twenty meters long, and the sensors are distributed along the length of the PLS, sensors that are not at the front of the tool are not actually taking measurements at the depth for which the measurements are recorded. Thus, the data at times can be skewed by variability in flow regime caused by the intrusive nature of the measurement. Further, the flow can be altered by the presence of the PLS tool, such that what is measured at the downstream end of the tool may not be indicative of what the flow profile or flow regime was before the tool disturbed the flow. Furthermore, a PLS tool is typically run through a well once or a few times (down and then up once or a few times and then out of the well), so the sensors of the PLS are exposed to the conditions at a given depth for only a brief period of time. The PLS log is established based on that brief window of data, at a given moment in the life of the well, but may be used for the many (e.g., five or ten) years due to the high cost of running a PLS tool into a well. Fluid characteristics within a well can change substantially over that time as the well ages, and/or a fluid may flow into a well erratically (off and on). For example, the PLS may detect the presence of gas at a time when there is gas inflow at a certain depth, but that gas inflow may fluctuate significantly, sometimes even over the course of a few hours. Nevertheless, future decisions about the well may be based on the assumption that there is always that same amount of gas present. Thus, the use of PLSs has a number of limitations.

Accordingly, a need exists for systems and methods of determining fluid inflow locations and type of fluids that are inflowing in a dynamic/continuous distributed fashion. Desirably, such systems and methods also enable a determination of the relative amounts of the different fluids or fluid phases (e.g., gas, water, hydrocarbon liquid) that are inflowing.

BRIEF SUMMARY OF THE DISCLOSURE

In an embodiment, a method of identifying inflow locations along a wellbore comprises obtaining an acoustic signal from a sensor within the wellbore, wherein the acoustic signal comprises acoustic samples across a portion of a depth of the wellbore, determining a plurality of frequency domain features from the acoustic signal, wherein the plurality of frequency domain features are obtained across a plurality of depth intervals within the portion of the depth of the wellbore, and identifying at least one of a gas phase inflow, an aqueous phase inflow, or a hydrocarbon liquid phase inflow using the plurality of the frequency domain features at one or more fluid inflow locations. In some embodiments, the plurality of frequency domain features can comprise at least two different frequency domain features.

In an embodiment, a method of developing an inflow location model for a wellbore comprises performing a plurality of inflow tests, wherein each inflow test comprises introducing one or more fluids of a plurality of fluids into a conduit at predetermined locations, and wherein the plurality of fluids comprise a hydrocarbon gas, a hydrocarbon liquid, an aqueous fluid, or a combination thereof, obtaining an acoustic signal from a sensor within the conduit for each inflow test of the plurality of inflow tests, wherein the acoustic signal comprises acoustic samples across a portion of the conduit including the predetermined locations, determining one or more frequency domain features from the acoustic signal for each test, wherein the one or more frequency domain features are obtained across the portion of the conduit including the predetermined locations, and training a fluid flow model using the one or more frequency domain features for a plurality of the tests and the predetermined locations. The inflow test can introduce the one or more fluids into a flowing fluid in some embodiments.

In an embodiment, a method of characterizing fluid inflow into a wellbore comprises obtaining an acoustic signal from a sensor within the wellbore, wherein the acoustic signal comprises acoustic samples across a portion of a depth of the wellbore, determining a plurality of frequency domain features from the acoustic signal, wherein the plurality of frequency domain features are obtained across a plurality of depth intervals within the portion of the depth of the wellbore, and wherein the plurality of frequency domain features comprise at least two different frequency domain features, identifying one or more fluid inflow locations within the plurality of depth intervals using one or more frequency domain features of the plurality of frequency domain features, providing the plurality of frequency domain features at the identified one or more fluid inflow locations to a fluid flow model, and determining at least one of a gas phase inflow, an aqueous phase inflow, or a hydrocarbon liquid phase inflow at the identified one or more fluid inflow locations using the fluid flow model.

In an embodiment, a method of identifying inflow locations along a wellbore comprises obtaining an acoustic signal from a sensor within the wellbore, wherein the acoustic signal comprises acoustic samples across a portion of a depth of the wellbore, determining one or more frequency domain features from the acoustic signal, wherein the one or more frequency domain features are obtained across a plurality of depth intervals within the portion of the depth of the wellbore, and identifying one or more fluid inflow locations within the plurality of depth intervals using the one or more frequency domain features.

These and other features will be more clearly understood from the following detailed description taken in conjunction with the accompanying drawings and claims.

Embodiments described herein comprise a combination of features and advantages intended to address various shortcomings associated with certain prior devices, systems, and methods. The foregoing has outlined rather broadly the features and technical advantages of the invention in order that the detailed description of the invention that follows may be better understood. The various characteristics described above, as well as other features, will be readily apparent to those skilled in the art upon reading the following detailed description, and by referring to the accompanying drawings. It should be appreciated by those skilled in the art that the conception and the specific embodiments disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a detailed description of the preferred embodiments of the invention, reference will now be made to the accompanying drawings in which.

DETAILED DESCRIPTION OF THE PREFERRED EMBODIMENTS

Figure 1:
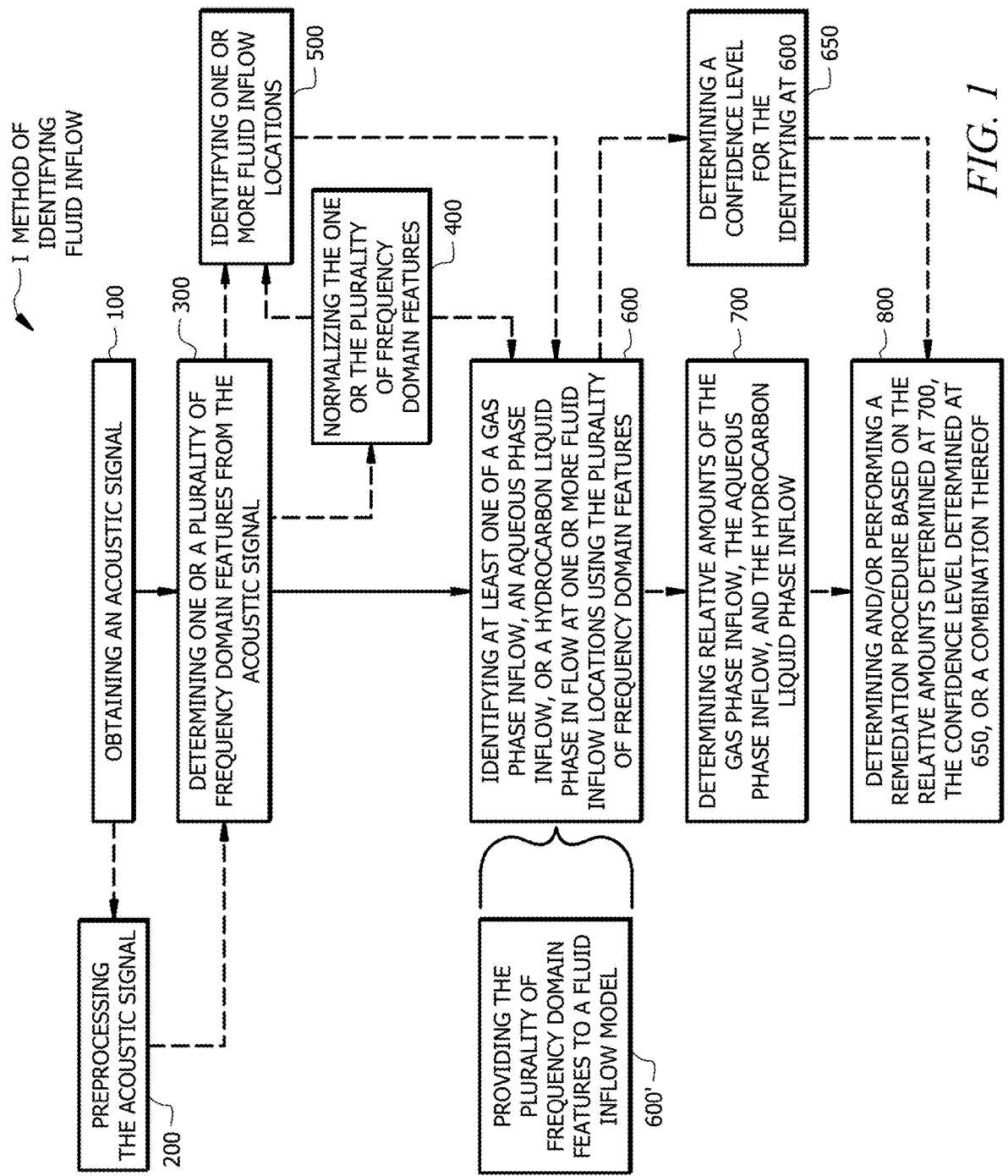
FIG. 1 is a flow diagram of a method of identifying fluid inflow according to embodiments of this disclosure.

Unless otherwise specified, any use of any form of the terms "connect," "engage," "couple," "attach," or any other term describing an interaction between elements is not meant to limit the interaction to direct interaction between the elements and may also include indirect interaction between the elements described. In the following discussion and in the claims, the terms "including" and "comprising" are used in an open-ended fashion, and thus should be interpreted to mean "including, but not limited to . . . ". Reference to up or down will be made for purposes of description with "up," "upper," "upward," "upstream," or "above" meaning toward the surface of the wellbore and with "down," "lower," "downward," "downstream," or "below" meaning toward the terminal end of the well, regardless of the wellbore orientation. Reference to inner or outer will be made for purposes of description with "in," "inner," or "inward" meaning towards the central longitudinal axis of the wellbore and/or wellbore tubular, and "out," "outer," or "outward" meaning towards the wellbore wall. As used herein, the term "longitudinal" or "longitudinally" refers to an axis substantially aligned with the central axis of the wellbore tubular, and "radial" or "radially" refer to a direction perpendicular to the longitudinal axis. The various characteristics mentioned above, as well as other features and characteristics described in more detail below, will be readily apparent to those skilled in the art with the aid of this disclosure upon reading the following detailed description of the embodiments, and by referring to the accompanying drawings.

As utilized herein, a 'fluid inflow event' includes fluid inflow (e.g., any fluid inflow regardless of composition thereof), gas phase inflow, aqueous phase inflow, and/or hydrocarbon phase inflow. The fluid can comprise other components such as solid particulate matter in some embodiments, as discussed in more detail herein.

Disclosed herein is a new signal processing architecture that allows for the identification of fluid inflow locations, fluid inflow discrimination in real time or near real time, and fluid flow discrimination within a conduit such as a wellbore. As utilized herein, "fluid flow discrimination" indicates an identification and/or assignment of the detected fluid flow (e.g., single phase flow, mixed phase flows, time-based slugging, altering fluid flows, etc.), gas inflow, hydrocarbon liquid (e.g., 'oil') inflow, and/or aqueous phase (e.g., water) inflow, including any combined or multiphase flows or inflows. The methods of this disclosure can thus be utilized to provide information on various flow events such as a fluid ingress point as well as flow regimes within a conduit rather than simply a location at which gas, water, or hydrocarbon liquid is present in the wellbore tubular (e.g., present in a flowing fluid), which can occur at any point above the ingress location as the fluid flows to the surface of the wellbore. In some embodiments, the system allows for a quantitative measurement of various fluid flows such as a relative concentration of in-well hydrocarbon liquid, water, and gas.

In some instances, the systems and methods can provide information in real time or near real time. As used herein, the term "real time" refers to a time that takes into account various communication and latency delays within a system, and can include actions taken within about ten seconds, within about thirty seconds, within about a minute, within about five minutes, or within about ten minutes of the action occurring. Various sensors (e.g., distributed fiber optic acoustic sensors, etc.) can be used to obtain an acoustic sampling at various points along the wellbore. The acoustic sample can then be processed using signal processing architecture with various feature extraction techniques (e.g., spectral feature extraction techniques) to obtain a measure of one or more frequency domain features and/or combinations thereof that enable selectively extracting the acoustic signals of interest from background noise and consequently aiding in improving the accuracy of the identification of the movement of fluids (e.g., gas inflow locations, water inflow locations, hydrocarbon liquid inflow locations, etc.) in real time. While discussed in terms of being real time in some instances, the data can also be analyzed at a later time at the same location and/or a displaced location.

As used herein, various frequency domain features can be obtained from the acoustic signal, and in some contexts, the frequency domain features can also be referred to herein as spectral features or spectral descriptors. In some embodiments, the spectral features can comprise other features, including those in the time domain, various transforms (e.g., wavelets, Fourier transforms, etc.), and/or those derived from portions of the acoustic signal or other sensor inputs. Such other features can be used on their own or in combination with one or more frequency domain features, including in the development of transformations of the features, as described in more detail herein. The signal processing techniques described herein can also help to address the big-data problem through intelligent extraction of data (rather than crude decimation techniques) to considerably reduce real time data volumes at the collection and processing site (e.g., by over 100 times, over 500 times, or over 1000 times, or over 10,000 times reduction, In some embodiments).

In some embodiments, the acoustic signal(s) can be obtained in a manner that allows for a signal to be obtained along the entire wellbore or a portion of interest. As noted hereinabove, production logging systems utilize a production logging system (PLS) to determine flow profile in wells. However, since the PLS can be 10-20 meters long and the sensors are distributed along the length, sensors that are not at the front of the PLS are not actually taking measurements at the depth for which the measurements are recorded, and, thus, the data can be incorrect or incomplete over time. Furthermore, the flow can be altered by the mere presence of the PLS within the wellbore, so what is measured at the downstream end of the PLS is not an accurate reflection of what the profile/regime was before the tool disturbed the flow. Furthermore, as a PLS is typically run through a well once or a few times (down and then up once or a few times and out), and the sensors are exposed to the conditions at a given depth for only a very brief period of time (e.g., 4-5 seconds). Accordingly, while PLSs can provide an indication that certain events, such as downhole water inflow, may be occurring, they do not provide continuous measurements over prolonged durations of time that would be needed to study dynamic variabilities in production profiles over time.

Fiber optic distributed acoustic sensors (DAS) capture acoustic signals resulting from downhole events such as gas inflow/flow, hydrocarbon liquid inflow/flow, water inflow/flow, mixed flow, and the like, as well as other background acoustics. This allows for signal processing procedures that distinguish fluid inflow and flow signals from other noise sources to properly identify each type of event. This in turn results in a need for a clearer understanding of the acoustic fingerprint of in-well event of interest (e.g., fluid inflow, water inflow, gas inflow, hydrocarbon liquid inflow, fluid flow along the tubulars, etc.) in order to be able to segregate and identify a noise resulting from an event of interest from other ambient acoustic background noise. As used herein, the resulting acoustic fingerprint of a particular event can also be referred to as a spectral signature, as described in more detail herein.

Further, reducing deferrals resulting from one or more events such as water ingress and facilitating effective remediation relies upon accurate and timely decision support to inform the operator of the events. Heretofore, there has been no technology/signal processing for DAS that successfully distinguishes and extracts fluid inflow locations, let alone in near real time.

The ability to identify various fluid inflow events in the wellbore may allow for various actions to be taken in response to the events. For example, a well can be shut in, production can be increased or decreased, and/or remedial measures can be taken in the wellbore, as appropriate based on the identified event(s). An effective response, when needed, benefits not just from a binary yes/no output of an identification of in-well events but also from a measure of relative amount of fluids (e.g., amount of gas inflow, amount of hydrocarbon liquid inflow, amount of water inflow, etc.) from each of the identified zones of fluid inflow so that zones contributing the greatest fluid amount(s) can be acted upon first to improve or optimize production. The systems and methods described herein can be used to identify the source of the problem, a direction and amount of flow, and/or an identification of the type of problem being faced. For example, when a water inflow location is detected, a relative flow rate of the hydrocarbon liquid at the water inflow location may allow for a determination of whether or not to remediate, the type or method of remediation, the timing for remediation, and/or deciding to alter (e.g., reduce) a production rate from the well. For example, production zones can be isolated, production assemblies can be open, closed, or choked at various levels, side wells can be drilled or isolated, and the like. Such determinations can be used to improve on the drawdown of the well while reducing the production expenses associated with various factors such as produced water.

Herein described are methods and systems for identifying fluid inflow locations and/or fluid flow regimes within a conduit in the wellbore. As described herein, spectral descriptors can be used with DAS acoustic data processing to provide for downhole fluid profiling, such as fluid inflow location detection and fluid phase discrimination (e.g., the determination that the fluid at one or more locations such as the detected fluid inflow location comprises gas inflow, hydrocarbon liquid inflow, aqueous phase inflow, a combined fluid flow, and/or a time varying fluid flow such as slugging single or multiphase flow). In some embodiments, a fluid flow model can be used for inflow fluid phase discrimination to determine at least one of a gas phase inflow, an aqueous phase inflow, a hydrocarbon liquid phase inflow, and various combinational flow regimes. In some embodiments, the same or a different fluid flow model can be used for fluid flow phase discrimination to determine the composition of fluid flowing in a conduit. A method of developing a suitable fluid inflow/flow model is also provided herein.

Application of the signal processing techniques and fluid flow model with DAS for downhole surveillance can provide a number of benefits including improving reservoir recovery by monitoring efficient drainage of reserves through downhole fluid surveillance (e.g., production flow monitoring), improving well operating envelopes through identification of drawdown levels (e.g., gas, water, etc.), facilitating targeted remedial action for efficient well management and well integrity, reducing operational risk through the clear identification of anomalies and/or failures in well barrier elements.

In some embodiments, use of the systems and methods described herein may provide knowledge of the zones contributing to fluid inflow and their relative concentrations, thereby potentially allowing for improved remediation actions based on the processing results. The methods and systems disclosed herein can also provide information on the variability of the amount of fluid inflow being produced by the different fluid influx zones as a function of different production rates, different production chokes, and downhole pressure conditions, thereby enabling control of fluid inflow. Embodiments of the systems and methods disclosed herein also allow for a computation of the relative concentrations of fluid ingress (e.g., relative amounts of gas, hydrocarbon liquid, and water in the inflow fluid) into the wellbore, thereby offering the potential for more targeted and effective remediation.

As disclosed herein, embodiments of the data processing techniques use a sequence of real time digital signal processing steps to identify the acoustic signal resulting from fluid inflow from background noise, and allow real time detection of downhole fluid inflow zones using distributed fiber optic acoustic sensor data as the input data feed.

As disclosed herein, a model can be developed using test data to identify one or more signatures based on features of the test data and one or more machine learning techniques to develop correlations for the presence of various flow and/or inflow regimes using the signatures. In the inflow model development, specific flow regimes can be introduced into a test set-up and the acoustic signals obtained and recorded to develop test data. The test data can be used to train one or more models defining the various flow and inflow regimes. The resulting model can then be used to determine one or more inflow and/or flow regimes within the wellbore. Use of the models are described initially, and the process and systems for developing the models used to identify the flow regimes are described in more detail herein.

Referring now to FIG. 1, a flow chart of a method I of identifying fluid flow and/or inflow according to some embodiments of this disclosure is shown. As described herein, the methods and systems can be used to identify fluid flow. As used herein fluid flow can comprise fluid flow along or within a tubular within the wellbore such as fluid flow within a production tubular. Fluid flow can also comprise fluid flow from the reservoir or formation into a wellbore tubular. Such flow into the wellbore and/or a wellbore tubular can be referred to as fluid inflow. While fluid inflow may be separately identified at times in this disclosure, such fluid inflow is considered a part of fluid flow within the wellbore.

A method of identifying fluid flow and/or inflow can comprise obtaining an acoustic signal along the wellbore at 100 and determining one or a plurality of frequency domain features from the acoustic signal at 300. In some embodiments, the method includes identifying one or more fluid inflow locations at 500. In some embodiments, the method includes determining fluid inflow discrimination, and the method can also include identifying at least one of a gas phase inflow, an aqueous phase inflow, or a hydrocarbon liquid phase inflow at one or more fluid inflow locations using the plurality of frequency domain features at 600. When used to identify flow regimes, the method can include identifying at least one of a gas phase flow, an aqueous phase flow, and/or a hydrocarbon liquid phase flow at one or more locations in the wellbore.

As depicted in the embodiment of FIG. 1, a method of identifying fluid flow and/or inflow according to this disclosure can include preprocessing the acoustic signal at 200 prior to determining the one or the plurality of frequency domain features from the acoustic signal at 300, normalizing the one or the plurality of frequency domain features at 400, prior to identifying the one or more fluid flow locations at 500 and/or identifying the at least one of the gas phase flow, an aqueous phase flow, and/or a hydrocarbon liquid phase flow at one or more fluid flow locations, including in some embodiments inflow locations, using the plurality of frequency domain features at 600.

As further depicted in the embodiment of FIG. 1, identifying the at least one of the gas phase flow, the aqueous phase flow, or the hydrocarbon liquid phase flow at the one or more fluid flow locations (e.g., along a tubular, inflow locations, etc.) using the plurality of frequency domain features at 600 can comprise providing the plurality of frequency domain features to a fluid flow model as indicated at 600', where the model is described in more detail herein. A method of identifying fluid inflow according to this disclosure can further comprise, at 650, determining a confidence level for the identifying of the at least one of the gas phase flow, the aqueous phase flow, or the hydrocarbon liquid phase flow at the one or more fluid flow locations using the plurality of frequency domain features at 600 and/or determining a relative amounts of the gas phase flow, the aqueous phase flow, and the hydrocarbon phase flow at 700 prior to determining at 800 a remediation procedure based on the relative amounts of the gas phase flow, the aqueous phase flow, and the hydrocarbon phase flow determined at 700 and/or the confidence level determined at 650. Each of the aforementioned steps of method I will be described in more detail hereinbelow.

A method of identifying fluid inflow and/or fluid flow according to some embodiments of this disclosure comprises obtaining an acoustic signal at 100. Such an acoustic signal can be obtained via any methods known to those of skill in the art. An exemplary system and method for obtaining the acoustic signal will now be described with reference to FIG. 2, which is a schematic, cross-sectional illustration of a downhole wellbore operating environment 101 according to an embodiment of this disclosure. As will be described in more detail below, embodiments of completion assemblies comprising a distributed acoustic sensor (DAS) system as described herein can be positioned in environment 101.

Figure 2:
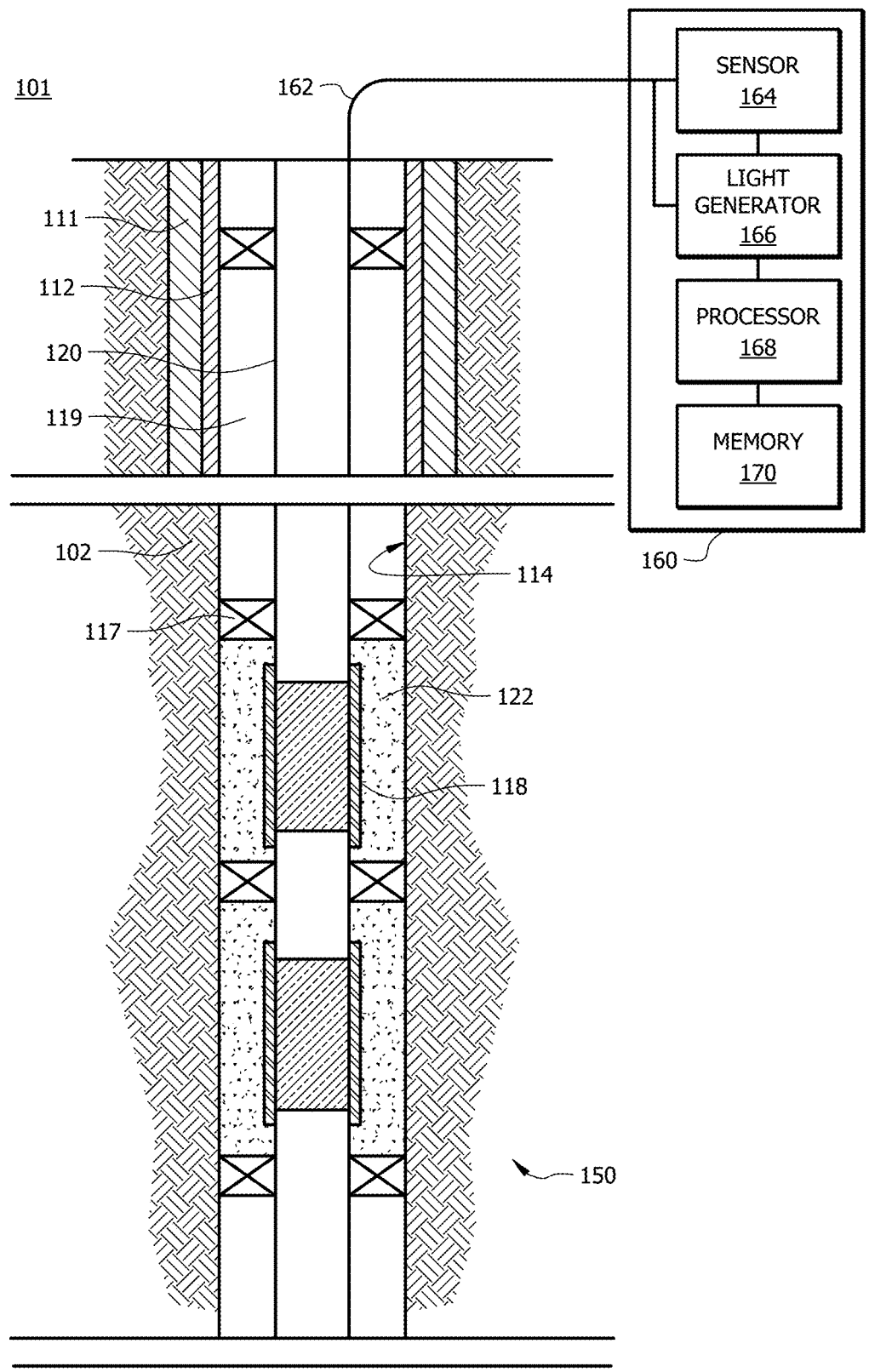
FIG. 2 is a schematic, cross-sectional illustration of a downhole wellbore environment according to an embodiment of this disclosure.

As shown in FIG. 2, exemplary environment 101 includes a wellbore 114 traversing a subterranean formation 102, casing 112 lining at least a portion of wellbore 114, and a tubular 120 extending through wellbore 114 and casing 112. A plurality of completion assemblies such as spaced screen elements or assemblies 118 can be provided along tubular 120. In addition, a plurality of spaced zonal isolation device 117 and gravel packs 122 may be provided between tubular 120 and the sidewall of wellbore 114. In some embodiments, the operating environment 101 includes a workover and/or drilling rig positioned at the surface and extending over the wellbore 114. While shown with an exemplary completion configuration in FIG. 2, other equipment may be present in place of or in addition to the equipment illustrated in FIG. 2.

In general, the wellbore 114 can be drilled into the subterranean formation 102 using any suitable drilling technique. The wellbore 114 can extend substantially vertically from the earth's surface over a vertical wellbore portion, deviate from vertical relative to the earth's surface over a deviated wellbore portion, and/or transition to a horizontal wellbore portion. In general, all or portions of a wellbore may be vertical, deviated at any suitable angle, horizontal, and/or curved. In addition, the wellbore 114 can be a new wellbore, an existing wellbore, a straight wellbore, an extended reach wellbore, a sidetracked wellbore, a multi-lateral wellbore, and other types of wellbores for drilling and completing one or more production zones. As illustrated, the wellbore 114 includes a substantially vertical producing section 150, which is an open hole completion (i.e., casing 112 does not extend through producing section 150). Although section 150 is illustrated as a vertical and open hole portion of wellbore 114 in FIG. 1, embodiments disclosed herein can be employed in sections of wellbores having any orientation, and in open or cased sections of wellbores. The casing 112 extends into the wellbore 114 from the surface and can be cemented within the wellbore 114 with cement 111.

Figure 3A:
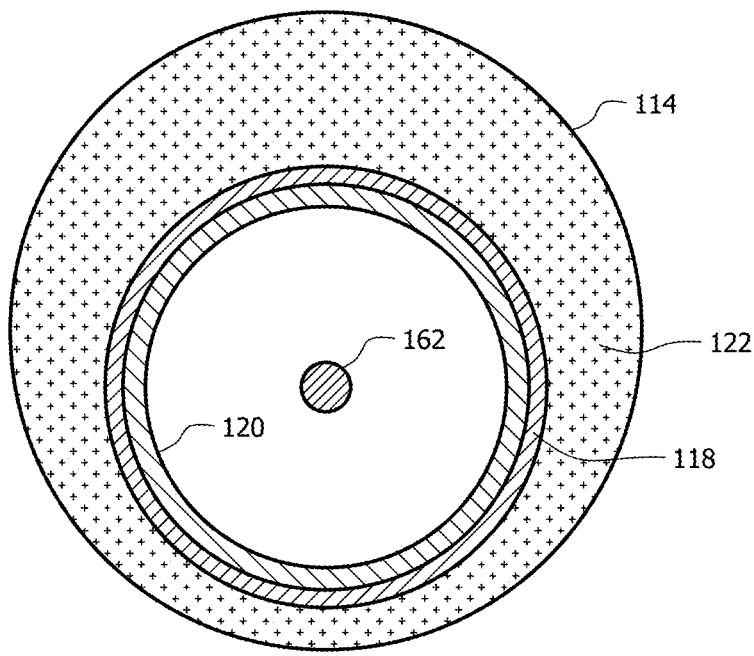
FIGS. 3A and 3B are a schematic, cross-sectional views of embodiments of a well with a wellbore tubular having an optical fiber associated therewith.
Figure 3B:
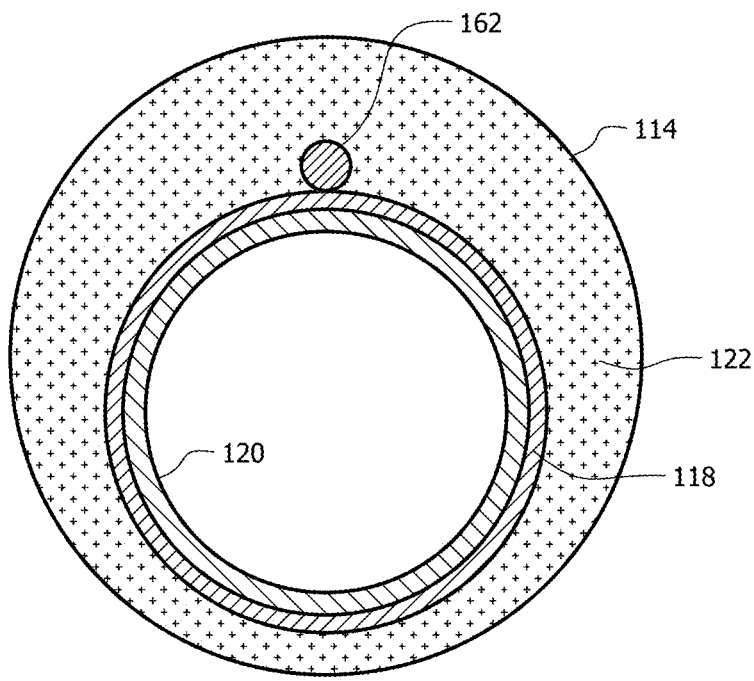

The tubular 120 can be lowered into the wellbore 114 for performing an operation such as drilling, completion, intervention, workover, treatment, and/or production processes. In the embodiment shown in FIG. 2, the tubular 120 is a completion assembly string including a distributed acoustic sensor (DAS) sensor coupled thereto. However, in general, embodiments of the tubular 120 can function as a different type of structure in a wellbore including, without limitation, as a drill string, casing, liner, jointed tubing, and/or coiled tubing. Further, the tubular 120 may operate in any portion of the wellbore 114 (e.g., vertical, deviated, horizontal, and/or curved section of wellbore 114). Embodiments of DAS systems described herein can be coupled to the exterior of the tubular 120, or in some embodiments, disposed within an interior of the tubular 120, as shown in FIGS. 3A and 3B, respectively. When the DAS fiber is coupled to the exterior of the tubular 120, as depicted in the embodiment of FIG. 3B, the DAS fiber can be positioned within a control line, control channel, or recess in the tubular 120. In some embodiments an outer shroud contains the tubular 120 and protects the system during installation. A control line or channel can be formed in the shroud and the DAS fiber can be placed in the control line or channel.

The tubular 120 can extend from the surface to the producing zones and generally provides a conduit for fluids to travel from the formation 102 to the surface. A completion assembly including the tubular 120 can include a variety of other equipment or downhole tools to facilitate the production of the formation fluids from the production zones. For example, zonal isolation devices 117 can be used to isolate the various zones within the wellbore 114. In this embodiment, each zonal isolation device 117 can be a packer (e.g., production packer, gravel pack packer, frac-pac packer, etc.). The zonal isolation devices 117 can be positioned between the screen assemblies 118, for example, to isolate different gravel pack zones or intervals along the wellbore 114 from each other. In general, the space between each pair of adjacent zonal isolation devices 117 defines a production interval.

The screen assemblies 118 provide sand control capability. In particular, the sand control screen elements 118, or other filter media associated with wellbore tubular 120, can be designed to allow fluids to flow therethrough but restrict and/or prevent particulate matter of sufficient size from flowing therethrough. The screen assemblies 118 can be of the type known as "wire-wrapped", which are made up of a wire closely wrapped helically about a wellbore tubular, with a spacing between the wire wraps being chosen to allow fluid flow through the filter media while keeping particulates that are greater than a selected size from passing between the wire wraps. Other types of filter media can also be provided along the tubular 120 and can include any type of structures commonly used in gravel pack well completions, which permit the flow of fluids through the filter or screen while restricting and/or blocking the flow of particulates (e.g. other commercially-available screens, slotted or perforated liners or pipes; sintered-metal screens; sintered-sized, mesh screens; screened pipes; prepacked screens and/or liners; or combinations thereof). A protective outer shroud having a plurality of perforations therethrough may be positioned around the exterior of any such filter medium.

The gravel packs 122 are formed in the annulus 119 between the screen elements 118 (or tubular 120) and the sidewall of the wellbore 114 in an open hole completion. In general, the gravel packs 122 comprise relatively coarse granular material placed in the annulus to form a rough screen against the ingress of sand into the wellbore while also supporting the wellbore wall. The gravel pack 122 is optional and may not be present in all completions.

The fluid flowing into the tubular 120 may comprise more than one fluid component. Typical components include natural gas, oil (e.g., hydrocarbon liquids), water, steam, carbon dioxide, and/or various multiphase mixed flows. The fluid flow can further be time varying such as including slugging, bubbling, or time altering flow rates of different phases. The relative proportions of these components can vary over time based on conditions within the formation 102 and the wellbore 114. Likewise, the composition of the fluid flowing into the tubular 120 sections throughout the length of the entire production string can vary significantly from section to section at any given time.

Fluid can be produced into the wellbore 114 and into the completion assembly string. As the fluid enters the wellbore 114, it may create acoustic sounds that can be detected using an acoustic sensor such as a DAS system. Accordingly, the flow of the various fluids into the wellbore 114 and/or through the wellbore 114 can create vibrations or acoustic sounds that can be detected using sensors to detect the vibrations or acoustic sounds. For example, the vibrations can be detected using a DAS system, though other point types vibration or acoustic sensors can be used alone or in combination with the DAS system. Each type of event such as the different fluid flows and fluid flow locations can produce an acoustic signature with unique frequency domain features.

In FIG. 2, the DAS comprises an optical fiber 162 based acoustic sensing system that uses the optical backscatter component of light injected into the optical fiber for detecting acoustic perturbations (e.g., dynamic strain) along the length of the fiber 162. The light can be generated by a light generator or source 166 such as a laser, which can generate light pulses. The optical fiber 162 acts as the sensor element with no addition transducers in the optical path, and measurements can be taken along the length of the entire optical fiber 162. The measurements can then be detected by an optical receiver such as sensor 164 and selectively filtered to obtain measurements from a given depth point or range, thereby providing for a distributed measurement that has selective data for a plurality of zones along the optical fiber 162 at any given time. In this manner, the optical fiber 162 effectively functions as a distributed array of microphones spread over the entire length of the optical fiber 162, which typically spans at least the production zone 150 of the wellbore 114, to detect downhole acoustics.

The light backscattered up the optical fiber 162 as a result of the optical backscatter can travel back to the source, where the signal can be collected by a sensor 164 and processed (e.g., using a processor 168). In general, the time the light takes to return to the collection point is proportional to the distance traveled along the optical fiber 162. The resulting backscattered light arising along the length of the optical fiber 162 can be used to characterize the environment around the optical fiber 162. The use of a controlled light source 166 (e.g., having a controlled spectral width and frequency) may allow the backscatter to be collected and any disturbances along the length of the optical fiber 162 to be analyzed. In general, any acoustic or dynamic strain disturbances along the length of the optical fiber 162 can result in a change in the properties of the backscattered light, allowing for a distributed measurement of both the acoustic magnitude (e.g., amplitude), frequency and, in some cases, of the relative phase of the disturbance.

An acquisition device 160 can be coupled to one end of the optical fiber 162. As discussed herein, the light source 166 can generate the light (e.g., one or more light pulses), and the sensor 164 can collect and analyze the backscattered light returning up the optical fiber 162. In some contexts, the acquisition device 160 including the light source 166 and the sensor 164 can be referred to as an interrogator. In addition to the light source 166 and the sensor 164, the acquisition device 160 generally comprises a processor 168 in signal communication with the sensor 164 to perform various analysis steps described in more detail herein. While shown as being within the acquisition device 160, the processor can also be located outside of the acquisition device 160 including being located remotely from the acquisition device 160. The sensor 164 can be used to obtain data at various rates and may obtain data at a sufficient rate to detect the acoustic signals of interest with sufficient bandwidth. In an embodiment, depth resolution ranges in a range of from about 1 meter to about 10 meters, or less than or equal to about 10, 9, 8, 7, 6, 5, 4, 3, 2, or 1 meter can be achieved. Depending on the resolution needs, larger averages or ranges can be used for computing purposes. When a high depth resolution is not needed, a system having a wider resolution (e.g., which may be less expensive) can also be used in some embodiments.

While the system 101 described herein can be used with a DAS system to acquire an acoustic signal for a location or depth range in the wellbore 114, in general, any suitable acoustic signal acquisition system can be used with the method steps disclosed herein. For example, various microphones or other sensors can be used to provide an acoustic signal at a given location based on the acoustic signal processing described herein. A benefit of the use of the DAS system is that an acoustic signal can be obtained across a plurality of locations and/or across a continuous length of the wellbore 114 rather than at discrete locations.

Specific spectral signatures can be determined for each event by considering one or more frequency domain features of the acoustic signal obtained from the wellbore. The resulting spectral signatures can then be used along with processed acoustic signal data to determine if an event is occurring at a depth range of interest. The events can include various fluid flows and/or inflows as described herein. The spectral signatures can be determined by considering the different types of flow occurring within a wellbore and characterizing the frequency domain features for each type of flow. In some embodiments, various combinations and/or transformations of the frequency domain features can be used to characterize each type of flow.

Figure 4:
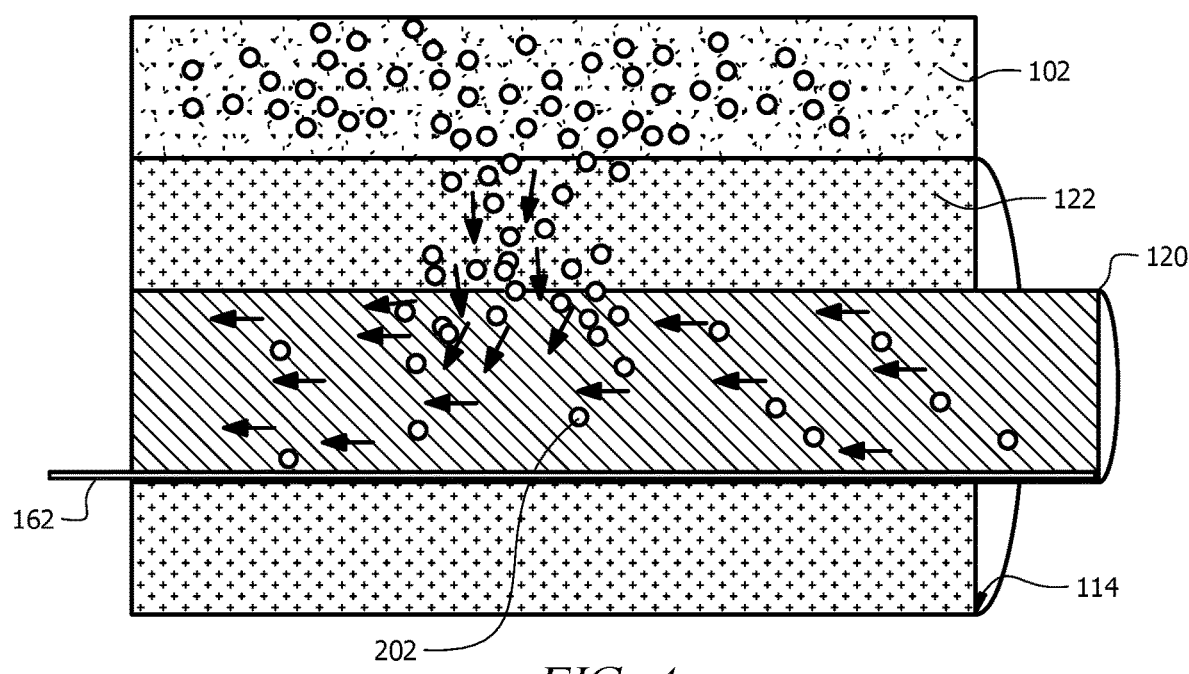
FIG. 4 is a schematic view of an embodiment of a wellbore tubular with fluid inflow according to an embodiment of this disclosure.

FIG. 4 schematically illustrates an exemplary view of an embodiment of a wellbore tubular 120 with fluid inflow including a gas phase (e.g., as depicted as gas bubbles 202) with or without a liquid phase, and shown in the cross-sectional illustrations in FIGS. 3A and 3B, fluid (e.g., gas, hydrocarbon liquid, water). The gas phase depicted as 202 can flow from the formation 102 into the wellbore 114 and then into the tubular 120. As the fluid 202 flows into the tubular 120, various acoustic signals can be generated, and as the fluid 202 flows within the tubular 120, additional acoustic signals, which can be the same or different than the inflow signals, can also be generated. The acoustic signals can then be detected by the DAS fiber and recorded using the DAS system. Without being limited by this or any particular theory, the spectral characteristics of the sounds generated by each type of fluid flow and/or inflow can depend on the effective mass and flow rate of each fluid. In some embodiments, the acoustic signals obtained at 100 can include frequencies in the range of about 5 Hz to about 10 kHz, frequencies in the range of about 5 Hz to about 5 kHz or about 50 Hz to about 5 kHz, or frequencies in the range of about 500 Hz to about 5 kHz. Any frequency ranges between the lower frequency values (e.g., 5 Hz, 50 Hz, 500 Hz, etc.) and the upper frequency values (e.g., 10 kHz, 7 kHz, 5 kHz, etc.) can be used to define the frequency range for a broadband acoustic signal.

Figure 5:
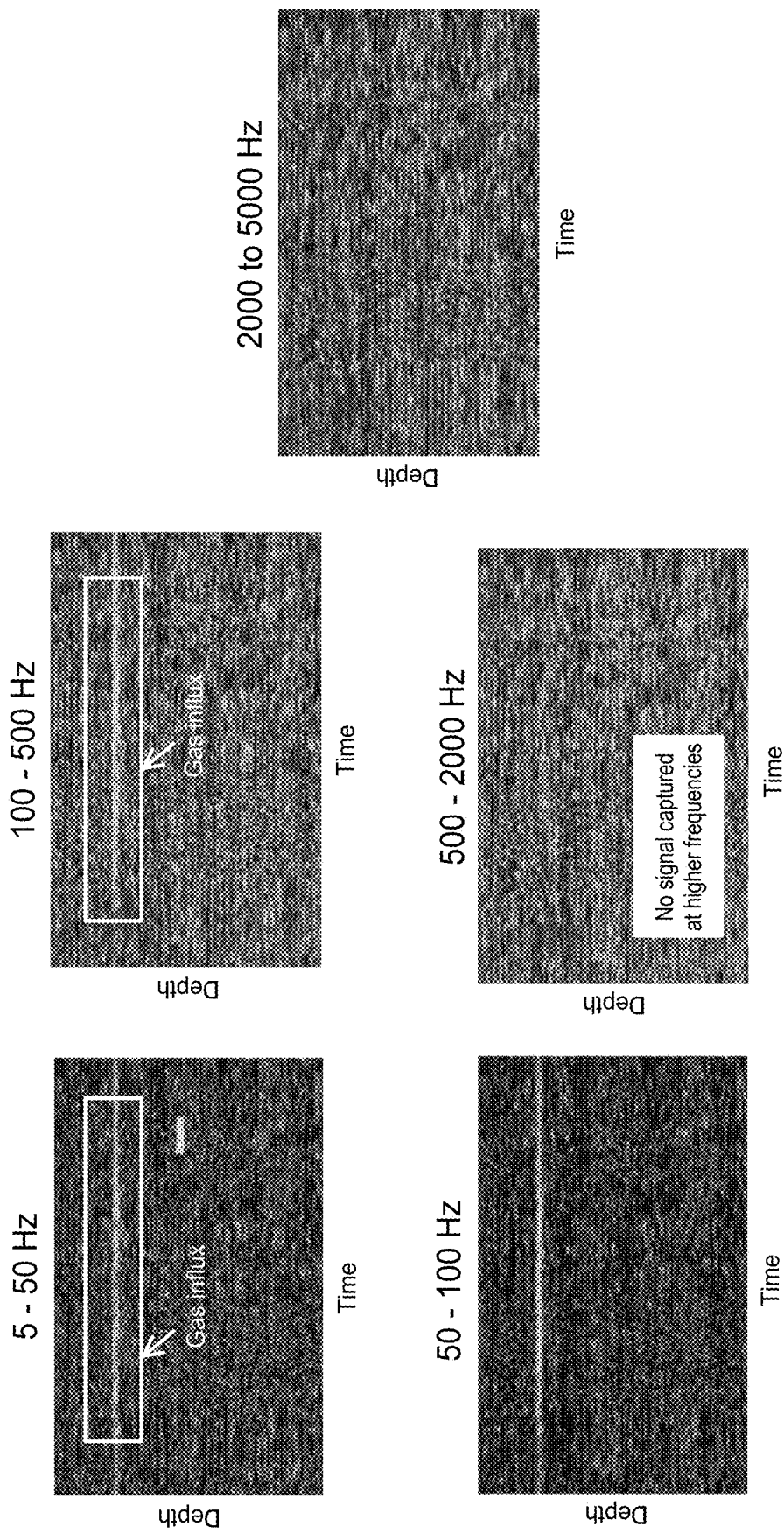
FIG. 5 is an exemplary frequency filtered acoustic intensity graph versus time over five frequency bands.

Taking gas flow and/or inflow as an example, the proximity to the optical fiber 162 can result in a high likelihood that any acoustic signals generated would be detected by the optical fiber 162. The flow of a gas into the wellbore would likely result in a turbulent flow over a broad frequency range. For example, the gas inflow acoustic signals can be between about 0 Hz and about 1000 Hz, or alternatively between about 0 Hz and about 500 Hz. An increased power intensity may occur between about 300 Hz and about 500 Hz from increased turbulence in the gas flow. An example of the acoustic signal resulting from the influx of gas into the wellbore is shown in FIG. 5, which illustrates frequency filtered acoustic intensity in depth versus time graphs for five frequency bins. As illustrated, the five frequency bins represent 5 Hz to 50 Hz, 50 Hz to 100 Hz, 100 Hz to 500 Hz, 500 Hz to 2000 Hz, and 2000 Hz to 5000 Hz. The acoustic intensity can be seen in the first three bins with frequency ranges up to about 500 Hz, with a nearly undetectable acoustic intensity in the frequency range above 500 Hz. This demonstrates that at least a portion of the frequency domain features may not be present above 500 Hz, which can help to define the signature of the influx of gas. This type of response demonstrates that each event can be expected to produce an acoustic response having potentially unique feature sets that can be used to help define a signature for the event. While described in terms of frequency ranges or bins, other features and transformations of such features can be used to help define the gas flow and/or inflow signatures, which can be used with a multivariate model for determining if gas flow and/or inflow is present.

Similar frequency features can be expected for other fluid inflows as well as fluid flows along a tubular within the wellbore. The resulting acoustic signal can be processed to determine a plurality of frequency domain features. The signatures for each type of fluid flow can then be based on a plurality of frequency domain features. This can include transforming one or more of the frequency domain features to serve as an element of a specific fluid flow signature, as described in more detail herein.

Referring again to FIG. 2, the processor 168 within the acquisition device 160 can be configured to perform various data processing to detect the presence of fluid inflow along the length of the wellbore 114. The acquisition device 160 can comprise a memory 170 configured to store an application or program to perform the data analysis. While shown as being contained within the acquisition device 160, the memory 170 can comprise one or more memories, any of which can be external to the acquisition device 160. In an embodiment, the processor 168 can execute the program, which can configure the processor 168 to filter the acoustic data set spatially, determine one or more frequency domain features of the acoustic signal, and determine whether or not fluid inflow is occurring at the selected location based on the analysis described hereinbelow, and whether any fluid inflow comprises water inflow, hydrocarbon liquid inflow, and gas inflow. The analysis can be repeated across various locations along the length of the wellbore 114 to determine the locations of fluid inflow and/or the type of fluid (e.g., gas, water, hydrocarbon liquid) inflowing along the length of the wellbore 114.

When the acoustic sensor comprises a DAS system, the optical fiber 162 can return raw optical data in real time or near real time to the acquisition unit 160. In an embodiment, the raw data can be stored in the memory 170 for various subsequent uses. The sensor 164 can be configured to convert the raw optical data into an acoustic data set.

Figure 6:
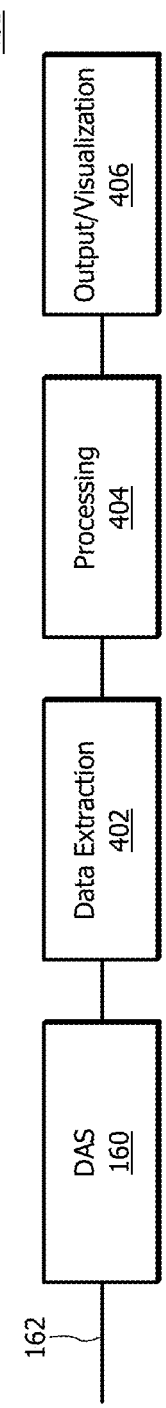
FIG. 6 illustrates an embodiment of a schematic processing flow for an acoustic signal, according to an embodiment of this disclosure.

As shown schematically in FIG. 6, an embodiment of a system 401 for detecting fluid and/or fluid phase of an inflow can comprise a data extraction unit 402, a processing unit 404, and/or an output or visualization unit 406. The data extraction unit 402 can obtain the optical data and perform the initial pre-processing steps to obtain the initial acoustic information from the signal returned from the wellbore. Various analyses can be performed including frequency band extraction, frequency analysis and/or transformation, intensity and/or energy calculations, and/or determination of one or more properties of the acoustic data. Following the data extraction unit 402, the resulting signals can be sent to a processing unit 404. Within the processing unit, the acoustic data can be analyzed, for example, by calculating one or more frequency domain features and utilizing a model or models obtained from a machine learning approach (e.g., a supervised learning approach, etc.) on the one or more frequency domain features as described further hereinbelow to determine if fluid flow and/or inflow is present, and, if present, determining if the fluid flow and/or inflow comprises water flow and/or inflow, hydrocarbon liquid flow and/or inflow, and/or gas flow and/or inflow.

One or more models can also be used to determine the presence of various fluid flow regimes within a conduit within the wellbore. In some embodiments, the machine learning approach comprises a logistic regression model. In some such embodiments, a single frequency domain feature (e.g., spectral flatness, RMS bin values, etc.) can be used to determine if fluid inflow is present at each location of interest. In some embodiments, the supervised learning approach can be used to determine a model of the various flow regimes such as a first polynomial having the plurality of frequency domain features as inputs to determine when gas phase inflow is present, a second polynomial having the plurality of frequency domain features as inputs to determine when aqueous phase inflow is present, and a third polynomial having the plurality of frequency domain features as inputs to determine when hydrocarbon liquid phase inflow is present. Once the processing unit 404 uses the model obtained from the machine learning approach to determine the presence or lack of fluid inflow (e.g., gas inflow, water inflow, hydrocarbon liquid inflow, etc.) and the composition thereof (e.g., gas, hydrocarbon liquid, water), the resulting analysis information can then be sent from the processing unit 404 to the output/visualization unit 406 where various information such a visualization of the location of the inflow and/or information providing quantification information (e.g., a relative amount of gas inflow, water inflow, hydrocarbon liquid inflow, and the like) can be visualized in a number of ways. In an embodiment, the resulting event information can be visualized on a well schematic, on a time log, or any other number of displays to aid in understanding where the inflow is occurring, and in some embodiments, to display a relative amount of the various components of the inflowing fluid occurring at one or more locations along the length of the wellbore. While illustrated in FIG. 6 as separate units, any two or more of the units shown in FIG. 6 can be incorporated into a single unit. For example, a single unit can be present at the wellsite to provide analysis, output, and optionally, visualization of the resulting information.

As noted above, a method of identifying fluid flow according to this disclosure can comprise preprocessing the acoustic signal. The acoustic signal can be generated within the wellbore as described herein. Depending on the type of DAS system employed, the optical data may or may not be phase coherent and may be pre-processed to improve the signal quality (e.g., denoised for opto-electronic noise normalization/de-trending single point-reflection noise removal through the use of median filtering techniques or even through the use of spatial moving average computations with averaging windows set to the spatial resolution of the acquisition unit, etc.). The raw optical data from the acoustic sensor can be received and generated by the sensor to produce the acoustic signal. The data rate generated by various acoustic sensors such as the DAS system can be large. For example, the DAS system may generate data on the order of 0.5 to about 2 terabytes per hour. This raw data can optionally be stored in a memory.

The raw data can then be optionally pre-processed in step 200. A number of specific processing steps can be performed to determine the presence of fluid inflow and/or the composition of inflowing fluid. In an embodiment, the noise detrended "acoustic variant" data can be subjected to an optional spatial filtering step following the other pre-processing steps, if present. A spatial sample point filter can be applied that uses a filter to obtain a portion of the acoustic signal corresponding to a desired depth in the wellbore. Since the time the light pulse sent into the optical fiber returns as backscattered light can correspond to the travel distance, and therefore depth in the wellbore, the acoustic data can be processed to obtain a sample indicative of the desired depth or depth range. This may allow a specific location within the wellbore to be isolated for further analysis. The pre-processing step may also include removal of spurious back reflection type noises at specific depths through spatial median filtering or spatial averaging techniques. This is an optional step and helps focus primarily on an interval of interest in the wellbore. For example, the spatial filtering step can be used to focus on a producing interval where there is maximum likelihood of fluid inflow, for example. The resulting data set produced through the conversion of the raw optical data can be referred to as the acoustic sample data.

Filtering can provide several advantages. When the acoustic data set is spatially filtered, the resulting data, for example the acoustic sample data, used for the next step of the analysis can be indicative of an acoustic sample over a defined depth (e.g., the entire length of the optical fiber, some portion thereof, or a point source in the wellbore 114). In some embodiments, the acoustic data set can comprise a plurality of acoustic samples resulting from the spatial filter to provide data over a number of depth ranges. In some embodiments, the acoustic sample may contain acoustic data over a depth range sufficient to capture multiple points of interest. In some embodiments, the acoustic sample data contains information over the entire frequency range at the depth represented by the sample. This is to say that the various filtering steps, including the spatial filtering, do not remove the frequency information from the acoustic sample data.

The processor 168 can be further configured to transform the filtered data from the time domain into the frequency domain using a transform. For example, Discrete Fourier transformations (DFT) or a short time Fourier transform (STFT) of the acoustic variant time domain data measured at each depth section along the fiber or a section thereof may be performed to provide the data from which the plurality of frequency domain features can be determined. Spectral feature extraction through time and space can be used to determine the spectral conformance and determine if an acoustic signature (e.g., a fluid inflow signature, a gas phase inflow signature, a water phase inflow signature, a hydrocarbon liquid phase inflow signature, etc.) is present in the acoustic sample. Within this process, various frequency domain features can be calculated for the acoustic sample data.

Preprocessing at 200 can optionally include a noise normalization routine to improve the signal quality. This step can vary depending on the type of acquisition device used as well as the configuration of the light source, the sensor, and the other processing routines. The order of the aforementioned preprocessing steps can be varied, and any order of the steps can be used.

Preprocessing at 200 can further comprise calibrating the acoustic signal. Calibrating the acoustic signal can comprise removing a background signal from the acoustic signal, and/or correcting the acoustic signal for signal variations in the measured data. In some embodiments, calibrating the acoustic signal comprises identifying one or more anomalies within the acoustic signal and removing one or more portions of the acoustic signal outside the one or more anomalies. As noted hereinabove, a method of this disclosure comprises determining one or more frequency domain features or indicators at step 300. The use of frequency domain features to identify inflow locations and inflow discrimination can provide a number of advantages. First, the use of frequency domain features results in significant data reduction relative to the raw DAS data stream. Thus, a number of frequency domain features can be calculated and used to allow for event identification while the remaining data can be discarded or otherwise stored, and the remaining analysis can be performed using the frequency domain features. Even when the raw DAS data is stored, the remaining processing power is significantly reduced through the use of the frequency domain features rather than the raw acoustic data itself. Further, the use of the frequency domain features can, with the appropriate selection of one or more of the frequency domain features, provide a concise, quantitative measure of the spectral character or acoustic signature of specific sounds pertinent to downhole fluid surveillance and other applications.

While a number of frequency domain features can be determined for the acoustic sample data, not every frequency domain feature may be used in the identifying fluid flow characteristics, the locations of fluid inflow, or identifying at least one of a gas phase inflow, an aqueous phase inflow, or a hydrocarbon liquid phase inflow. The frequency domain features represent specific properties or characteristics of the acoustic signals. There are a number of factors that can affect the frequency domain feature selection for each fluid inflow event. For example, a chosen descriptor should remain relatively unaffected by the interfering influences from the environment such as interfering noise from the electronics/optics, concurrent acoustic sounds, distortions in the transmission channel, and the like. In general, electronic/instrumentation noise is present in the acoustic signals captured on the DAS or any other electronic gauge, and it is usually an unwanted component that interferes with the signal. Thermal noise is introduced during capturing and processing of signals by analogue devices that form a part of the instrumentation (e.g., electronic amplifiers and other analog circuitry). This is primarily due to thermal motion of charge carriers. In digital systems additional noise may be introduced through sampling and quantization. The frequency domain features should have values that are significant for a given even in the presence of noise.

As a further consideration in selecting the frequency domain feature(s) for a fluid inflow event, the dimensionality of the frequency domain feature should be compact. A compact representation is desired to decrease the computational complexity of subsequent calculations. The frequency domain feature should also have discriminant power. For example, for different types of audio signals, the selected set of descriptors should provide altogether different values. A measure for the discriminant power of a feature is the variance of the resulting feature vectors for a set of relevant input signals. Given different classes of similar signals, a discriminatory descriptor should have low variance inside each class and high variance over different classes. The frequency domain feature should also be able to completely cover the range of values of the property it describes.

In some embodiments, combinations of frequency domain features can be used. This can include a signature having multiple frequency domain features as indicators. In some embodiments, a plurality of frequency domain features can be transformed to create values that can be used to define various event signatures. This can include mathematical transformations including ratios, equations, rates of change, transforms (e.g., wavelets, Fourier transforms, other wave form transforms, etc.), other features derived from the feature set, and/or the like as well as the use of various equations that can define lines, surfaces, volumes, or multivariable envelopes. The transformation can use other measurements or values outside of the frequency domain features as part of the transformation. For example, time domain features, other acoustic features, and non-acoustic measurements can also be used. In this type of analysis, time can also be considered as a factor in addition to the frequency domain features themselves. As an example, a plurality of frequency domain features can be used to define a surface (e.g., a plane, a three-dimensional surface, etc.) in a multivariable space, and the measured frequency domain features can then be used to determine if the specific readings from an acoustic sample fall above or below the surface. The positioning of the readings relative to the surface can then be used to determine if the event if present or not at that location in that detected acoustic sample.

As an example, the chosen set of frequency domain features should be able to uniquely identify the event signatures with a reasonable degree of certainty of each of the acoustic signals pertaining to a selected downhole surveillance application or fluid inflow event as described herein. Such frequency domain features can include, but are not limited to, the spectral centroid, the spectral spread, the spectral roll-off, the spectral skewness, the root mean square (RMS) band energy (or the normalized subband energies/band energy ratios), a loudness or total RMS energy, a spectral flatness, a spectral slope, a spectral kurtosis, a spectral flux, a spectral autocorrelation function, or a normalized variant thereof.

The spectral centroid denotes the "brightness" of the sound captured by the optical fiber 162 and indicates the center of gravity of the frequency spectrum in the acoustic sample. The spectral centroid can be calculated as the weighted mean of the frequencies present in the signal, where the magnitudes of the frequencies present can be used as their weights in some embodiments. The value of the spectral centroid, $C_i$, of the $i^{th}$ frame of the acoustic signal captured at a spatial location on the fiber, may be written as:

$$C_i = \frac{\sum_{k=1}^{N} f(k) X_i(k)}{\sum_{k=1}^{N} X_i(k)}, \qquad \text{(Eq. 1)}$$

where $X_i(k)$, is the magnitude of the short time Fourier transform of the $i^{th}$ frame where 'k' denotes the frequency coefficient or bin index, N denotes the total number of bins and f(k) denotes the centre frequency of the bin. The computed spectral centroid may be scaled to value between 0 and 1. Higher spectral centroids typically indicate the presence of higher frequency acoustics and help provide an immediate indication of the presence of high frequency noise.

The spectral spread can also be determined for the acoustic sample. The spectral spread is a measure of the shape of the spectrum and helps measure how the spectrum is distributed around the spectral centroid. In order to compute the spectral spread, $S_i$, one has to take the deviation of the spectrum from the computed centroid as per the following equation (all other terms defined above):

$$S_i = \sqrt{\frac{\sum_{k=1}^{N} (f(k) - C_i)^2 X_i(k)}{\sum_{k=1}^{N} X_i(k)}}. \qquad \text{(Eq. 2)}$$

Lower values of the spectral spread correspond to signals whose spectra are tightly concentrated around the spectral centroid. Higher values represent a wider spread of the spectral magnitudes and provide an indication of the presence of a broad band spectral response.

The spectral roll-off is a measure of the bandwidth of the audio signal. The Spectral roll-off of the $i^{th}$ frame, is defined as the frequency bin 'y' below which the accumulated magnitudes of the short-time Fourier transform reach a certain percentage value (usually between 85%-95%) of the overall sum of magnitudes of the spectrum.

$$\sum_{k=1}^{y} |X_i(k)| = \frac{c}{100} \sum_{k=1}^{N} |X_i(k)|, \qquad \text{(Eq. 3)}$$

where c=85 or 95. The result of the spectral roll-off calculation is a bin index and enables distinguishing acoustic events based on dominant energy contributions in the frequency domain. (e.g., between gas influx and liquid flow, etc.)

The spectral skewness measures the symmetry of the distribution of the spectral magnitude values around their arithmetic mean.

The RMS band energy provides a measure of the signal energy within defined frequency bins that may then be used for signal amplitude population. The selection of the bandwidths can be based on the characteristics of the captured acoustic signal. In some embodiments, a sub-band energy ratio representing the ratio of the upper frequency in the selected band to the lower frequency in the selected band can range between about 1.5:1 to about 3:1. In some embodiments, the subband energy ratio can range from about 2.5:1 to about 1.8:1, or alternatively be about 2:1. In some embodiment, selected frequency ranges for a signal with a 5,000 Hz Nyquist acquisition bandwidth can include: a first bin with a frequency range between 0 Hz and 20 Hz, a second bin with a frequency range between 20 Hz and 40 Hz, a third bin with a frequency range between 40 Hz and 80 Hz, a fourth bin with a frequency range between 80 Hz and 160 Hz, a fifth bin with a frequency range between 160 Hz and 320 Hz, a sixth bin with a frequency range between 320 Hz and 640 Hz, a seventh bin with a frequency range between 640 Hz and 1280 Hz, an eighth bin with a frequency range between 1280 Hz and 2500 Hz, and a ninth bin with a frequency range between 2500 Hz and 5000 Hz. In some embodiments, a low frequency threshold can be used to help to reduce noise in the signal. For example, a lower frequency threshold between 0 and 5 Hz, between 0 and 10 Hz, or between 0 and 15 Hz can be used, which can result in the first bin including a frequency range between 5 Hz and 20 Hz, between 10 Hz and 20 Hz, or between 15 Hz and 20 Hz depending on the lower frequency threshold used. In some embodiments, a ninth bin can be defined as cover the entire frequency range covered by the other bins. For example, a ninth bin can have a frequency range from 0 Hz to 5,000 Hz (or between 5 Hz and 5,000 Hz, 10 Hz and 5,000 Hz, or 15 Hz and 5,000 Hz, depending on whether or not a lower threshold is used and the choice of that threshold). The bin covering the entire frequency range can be used, in some embodiments, to normalize the measurements within each individual bin. While certain frequency ranges for each bin are listed herein, they are used as examples only, and other values in the same or a different number of frequency range bins can also be used. In some embodiments, the RMS band energies may also be expressed as a ratiometric measure by computing the ratio of the RMS signal energy within the defined frequency bins relative to the total RMS energy across the acquisition (Nyquist) bandwidth. This may help to reduce or remove the dependencies on the noise and any momentary variations in the broadband sound.

The total RMS energy of the acoustic waveform calculated in the time domain can indicate the loudness of the acoustic signal. In some embodiments, the total RMS energy can also be extracted from the temporal domain after filtering the signal for noise.

The spectral flatness is a measure of the noisiness/tonality of an acoustic spectrum. It can be computed by the ratio of the geometric mean to the arithmetic mean of the energy spectrum value and may be used as an alternative approach to detect broadbanded signals. For tonal signals, the spectral flatness can be close to 0 and for broader band signals it can be closer to 1.

The spectral slope provides a basic approximation of the spectrum shape by a linearly regressed line. The spectral slope represents the decrease of the spectral amplitudes from low to high frequencies (e.g., a spectral tilt). The slope, the y-intersection, and the max and media regression error may be used as features.

The spectral kurtosis provides a measure of the flatness of a distribution around the mean value.

The spectral flux is a measure of instantaneous changes in the magnitude of a spectrum. It provides a measure of the frame-to-frame squared difference of the spectral magnitude vector summed across all frequencies or a selected portion of the spectrum. Signals with slowly varying (or nearly constant) spectral properties (e.g., noise) have a low spectral flux, while signals with abrupt spectral changes have a high spectral flux. The spectral flux can allow for a direct measure of the local spectral rate of change and consequently serves as an event detection scheme that could be used to pick up the onset of acoustic events that may then be further analyzed using the feature set above to identify and uniquely classify the acoustic signal.

The spectral autocorrelation function provides a method in which the signal is shifted, and for each signal shift (lag) the correlation or the resemblance of the shifted signal with the original one is computed. This enables computation of the fundamental period by choosing the lag, for which the signal best resembles itself, for example, where the autocorrelation is maximized. This can be useful in exploratory signature analysis/even for anomaly detection for well integrity monitoring across specific depths where well barrier elements to be monitored are positioned.

Any of these frequency domain features, or any combination of these frequency domain features (including transformations of any of the frequency domain features and combinations thereof), can be used to identify the location of fluid inflow or the fluid inflow discrimination as described hereinbelow. In an embodiment, a selected set of characteristics can be used to identify the presence or absence for each fluid inflow event, and/or all of the frequency domain features that are calculated can be used as a group in characterizing the presence or absence of a fluid inflow event. The specific values for the frequency domain features that are calculated can vary depending on the specific attributes of the acoustic signal acquisition system, such that the absolute value of each frequency domain feature can change between systems. In some embodiments, the frequency domain features can be calculated for each event based on the system being used to capture the acoustic signal and/or the differences between systems can be taken into account in determining the frequency domain feature values for each fluid inflow event between or among the systems used to determine the values and the systems used to capture the acoustic signal being evaluated.

One or a plurality of frequency domain features can be used to characterize each type of event (e.g., fluid inflow, water inflow, gas inflow, hydrocarbon liquid inflow). In an embodiment, one, at least two, alternatively at least three, alternatively at least four, alternatively at least five, alternatively at least six, alternatively at least seven, or alternatively at least eight different frequency domain features can be used to characterize each type of event (e.g., fluid inflow, water inflow, gas inflow, hydrocarbon liquid inflow). The frequency domain features can be combined or transformed in order to define the event signatures for one or more events. While exemplary numerical ranges are provided herein, the actual numerical results may vary depending on the data acquisition system and/or the values can be normalized or otherwise processed to provide different results.

As noted above, in order to obtain the frequency domain features, the acoustic sample data can be converted to the frequency domain at preprocessing step 200. In an embodiment, the raw optical data may contain or represent acoustic data in the time domain. Thus, in some embodiments, preprocessing at 200 comprises obtaining a frequency domain representation of the data using a Fourier Transform. Various algorithms can be used as known in the art. In some embodiments, a Short Time Fourier Transform technique or a Discrete Time Fourier transform can be used. The resulting data sample may then be represented by a range of frequencies relative to their power levels at which they are present. The raw optical data can be transformed into the frequency domain prior to or after the application of the spatial filter. In general, the acoustic sample will be in the frequency domain in order to determine the frequency domain feature(s). In some embodiments, the processor 168 can be configured to perform the conversion of the raw acoustic data and/or the acoustic sample data from the time domain into the frequency domain. In the process of converting the signal to the frequency domain, the power across all frequencies within the acoustic sample can be analyzed. The use of the processor 168 to perform the transformation may provide the frequency domain data in real time or near real time.

The processor 168 can then be used to analyze the acoustic sample data in the frequency domain to obtain one or more of the frequency domain features and provide an output with the determined frequency domain features for further processing. In some embodiments, the output of the frequency domain features can include features that are not used to determine the presence of fluid inflow, water phase inflow, gas inflow, hydrocarbon liquid inflow.

The output of the processor with the frequency domain features for the acoustic sample data can then be used to determine the presence of one or more fluid flow and/or inflow events at one or more locations in the wellbore corresponding to depth intervals over which the acoustic data is acquired or filtered.

A method of identifying fluid inflow can optionally comprise normalizing the one or the plurality of frequency domain features at 400 prior to identifying the one or more fluid inflow locations at 500 and/or prior to identifying the at least one of the gas phase inflow, the aqueous phase inflow, or the hydrocarbon liquid phase inflow at 600.

A method of identifying fluid flow and/or inflow according to this disclosure can comprise identifying one or more fluid flow and/or inflow locations at 500. Such fluid inflow locations can be determined as known to those of skill in the art, for example via PLS data. In some embodiments, the one or more fluid inflow locations are determined as described hereinbelow. In such embodiments, identifying one or more fluid flow and/or inflow locations can comprise identifying the one or more fluid flow and/or inflow locations using one or more of the frequency domain features to identify acoustic signals corresponding to the flow and/or inflow, and correlating the depths of those signals with locations within the wellbore. The one or more frequency domain features can comprise at least two different frequency domain features. In some embodiments, the one or more frequency domain features utilized to determine the one or more fluid inflow locations comprises at least one of a spectral centroid, a spectral spread, a spectral roll-off, a spectral skewness, an RMS band energy, a total RMS energy, a spectral flatness, a spectral slope, a spectral kurtosis, a spectral flux, a spectral autocorrelation function, combinations and/or transformations thereof, and/or a normalized variant thereof. In some embodiments, the one or more frequency domain features utilized to determine the one or more fluid inflow locations include a spectral flatness, an RMS band energy, a total RMS energy, or a normalized variant of one or more of the spectral flatness, the RMS band energy, the total RMS energy, or a combination thereof.

In some embodiments, identifying the one or more fluid inflow locations comprises: identifying a background fluid flow signature using the acoustic signal; and removing the background fluid flow signature from the acoustic signal prior to identifying the one or more fluid inflow locations. In some embodiments, identifying the one or more fluid inflow locations comprises identifying one or more anomalies in the acoustic signal using the one or more frequency domain features of the plurality of frequency domain features; and selecting the depth intervals of the one or more anomalies as the one or more inflow locations.

When a portion of the signal is removed (e.g., a background fluid flow signature, etc.), the removed portion can also be used as part of the event analysis. In some embodiments, identifying the one or more fluid inflow locations comprises: identifying a background fluid flow signature using the acoustic signal; and using the background fluid flow signature from the acoustic signal to identify as event such as one or more fluid flow events.

In some embodiments, a method of identifying fluid flow and/or inflow according to this disclosure comprises identifying at least one of a gas phase inflow, an aqueous phase inflow, or a hydrocarbon liquid phase inflow using a plurality of frequency domain features at the identified one or more fluid inflow locations at 600. In some embodiments, the plurality of frequency domain features utilized for identifying the at least one of the gas phase inflow, the aqueous phase inflow, or the hydrocarbon liquid phase inflow at the identified one or more fluid inflow locations comprises at least two of: a spectral centroid, a spectral spread, a spectral roll-off, a spectral skewness, an RMS band energy, a total RMS energy, a spectral flatness, a spectral slope, a spectral kurtosis, a spectral flux, a spectral autocorrelation function, or a normalized variant thereof.

In some embodiments, identifying at least one of the gas phase inflow, the aqueous phase inflow, or the hydrocarbon liquid phase inflow using the plurality of the frequency domain features at 600 comprises: identifying the at least one of the gas phase inflow, the aqueous phase inflow, or the hydrocarbon liquid phase inflow using a value representing a transformation of at least one of the plurality of the frequency domain features. In some embodiments, identifying the at least one of the fluid flow, gas phase inflow, the aqueous phase inflow, or the hydrocarbon liquid phase inflow using the plurality of the frequency domain features at 600 comprises: identifying the at least one of a fluid flow (e.g., a gas phase flow, an aqueous phase flow, and/or a hydrocarbon phase flow), a gas phase inflow, an aqueous phase inflow, a hydrocarbon liquid phase inflow, or any combination thereof using a multivariate model (e.g., one or more polynomial equations, mathematical formulas, etc.) that defines a relationship between at least two of the plurality of the frequency domain features, including in some embodiments transformations of the frequency domain features. In some embodiments, identifying the at least one of the gas phase inflow, the aqueous phase inflow, or the hydrocarbon liquid phase inflow using the plurality of the frequency domain features at 600 comprises: identifying the presence or absence of a gas phase using a first multivariate model having a first at least two of the plurality of frequency domain features as inputs to determine when the gas phase inflow is present, identifying the presence or absence of aqueous phase inflow using a second multivariate model having a second at least two of the plurality of frequency domain features as inputs to determine when the aqueous phase inflow is present, and identifying the presence or absence of an aqueous phase inflow using a third polynomial having a third at least two of the plurality of frequency domain features as inputs to determine when the hydrocarbon liquid phase inflow is present. The first at least two, the second at least two, and the third at least two of the plurality of frequency domain features can be the same or different. In some embodiments, identifying at least one of the fluid flow, gas phase inflow, the aqueous phase inflow, or the hydrocarbon liquid phase inflow using the plurality of the frequency domain features at 600 comprises: identifying at least one of the gas phase inflow, the aqueous phase inflow, or the hydrocarbon liquid phase inflow using a ratio between at least two of the plurality of the frequency domain features.

In some embodiments, identifying at least one of the gas phase inflow, the aqueous phase inflow, or the hydrocarbon liquid phase inflow comprises providing the plurality of frequency domain features to a fluid flow and/or inflow (e.g., a logistic regression) model at 600' for each of the gas phase, the aqueous phase, and the hydrocarbon liquid phase; and determining that at least one of the gas phase, the aqueous phase, or the hydrocarbon liquid phase is present based on the fluid flow model. In some embodiments, the fluid flow model can be developed using and/or include machine learning such as a neural network, a Bayesian network, a decision tree, a logistical regression model, or a normalized logistical regression, or other supervised learning models.

In some embodiments, the fluid flow and/or inflow model can use a first multivariate model having at least two of the plurality of frequency domain features as inputs to determine when the gas phase inflow is present. The logistic regression model can use a second multivariate model having a second at least two of the plurality of frequency domain features as inputs to determine when the aqueous phase inflow is present, and the logistic regression model can use a third multivariate model having a third at least two of the plurality of frequency domain features as inputs to determine when the hydrocarbon liquid phase inflow is present. The first at least two, the second at least two, and the third at least two of the frequency domain features can be the same or different.

The use of different models for one or more types of fluid inflow events can allow for a more accurate determination of each event. The models can differ in a number of ways. For example, the models can have different parameters, different mathematical determinations, be different types of models, and/or use different frequency domain features. In some embodiments, a plurality of models can be used for different fluid inflow events, and at least one of the models can have different parameters. In general, parameters refer to constants or values used within the models to determine the output of the model. In multivariate models as an example, the parameters can be coefficients of one or more terms in the equations in the models. In neural network models as an example, the parameters can be the weightings applied to one or more nodes. Other constants, offsets, and coefficients in various types of models can also represent parameters. The use of different parameters can provide a different output amongst the models when the models are used to identify different types of fluid inflow events.

The models can also differ in their mathematical determinations. In multivariate models, the models can comprise one or more terms that can represent linear, non-linear, power, or other functions of the input variables (e.g., one or more frequency domain features, etc.). The functions can then change between the models. As another example, a neural network may have different numbers of layers and nodes, thereby creating a different network used with the input variables. Thus, even when the same frequency domain features are used in two more models, the outputs can vary based on the different functions and/or structures of the models.

The models can also be different on the basis of being different types of models. For example, the plurality of models can use regression models to identify one or more fluid inflow events and neural networks for different fluid inflow events. Other types of models are also possible and can be used to identify different types of inflow events. Similarly, the models can be different by using different input variables. The use of different variables can provide different outputs between the models. The use of different models can allow for the same or different training data to be used to produce more accurate results for different types of fluid inflow events. Any of the models described herein can rely on the use of different models for different types of fluid inflow events (e.g., a gas phase inflow, an aqueous phase inflow, a hydrocarbon liquid phase inflow, etc.), as described in more detail herein.

In some embodiments, identifying at least one of the fluid flow, the gas phase inflow, the aqueous phase inflow, or the hydrocarbon liquid phase comprises utilizing a fluid flow model and using the plurality of frequency domain features at the identified one or more fluid inflow locations in the first multivariate model; using the plurality of frequency domain features at the identified one or more fluid inflow locations in the second multivariate model; using the plurality of frequency domain features at the identified one or more fluid inflow locations in the third multivariate model; comparing the plurality of frequency domain features to an output of the first multivariate model, an output of the second multivariate model, and an output of the third multivariate model; and identifying at least one of the gas phase inflow, the aqueous phase inflow, or the hydrocarbon liquid phase inflow based on the comparison of the plurality of frequency domain features to the output of the first multivariate model, the output of the second multivariate model, and the output of the third multivariate model.

In some embodiments, the plurality of frequency domain features utilized to identify the fluid flow, at least one of the gas phase inflow, the aqueous phase inflow, or the hydrocarbon liquid phase inflow can include a normalized variant of the spectral spread and/or a normalized variant of the spectral centroid, and the fluid inflow (e.g., logistic regression) model can define a relationship between a presence or absence of the gas phase inflow, the aqueous phase inflow, or the hydrocarbon liquid phase inflow at the location of the acoustic signal.

In addition to the multivariate model(s) used to determine the presence and identity of the fluid flows and/or inflows, a multivariate model can be developed to identify fluid flow and the composition of the flow based on building a predicted data set for the flow using the inflow data. In this multivariate model, the volume of a hydrocarbon gas phase, a hydrocarbon liquid phase, and an aqueous phase can be predicted using the inflow profiling analysis. In order to predict a volume of each phase, a magnitude of one or more frequency domain features associated with each phase can be used to determine a volume of fluid. The resulting volume data can then be aggregated across each inflow location to predict the total volume of each fluid phase flowing within the conduit at a given location. This type of multivariate model can be developed using regularized multivariate linear regression. Further, this type of data can be used to predict fluid phase and volume flows in a manner similar to that provided by a PLS disposed in a wellbore. The data can then be compared to further refine and/or develop the multivariate model based on a comparison with actual PLS data from the wellbore.

Other multivariate models can also be developed using the processes described herein. In some embodiments, test data can be generated for an expected event within a wellbore using a flow loop or flow test apparatus as disclosed herein. The desired event or flow can be created, and the test data can be captured. The resulting labeled data sets can be used to train one or more multivariate models to determine the presence of the event using one or more frequency domain features.

As an example of an additional multivariate model, sand inflow and/or flow in a fluid phase within a conduit can be modeled. The sand flow can be modeled in different fluid phases, at different sand amounts, in different orientations, and through different types of production assemblies, pipes, annuli, and the like. The resulting acoustic data can be used in the model development process as disclosed herein to determine one or more multivariate models indicative of the presence of sand in an inflowing fluid in one or more fluid phases and/or in a flowing fluid within the wellbore in one or more fluid phases. Such multivariate model may then be used with detected acoustic data to determine if sand is present in various fluids while allowing for discrimination between sand inflow and/or sand flow along the wellbore.

In some embodiments, the model at 600' can be developed using machine learning. In order to develop and validate the model, data having known fluid flows and acoustic signals can be used as the basis for training and/or developing the model parameters. This data set can be referred to as a labeled data set (e.g., a data set for which the flow regime and/or inflow location is already known) that can be used for training the models (e.g., the multivariate model) in some instances. In some embodiments, the known data can be data from a wellbore having flow measured by various means. In some embodiments, the data can be obtained using a test setup where known quantities of various fluids (e.g., gas, hydrocarbon liquids, aqueous liquids, etc.) can be introduced at controlled point to generate controlled fluid flow and/or inflows. At least a portion of the data can be used to develop the model, and optionally, a portion of the data can be used to test the model once it is developed.

Figure 7:
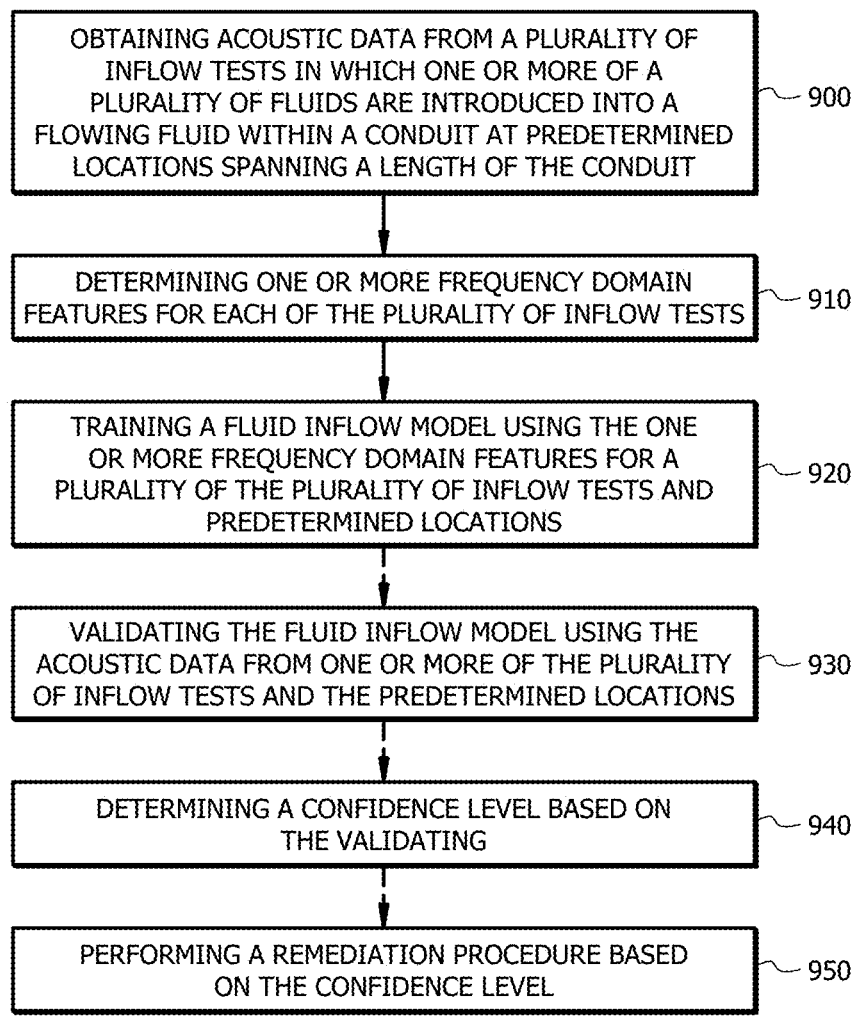
FIG. 7 is a flow diagram of a method of developing a fluid flow model according to embodiments of this disclosure.

FIG. 7 illustrates a flow diagram of a method II of developing a fluid identification or flow model according to some embodiments. The method can comprise, at 900, obtaining acoustic data or signals from a plurality of flow and/or inflow tests in which one or more fluids of a plurality of fluids are introduced into a a conduit at predetermined locations spanning a length of the conduit, wherein the plurality of fluids comprise a hydrocarbon gas, a hydrocarbon liquid, an aqueous fluid, or a combination thereof, and wherein the acoustic signal comprises acoustic samples across a portion of the conduit. The one or more fluids of a plurality of fluids can be introduced into a flowing fluid to determine the inflow signatures for fluid(s) entering flow fluids. In some embodiments, the one or more fluids can be introduced in a relatively stagnant fluid. This may help to model the lower or lowest producing portion of the well where no bulk fluid flow may be passing through the wellbore at the point at which the fluid enters the well. This may be tested to obtain the signature of fluid inflow into a fluid within the wellbore that may not be flowing.

The acoustic signal can be obtained by any means known to those of skill in the art. In some embodiments, the acoustic data can be from field data where the data is verified by other test instruments. In some embodiments, the acoustic signal is obtained from a sensor within or coupled to the conduit for each inflow test of the plurality of inflow tests. The sensor can be disposed along the length of the conduit, and the acoustic signal that is obtained can be indicative of an acoustic source along a length of the conduit. The sensor can comprise a fiber optic cable disposed within the conduit, or in some embodiments, coupled to the conduit (e.g., on an outside of the conduit). The conduit can be a continuous section of a tubular, and in some embodiments, the can be disposed in a loop. While described as being a loop in some circumstances, a single section of pipe or tubular can also be used with additional piping used to return a portion of the fluid to the entrance of the conduit.

The configuration of the tubular test arrangement can be selected based on an expected operating configuration. A generic test arrangement may comprise a single tubular having one or more injection points. The acoustic sensor can be disposed within the tubular or coupled to an exterior of the tubular. In some embodiments, other arrangement such as pipe-in-pipe arrangements designed to mimic a production tubular in a casing string can be used for the flow tests. The sensor can be disposed within the inner pipe, in an annulus between the inner pipe and outer pipe, or coupled to an exterior of the outer pipe. The disposition of the sensor and the manner in which it is coupled within the test arrangement can be the same or similar to how it is expected to be disposed within a wellbore. Any number of testing arrangements and sensor placements can be used, thereby allowing for test data corresponding to an expected completion configuration. Over time, a library of configurations and resulting test data can be developed to allow for future models to be developed based on known, labeled data used to train multivariate models.

In some embodiments, the conduit comprises a flow loop, and the flowing fluid comprises an aqueous fluid, a hydrocarbon fluid, a gas, or a combination thereof. The flowing fluid can comprise a liquid phase, a multi-phase mixed liquid, or a liquid-gas mixed phase. In some embodiments, the flowing fluid within the conduit can have a flow regime including, but not limited to, laminar flow, plugging flow, slugging flow, annular flow, turbulent flow, mist flow, bubble flow, or any combination thereof. Within these flow regimes, the flow and/or inflow can be time based. For example, a fluid inflow can be laminar over a first time interval followed by slugging flow over a second time period, followed by a return to laminar or turbulent flow over a third time period. Thus, the specific flow regimes can be interrelated and have periodic or non-periodic flow regime changes over time.

Figure 8A:
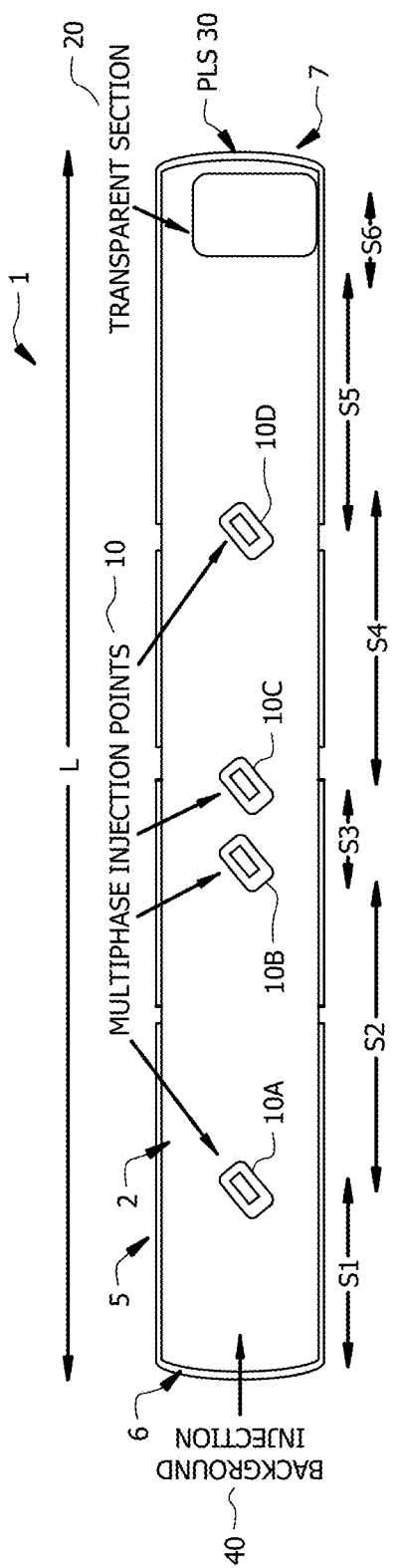
FIG. 8A is a schematic illustration of a flow loop assembly utilized to train an inflow model, according to embodiments of this disclosure.

An assembly 1 for performing inflow tests is provided in FIG. 8A. Assembly 1 comprises a conduit 5 into or onto which a sensor 2 (e.g., a fiber optic cable) is disposed. In some embodiments, the fiber optic cable 2 can be disposed within conduit 5. In some embodiments, the fiber optic cable 2 can be disposed along an outside of the conduit 5, for example, coupled to an exterior of the conduit. The fiber optic cable can be disposed along a length L of conduit 5. In some embodiments, other types of sensors can be used such as point source acoustic or vibration sensors. A line 40 may be configured for introducing background fluid into a first end 6 of conduit 5. One or a plurality of injection points 10 can be disposed along length L of conduit 5. An assembly for performing inflow tests can comprise any number of injection points. For example, an assembly for performing inflow tests according to this disclosure can comprise 1, 2, 3, 4, 5, 6, 7, 8, 9, 10, or more injection points 10. For example, in the embodiment of FIG. 8A, four injection points 10A, 10B, 10C, and 10D are disposed along length L of conduit 5. By way of example, a length L of conduit 5 may be in a range of from about 10 to about 100 meters, from about 20 to about 80 meters, or from about 30 to about 70 meters, for example, 30, 40, 45, 50, 55, 60, 65, or 70 meters.

The injection points may be positioned a spacing distance apart with regard to each other and/or first end 6 and second end 7 of conduit 5. The spacing distance can be selected based on a spatial resolution of the sensor system such that the injection points can be distinguished from each other in the resulting testing data. When point source sensors are used, the type of sensors can be considered in selecting the spacing distance. The spacing distance may also be selected, at least in part, to be sufficient to allow for a desired flow regime to develop between injection points. In some embodiments, first injection point 10A can be positioned a spacing distance S1 from first end 6 of conduit 5 and a second spacing S2 from second injection point 10B. Second injection point 10B can be positioned a spacing distance S3 from third injection point 10C. Third injection point 10C can be positioned a spacing distance S4 from a fourth injection point 10D. Fourth injection point 10D can be positioned a spacing distance S5 from a transparent section 20 of conduit 5. Transparent section 20 can be utilized to visually confirm the flow regime within conduit 5. The visual appearance information can be recorded as part of the test data set. A production logging system (PLS) may be positioned within a spacing distance S6 of second end 7 of conduit 5 and operable to compare data received via sensor or fiber optic cable 2. In some embodiments, without limitation, the spacing distances between injection points (e.g., spacing distances S2, S3, and S4) are in a range of from about 2 to about 20 m, from about 2 to about 15 m, or from about 10 to about 15 m apart. In some embodiments, the first and last injection points are at least 5, 6, 7, 8, 9, or 10 m from a closest end (e.g., from first end 6 or second end 7) of conduit 5. For example, spacing distances S1 and S5 can be at least 5, 6, 7, 8, 9, or 10 meters, in embodiments.

The conduit 5 can be disposed at any angle, including any angle between, and including, horizontal to vertical. The angle of the conduit, along with the fluid composition and flow rates can affect the flow regimes within the conduit. For example, a gas phase may collect along a top of a horizontally oriented conduit 5 as compared to a bubbling or slugging flow in a vertical conduit. Thus, the flow regime can change based on an orientation of the conduit even with the same fluid flow rates and compositions. The angle can be selected to represent those conditions that are being modeled to match those found in a wellbore, and the angle of the conduit can become part of the data obtained from the test set up.

Background fluid can be injected into line 40 in any of the flow regimes noted herein, for example, laminar flow, plugging flow, slugging flow, annular flow, turbulent flow, mist flow, and/or bubble flow, which may be visually confirmed through transparent section 20 of assembly 1. The background flowing fluid can comprise a liquid phase, a multiphase mixed liquid, and/or a liquid-gas mixed phase. The inflow tests can include various combinations of injected fluid and background flowing fluid. For example, a single phase (e.g., water, gas, or hydrocarbon liquid) can be injected into a background fluid comprising one or multiple phases (e.g., water, gas, and/or hydrocarbon liquid) flowing in a particular flow regime. Inflow tests can also be performed for injection of multiphase fluids (e.g., hydrocarbon liquid and gas, hydrocarbon liquid and water, hydrocarbon liquid, water, and gas) into a background fluid comprising one or multiple phases (e.g., water, gas, and/or hydrocarbon liquid) flowing in a particular flow regime.

In order to understand the variability in the measured signal for testing purposes, the flow for each type of flow can be incremented over time. For example, the flow and/or injection rate can be varied in steps over a time period. Each rate of flow or injection rate can be held constant over a time period sufficient to obtain a useable sample data set. The time period should be sufficient to identify variability in the signal at a fixed rate. For example, between about 1 minute and about 30 minutes of data can be obtained at each stepped flow rate before changing the flow rate to a different flow or injection rate.

Figure 8B:
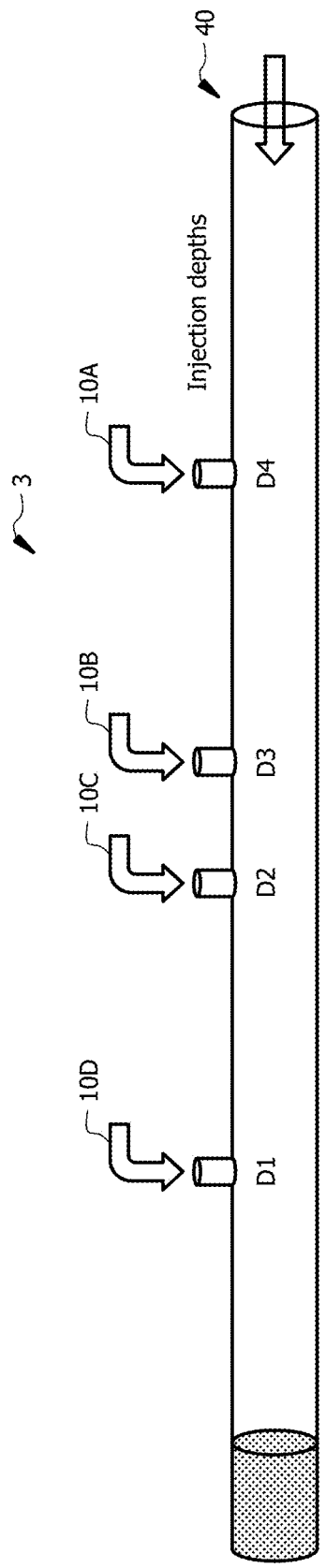
FIG. 8B is a schematic showing wellbore depths corresponding to injection points of FIG. 8A.

As depicted in the schematic of FIG. 8B, which is a schematic 3 showing wellbore depths corresponding to injection points of FIG. 8A, the inflow tests can be calibrated to a certain reservoir depth, for example, by adjusting the fiber optic signal for the test depth. For example, injection points 10A, 10B, 10C, and 10D can correspond to inflow depths D1, D2, D3, and D4, respectively. As an example, a length of fiber optic cable can be used that corresponds to typical wellbore depths (e.g., 3,000 m to 10,000 m, etc.). The resulting acoustic signals can then represent or be approximations of acoustic signals received under wellbore conditions. During the flow tests, acoustic data can be obtained under known flow conditions. The resulting acoustic data can then be used as training and/or test data for purposes of preparing the fluid flow model. For example, a first portion of the data can be used with machine learning techniques to train the fluid flow model, and a second portion of the data can be used to verify the results from the fluid flow model once it is developed.

Using the test data obtained from the flow apparatus, the method of developing the fluid flow model can include determining one or more frequency domain features from the acoustic signal for at least a portion of the data from the plurality of fluid inflow tests. The one or more frequency domain features can be obtained across the portion of the conduit including the predetermined locations at 910, and training the fluid flow model can use the one or more frequency domain features for a plurality of the tests and the predetermined locations at 920. The training of the fluid flow model can use machine learning, including any supervised or unsupervised learning approach. For example, the fluid flow model can be a neural network, a Bayesian network, a decision tree, a logistical regression model, a normalized logistical regression model, k-means clustering or the like.

In some embodiments, the fluid flow model can be developed and trained using a logistic regression model. As an example for training of a model used to determine the presence or absence of a hydrocarbon gas phase, the training of the fluid flow model at 920 can begin with providing the one or more frequency domain features to the logistic regression model corresponding to one or more inflow tests where the one or more fluids comprise a hydrocarbon gas. The one or more frequency domain features can be provided to the logistic regression model corresponding to one or more inflow tests where the one or more fluids do not comprise a hydrocarbon gas. A first multivariate model can be determined using the one or more frequency domain features as inputs. The first multivariate model can define a relationship between a presence and an absence of the hydrocarbon gas in the one or more fluids.

Similarly, the fluid flow model can include a logistic regression model for an aqueous fluid, and the fluid flow model can be trained at 920 by providing the one or more frequency domain features to the logistic regression model corresponding to one or more inflow tests where the one or more fluids comprise an aqueous fluid. The one or more frequency domain features can also be provided to the logistic regression model corresponding to one or more inflow tests where the one or more fluids do not comprise a aqueous fluid. A second multivariate model can then be determined using the one or more frequency domain features as inputs where the second multivariate model defines a relationship between a presence and an absence of the aqueous fluid in the one or more fluids.

The fluid flow model can also include a logistic regression model for hydrocarbon liquids. Training the fluid flow model at 920 can include providing the one or more frequency domain features to the logistic regression model corresponding to one or more inflow tests of the plurality of inflow tests where the one or more fluids comprise a hydrocarbon liquid. One or more frequency domain features can also be provided to the logistic regression model corresponding to one or more inflow tests where the one or more fluids do not comprise a hydrocarbon liquid. A third multivariate model can then be determined using the one or more frequency domain features as inputs, where the third multivariate model defines a relationship between a presence and an absence of the hydrocarbon liquid in the one or more fluids.

The one or more frequency domain features can comprise any frequency domain features noted hereinabove as well as combinations and transformations thereof. For example, In some embodiments, the one or more frequency domain features comprise a spectral centroid, a spectral spread, a spectral roll-off, a spectral skewness, an RMS band energy, a total RMS energy, a spectral flatness, a spectral slope, a spectral kurtosis, a spectral flux, a spectral autocorrelation function, combinations and/or transformations thereof, or any normalized variant thereof. In some embodiments, the one or more frequency domain features comprise a normalized variant of the spectral spread (NVSS) and/or a normalized variant of the spectral centroid (NVSC).

In the fluid flow model, the multivariate model equations can use the frequency domain features or combinations or transformations thereof to determine when a specific fluid or flow regime is present. The multivariate model can define a threshold, decision point, and/or decision boundary having any type of shapes such as a point, line, surface, or envelope between the presence and absence of the specific fluid or flow regime. In some embodiments, the multivariate model can be in the form of a polynomial, though other representations are also possible. When models such a neural networks are used, the thresholds can be based on node thresholds within the model. As noted herein, the multivariate model is not limited to two dimensions (e.g., two frequency domain features or two variables representing transformed values from two or more frequency domain features), and rather can have any number of variables or dimensions in defining the threshold between the presence or absence of the fluid or flow regime. When used, the detected values can be used in the multivariate model, and the calculated value can be compared to the model values. The presence of the fluid or flow regime can be indicated when the calculated value is on one side of the threshold and the absence of the fluid or flow regime can be indicated when the calculated value is on the other side of the threshold. Thus, each multivariate model can, in some embodiments, represent a specific determination between the presence of absence of a fluid or flow regime. Different multivariate models, and therefore thresholds, can be used for each fluid and/or flow regime, and each multivariate model can rely on different frequency domain features or combinations or transformations of frequency domain features. Since the multivariate models define thresholds for the determination and/or identification of specific fluids, the multivariate models and fluid flow model using such multivariate models can be considered to be event signatures for each type of fluid flow and/or inflow (including flow regimes, etc.).

Once the model is trained or developed, the fluid flow model can be verified or validated. In some embodiments, the plurality of the tests used for training the fluid flow model can be a subset of the plurality of flow tests, and the tests used to validate the models can be another subset of the plurality of flow tests. A method of developing a fluid flow model according to this disclosure can further include the validation of the trained fluid flow model using the acoustic signals from one or more tests and the predetermined locations of the one or more tests at 930.

The validation process can include providing the acoustic signals from one or more of the plurality of inflow tests and the predetermined locations of the one or more of the plurality of inflow tests to each of the first multivariate model, the second multivariate model, and the third multivariate model. A presence or absence of at least one of the gas in the one or more fluids, the aqueous fluid in the one or more fluids, or the hydrocarbon liquid in the one or more fluids based on an output of each of the first multivariate model, the second multivariate model, and the third multivariate model can then be determined. The fluid flow model at 930 can be validated by comparing the predicted presence or absence of the gas in the one or more fluids, the aqueous fluid in the one or more fluids, or the hydrocarbon liquid in the one or more fluids to the actual presence as known from the test data. Should the accuracy of the fluid flow model be sufficient (e.g., meeting a confidence threshold), then the fluid flow model can be used to detect and/or identify fluids within a wellbore. If the accuracy is not sufficient, then additional data and training or development can be carried out to either find new frequency domain feature relationships to define the multivariate models or improve the derived multivariate models to more accurately predict the presence and identification of the fluids. In this process, the development, validation, and accuracy checking can be iteratively carried out until a suitable fluid flow model is determined. Using the validation process, a confidence level can be determined based on the validating at 940; and a remediation procedure can be performed based on the confidence level at 950.

With reference to FIG. 1, a method of identifying fluid inflow according to this disclosure can further comprise determining relative amounts of gas phase inflow, aqueous phase inflow, and hydrocarbon liquid phase inflow at 700. Determining relative amounts of gas phase inflow, aqueous phase inflow, and hydrocarbon liquid phase inflow at 700 can comprise determining an amplitude of each of the determined at least one of the gas phase inflow, the aqueous phase inflow, or the hydrocarbon liquid phase inflow over a time period at the identified one or more fluid inflow locations; and determining a relative contribution of each of the gas phase inflow, the aqueous phase inflow, or the hydrocarbon liquid phase inflow based on the amplitude of each of the identified at least one of the gas phase inflow, the aqueous phase inflow, or the hydrocarbon liquid phase inflow over the time period. In some embodiments, the amplitude and/or spectral power of each portion of the acoustic signal can be compared to produced volumes of each fluid. The relative power originated from various inflow locations can be compared and assigned a proportion of the overall produced fluid flow based on the frequency domain features such as the amplitude or spectral power. The volumes of each fluid flowing in the wellbore tubulars can be confirmed using the fluid flow model, and the relative amounts determined at the fluid inflow locations can be used to determine the amounts present in the fluid flow in the wellbore tubulars at points downstream of the inflow locations. This can allow for an estimate of the volume of each fluid present at various points in the wellbore to be determined.

In an embodiment, a method of identifying fluid flow can comprise determining relative amounts of gas phase inflow, aqueous phase inflow, and hydrocarbon liquid phase inflow. Determining relative amounts of gas phase inflow, aqueous phase inflow, and hydrocarbon liquid phase inflow can comprise determining an amplitude of each of the determined at least one of the gas phase inflow, the aqueous phase inflow, or the hydrocarbon liquid phase inflow over a time period at the identified one or more fluid inflow locations; and determining a relative contribution of each of the gas phase inflow, the aqueous phase inflow, or the hydrocarbon liquid phase inflow based on the amplitude of each of the identified at least one of the gas phase inflow, the aqueous phase inflow, or the hydrocarbon liquid phase inflow over the time period. The method can comprise aggregating the determined amounts of each of gas phase inflow, aqueous phase inflow, and hydrocarbon liquid phase inflow along the length of the conduit (e.g., the production tubing), and determining fluid flow volumes, flow rates, and/or flow regimes within the conduit based on the determined amounts of each of gas phase inflow, aqueous phase inflow, and hydrocarbon liquid phase inflow.

A method of identifying fluid inflow according to this disclosure can further comprise determining and/or performing a remediation procedure at 800. The remediation procedure determined and/or performed can be based on the relative amounts of the gas phase inflow, the aqueous phase inflow, or the hydrocarbon liquid phase inflow at 700, the confidence level determined at 650, or a combination thereof.

A combination of the steps discussed herein can be utilized in a method of identifying fluid inflow according to this disclosure. For example, a method of determining fluid inflow can comprise obtaining an acoustic signal at 100, determining one or a plurality of frequency domain features from the acoustic signal at 300 and identifying one or more fluid inflow locations from the one or the plurality of frequency domain features at 500. Alternatively, a method of determining fluid inflow can comprise obtaining an acoustic signal at 100, determining a plurality of frequency domain features from the acoustic signal at 300, identifying one or more fluid inflow locations from one or more of the plurality of frequency domain features at 500, and identifying at least one of a gas phase inflow, an aqueous phase inflow, or a hydrocarbon liquid phase inflow at the identified one or more fluid inflow locations using at least two of the plurality of frequency domain features at 600. The identification method can use any of the fluid flow models described herein. Alternatively, a method of determining fluid inflow can comprise obtaining an acoustic signal at 100, determining a plurality of frequency domain features from the acoustic signal at 300, identifying one or more fluid inflow locations at 500 (via one or more of the one or the plurality of frequency domain features or in an alternative manner), and identifying at least one of a gas phase inflow, an aqueous phase inflow, or a hydrocarbon liquid phase inflow at the identified one or more fluid inflow locations using at least two of the plurality of frequency domain features at 600. This identification method can use any of the fluid flow models described herein.

With reference back to FIG. 6, when fluid inflow events have been identified as having occurred during the sample data measurement period, which can be in real time or near real time, various outputs can be generated to display or indicate the presence at 406 of the one or more fluid inflow events that are identified at 500 and/or 600.

Figure 9:
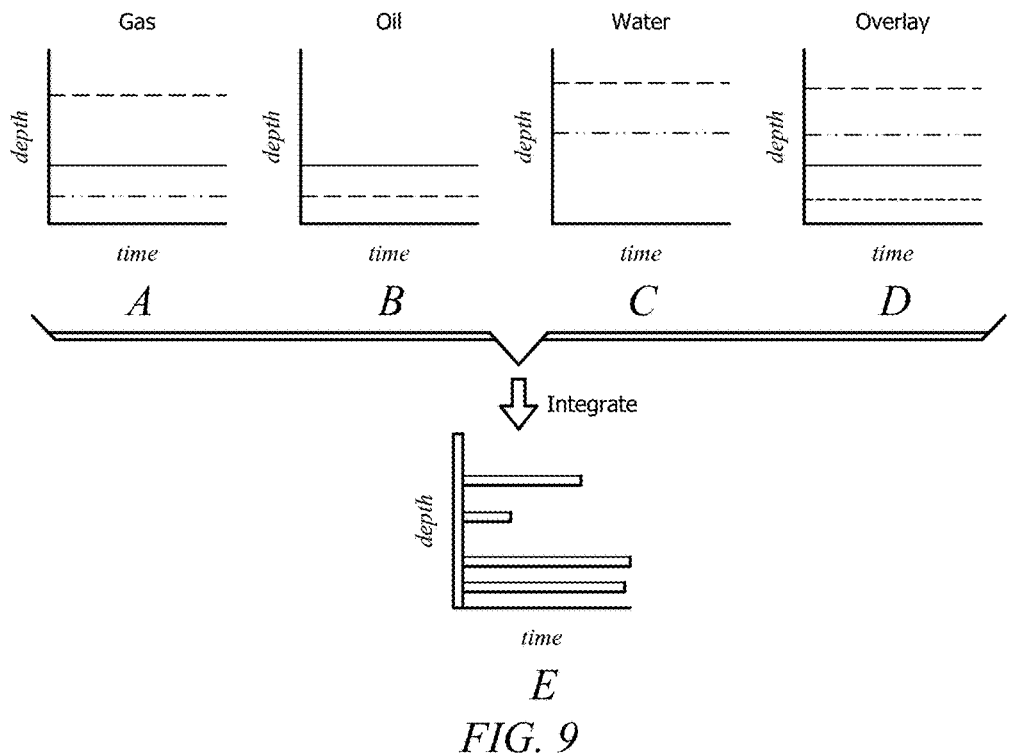
FIG. 9 is a generic representation of possible outputs produced according to embodiments of this disclosure.

In addition to detecting the presence of one or more events (e.g, fluid inflow, gas phase inflow, hydrocarbon liquid phase inflow, aqueous phase inflow) at a depth or location in the wellbore 114, the analysis software executing on the processor 168 can be used to visualize the fluid inflow locations or relative amounts over a computer network for visualization on a remote location. For example, as depicted in FIG. 9, an output can comprise one or more of a plot of the gas phase inflow as a function of depth in the well and time as depicted in panel A, a plot of the hydrocarbon liquid phase inflow as a function of depth in the well and time as depicted in panel B, a plot of the aqueous phase inflow as a function of depth in the well and time, as depicted in panel C. The plots can be overlaid to provide a single plot depicting the gas phase inflow, aqueous phase inflow, and hydrocarbon liquid phase inflow as a function of depth in the well and time, as depicted in panel D of FIG. 9. Alternatively or additionally, the data can be integrated to provide a cumulative display of the amounts of gas phase inflow, aqueous phase inflow, and hydrocarbon liquid phase inflow as a function of depth in the well and time, as depicted in panel E of FIG. 9.

The computation of a fluid inflow event log may be done repeatedly, such as every second, and later integrated/averaged for discrete time periods—for instance, at times of higher well drawdowns, to display a time-lapsed event log at various stages of the production process (e.g., from baseline shut-in, from during well ramp-up, from steady production, from high drawdown/production rates etc.). The time intervals may be long enough to provide suitable data, though longer times may result in larger data sets. In an embodiment, the time integration may occur over a time period between about 0.1 seconds to about 10 seconds, or between about 0.5 seconds and about a few minutes or even hours.

The resulting fluid inflow event log(s) computed every second can be stored in the memory 170 or transferred across a computer network, to populate a fluid inflow event database. The data can be used to generate an integrated fluid inflow event log at each fluid inflow event depth sample point along the length of the optical fiber 162 along with a synchronized timestamp that indicates the times of measurement. In producing a visualization fluid inflow event log, the values for depth sections that do not exhibit fluid inflow can be set to zero. This allows those depth points or zones exhibiting fluid inflow to be easily identified.

As an example, the analysis software executing on the processor 168 can be used to visualize fluid inflow locations or relative fluid inflow amounts over a computer network for visualization on a remote location. The computation of a 'fluid inflow log' may be done repeatedly, such as every second, and later integrated/averaged for discrete time periods—for instance, at times of higher well drawdowns, to display a time-lapsed fluid inflow log at various stages of the production process (e.g., from baseline shut-in, from during well ramp-up, from steady production, from high drawdown/production rates etc.). The time intervals may be long enough to provide suitable data, though longer times may result in larger data sets. In an embodiment, the time integration may occur over a time period between about 0.1 seconds to about 10 seconds, or between about 0.5 seconds and about a few minutes or even hours.

Fluid inflow logs computed every second can be stored in the memory 170 or transferred across a computer network, to populate an event database. The data stored/transferred in the memory 170 for one or more of the data set depths may be stored every second. This data can be used to generate an integrated fluid inflow log at each event depth sample point along the length of the optical fiber 162 along with a synchronized timestamp that indicates the times of measurement.

The data output by the system may generally indicate one or more fluid inflow locations or depths, a composition (e.g., oil, gas, water) of the inflowing fluid at the indicated fluid inflow locations, and optionally, a relative amount of fluid inflow component(s) among the identified locations or depths and/or a qualitative indicator of fluid inflow component(s) entering the wellbore at a location. The data output can also indicate fluid flow locations within the wellbore tubulars and fluid compositions at those locations.

If water or gas inflow is observed in the produced fluid (as determined by methods such as surface detectors, visual observation, etc.), but the location and/or amount of the water or gas inflow cannot be identified with sufficient clarity using the methods described herein, various actions can be taken in order to obtain a better visualization of the acoustic data. In an embodiment, the production rate can be temporarily increased. The resulting data analysis can be performed on the data during the increased production period. In general, an increased fluid flow rate into the wellbore may be expected to increase the acoustic signal intensity at the fluid inflow locations. This may allow a signal to noise ratio to be improved in order to more clearly identify fluid flow and/or inflow at one or more locations by, for example, providing for an increased signal strength. The water, gas, and/or hydrocarbon liquid flow and/or inflow energies can also be more clearly calculated based on the increased signal outputs. Once the zones of interest are identified, the production levels can be adjusted based on the water or gas inflow locations and amounts. Any changes in water and/or gas production amounts over time can be monitored using the techniques described herein and the operating conditions can be adjusted accordingly (e.g., dynamically adjusted, automatically adjusted, manually adjusted, etc.).

In some embodiments, the change in the production rate can be used to determine a production rate correlation with the fluid inflow locations and flow rates at one or more points along the wellbore. In general, decreasing the production rate may be expected to reduce the fluid inflow rates and fluid flow rates. By determining production rate correlations with the fluid inflow rates, the production rate from the well and/or one or more zones can be adjusted to reduce the fluid inflow rate at the identified locations. For example, an adjustable production sleeve or choke can be altered to adjust specific fluid inflow rates in one or more production zones. If none of the production zones are adjustable, various workover procedures can be used to alter the production from specific zones. For example, various intake sleeves can be blocked off, zonal isolation devices can be used to block off production from certain zones, and/or some other operations can be carried out to reduce the amount of undesired fluid inflow (e.g., consolidation procedures, etc.).

The same analysis procedure can be used with any of the fluid flow and/or inflow event signatures described herein. For example, the presence of one or more fluid inflow events (e.g., fluid inflow, gas inflow, water inflow, hydrocarbon liquid inflow) can be determined. In some embodiments, the location and or discrimination between events may not be clear. One or more characteristics of the wellbore can then be changed to allow a second measurement of the acoustic signal to occur. For example, the production rate can be changed, the pressures can be changed, one or more zones can be shut-in, or any other suitable production change. For example, the production rate can be temporarily increased. The resulting data analysis can be performed on the data during the increased production period. In general, an increased fluid flow rate into the wellbore may be expected to increase the acoustic signal intensity at certain event locations such as a gas inflow location, a water inflow location, a hydrocarbon liquid inflow location, or the like. This may allow a signal to noise ratio to be improved in order to more clearly identify one event relative to another at one or more locations by, for example, providing for an increased signal strength to allow the event signatures to be compared to the resulting acoustic signal. The event energies can also be more clearly calculated based on the increased signal outputs. Once the zones of interest are identified, the production levels can be adjusted based on the event locations and amounts. Any changes in the presence of the fluid inflow events over time can be monitored using the techniques described herein and the operating conditions can be adjusted accordingly (e.g., dynamically adjusted, automatically adjusted, manually adjusted, etc.). While the data analysis has been described above with respect to the system 101, methods of identifying events within the wellbore (e.g., fluid inflow locations along the length of a wellbore, phase discrimination (e.g., gas, water, hydrocarbon liquid) of inflowing fluid, relative amounts of inflowing fluid components, etc.) can also be carried out using any suitable system. For example, the system of FIG. 2 can be used to carry out the acoustic data acquisition, a separate system at a different time and/or location can be used with acoustic data to perform the fluid inflow event identification method, and/or the method can be performed using acoustic data obtained from a different type of acoustic sensor where the data is obtained in an electronic form useable with a device capable of performing the method.

The acoustic signal can include data for all of the wellbore or only a portion of the wellbore. An acoustic sample data set can be obtained from the acoustic signal. In an embodiment, the sample data set may represent a portion of the acoustic signal for a defined depth range or point. In some embodiments, the acoustic signal can be obtained in the time domain. For example, the acoustic signal may be in the form of an acoustic amplitude relative to a collection time. The sample data set may also be in the time domain and be converted into the frequency domain using a suitable transform such as a Fourier transform. In some embodiments, the sample data set can be obtained in the frequency domain such that the acoustic signal can be converted prior to obtaining the sample data set. While the sample data set can be obtained using any of the methods described herein, the sample data set can also be obtained by receiving it from another device. For example, a separate extraction or processing step can be used to prepare one or more sample data sets and transmit them for separate processing using any of the processing methods or systems disclosed herein.

Figure 10:
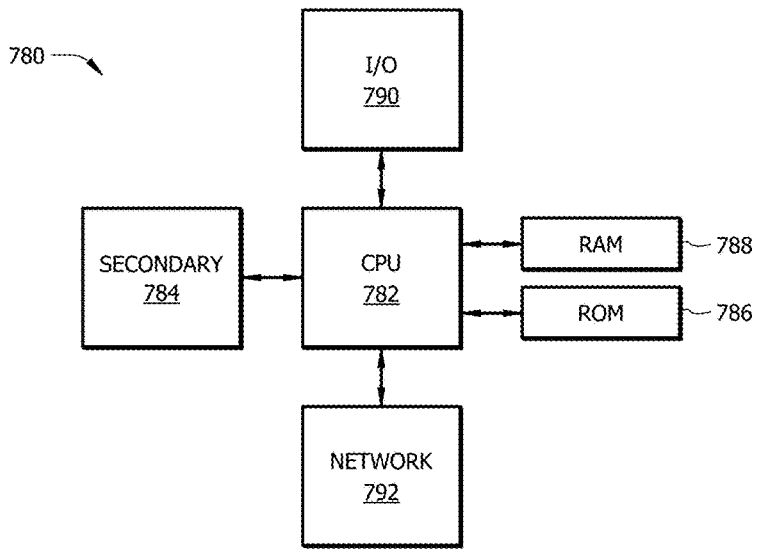
FIG. 10 schematically illustrates a computer that can be used to carry out various steps according to an embodiment of this disclosure.

Any of the systems and methods disclosed herein can be carried out on a computer or other device comprising a processor, such as the acquisition device 160 of FIG. 2. FIG. 10 illustrates a computer system 780 suitable for implementing one or more embodiments disclosed herein such as the acquisition device or any portion thereof. The computer system 780 includes a processor 782 (which may be referred to as a central processor unit or CPU) that is in communication with memory devices including secondary storage 784, read only memory (ROM) 786, random access memory (RAM) 788, input/output (I/O) devices 790, and network connectivity devices 792. The processor 782 may be implemented as one or more CPU chips.

It is understood that by programming and/or loading executable instructions onto the computer system 780, at least one of the CPU 782, the RAM 788, and the ROM 786 are changed, transforming the computer system 780 in part into a particular machine or apparatus having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

Additionally, after the system 780 is turned on or booted, the CPU 782 may execute a computer program or application. For example, the CPU 782 may execute software or firmware stored in the ROM 786 or stored in the RAM 788. In some cases, on boot and/or when the application is initiated, the CPU 782 may copy the application or portions of the application from the secondary storage 784 to the RAM 788 or to memory space within the CPU 782 itself, and the CPU 782 may then execute instructions of which the application is comprised. In some cases, the CPU 782 may copy the application or portions of the application from memory accessed via the network connectivity devices 792 or via the I/O devices 790 to the RAM 788 or to memory space within the CPU 782, and the CPU 782 may then execute instructions of which the application is comprised. During execution, an application may load instructions into the CPU 782, for example load some of the instructions of the application into a cache of the CPU 782. In some contexts, an application that is executed may be said to configure the CPU 782 to do something, e.g., to configure the CPU 782 to perform the function or functions promoted by the subject application. When the CPU 782 is configured in this way by the application, the CPU 782 becomes a specific purpose computer or a specific purpose machine.

The secondary storage 784 is typically comprised of one or more disk drives or tape drives and is used for non-volatile storage of data and as an over-flow data storage device if RAM 788 is not large enough to hold all working data. Secondary storage 784 may be used to store programs which are loaded into RAM 788 when such programs are selected for execution. The ROM 786 is used to store instructions and perhaps data which are read during program execution. ROM 786 is a non-volatile memory device which typically has a small memory capacity relative to the larger memory capacity of secondary storage 784. The RAM 788 is used to store volatile data and perhaps to store instructions. Access to both ROM 786 and RAM 788 is typically faster than to secondary storage 784. The secondary storage 784, the RAM 788, and/or the ROM 786 may be referred to in some contexts as computer readable storage media and/or non-transitory computer readable media.

I/O devices 790 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 792 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards that promote radio communications using protocols such as code division multiple access (CDMA), global system for mobile communications (GSM), long-term evolution (LTE), worldwide interoperability for microwave access (WiMAX), near field communications (NFC), radio frequency identity (RFID), and/or other air interface protocol radio transceiver cards, and other well-known network devices. These network connectivity devices 792 may enable the processor 782 to communicate with the Internet or one or more intranets. With such a network connection, it is contemplated that the processor 782 might receive information from the network, or might output information to the network (e.g., to an event database) in the course of performing the above-described method steps. Such information, which is often represented as a sequence of instructions to be executed using processor 782, may be received from and outputted to the network, for example, in the form of a computer data signal embodied in a carrier wave.

Such information, which may include data or instructions to be executed using processor 782 for example, may be received from and outputted to the network, for example, in the form of a computer data baseband signal or signal embodied in a carrier wave. The baseband signal or signal embodied in the carrier wave, or other types of signals currently used or hereafter developed, may be generated according to several methods well-known to one skilled in the art. The baseband signal and/or signal embedded in the carrier wave may be referred to in some contexts as a transitory signal.

The processor 782 executes instructions, codes, computer programs, scripts which it accesses from hard disk, floppy disk, optical disk (these various disk based systems may all be considered secondary storage 784), flash drive, ROM 786, RAM 788, or the network connectivity devices 792. While only one processor 782 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 784, for example, hard drives, floppy disks, optical disks, and/or other device, the ROM 786, and/or the RAM 788 may be referred to in some contexts as non-transitory instructions and/or non-transitory information.

In an embodiment, the computer system 780 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 780 to provide the functionality of a number of servers that is not directly bound to the number of computers in the computer system 780. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer readable storage medium having computer usable program code embodied therein to implement the functionality disclosed above. The computer program product may comprise data structures, executable instructions, and other computer usable program code. The computer program product may be embodied in removable computer storage media and/or non-removable computer storage media. The removable computer readable storage medium may comprise, without limitation, a paper tape, a magnetic tape, magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system 780, at least portions of the contents of the computer program product to the secondary storage 784, to the ROM 786, to the RAM 788, and/or to other non-volatile memory and volatile memory of the computer system 780. The processor 782 may process the executable instructions and/or data structures in part by directly accessing the computer program product, for example by reading from a CD-ROM disk inserted into a disk drive peripheral of the computer system 780. Alternatively, the processor 782 may process the executable instructions and/or data structures by remotely accessing the computer program product, for example by downloading the executable instructions and/or data structures from a remote server through the network connectivity devices 792. The computer program product may comprise instructions that promote the loading and/or copying of data, data structures, files, and/or executable instructions to the secondary storage 784, to the ROM 786, to the RAM 788, and/or to other non-volatile memory and volatile memory of the computer system 780.

In some contexts, the secondary storage 784, the ROM 786, and the RAM 788 may be referred to as a non-transitory computer readable medium or a computer readable storage media. A dynamic RAM embodiment of the RAM 788, likewise, may be referred to as a non-transitory computer readable medium in that while the dynamic RAM receives electrical power and is operated in accordance with its design, for example during a period of time during which the computer system 780 is turned on and operational, the dynamic RAM stores information that is written to it. Similarly, the processor 782 may comprise an internal RAM, an internal ROM, a cache memory, and/or other internal non-transitory storage blocks, sections, or components that may be referred to in some contexts as non-transitory computer readable media or computer readable storage media.

Having described various systems and methods herein, specific embodiments can include, but are not limited to:

In a first embodiment, a method of identifying inflow locations along a wellbore comprises: obtaining an acoustic signal from a sensor within the wellbore, wherein the acoustic signal comprises acoustic samples across a portion of a depth of the wellbore; determining a plurality of frequency domain features from the acoustic signal, wherein the plurality of frequency domain features are obtained across a plurality of depth intervals within the portion of the depth of the wellbore, and wherein the plurality of frequency domain features comprise at least two different frequency domain features; and identifying at least one of a gas phase inflow, an aqueous phase inflow, or a hydrocarbon liquid phase inflow using the plurality of the frequency domain features at one or more fluid inflow locations.

A second embodiment can include the method of the first embodiment, further comprising: identifying the one or more fluid inflow locations within the plurality of depth intervals using one or more frequency domain features of the plurality of frequency domain features.

A third embodiment can include the method of any one of the first or the second embodiment, wherein the one or more frequency domain features comprise a spectral flatness.

A fourth embodiment can include the method of any one of the first through the third embodiments, wherein the sensor comprises a fiber optic cable disposed within the wellbore.

A fifth embodiment can include the method of any one of the first through the fourth embodiments, wherein the plurality of frequency domain features comprises at least two of: a spectral centroid, a spectral spread, a spectral roll-off, a spectral skewness, an RMS band energy, a total RMS energy, a spectral flatness, a spectral slope, a spectral kurtosis, a spectral flux, a spectral autocorrelation function, or a normalized variant thereof.

A sixth embodiment can include the method of any one of the first through the fifth embodiments, further comprising: denoising the acoustic signal prior to determining the plurality of frequency domain features.

A seventh embodiment can include the method of the sixth embodiment, wherein denoising the acoustic signal comprises median filtering the acoustic data.

An eighth embodiment can include the method of any of the first through the seventh embodiments, further comprising: calibrating the acoustic signal.

A ninth embodiment can include the method of any one of the first through the eighth embodiments, further comprising: normalizing the one or more frequency domain features prior to identifying the one or more inflow locations using the one or more frequency domain features.

A tenth embodiment can include the method of any one of the first through the ninth embodiments, wherein identifying the one or more fluid inflow locations comprises: identifying a background fluid flow signature using the acoustic signal; and removing the background fluid flow signature from the acoustic signal prior to identifying the one or more fluid inflow locations.

An eleventh embodiment can include the method of any one of the first through the ninth embodiments, wherein identifying the one or more fluid inflow locations comprises: identifying one or more anomalies in the acoustic signal using the one or more frequency domain features of the plurality of frequency domain features; and selecting the depth intervals of the one or more anomalies as the one or more inflow locations.

A twelfth embodiment can include any one of the first through the eleventh embodiments, wherein identifying at least one of the gas phase inflow, the aqueous phase inflow, or the hydrocarbon liquid phase inflow comprises: providing the plurality of frequency domain features to a logistic regression model for each of the gas phase inflow, the aqueous phase inflow, and the hydrocarbon liquid phase inflow; and determining that at least one of the gas phase inflow, the aqueous phase inflow, or the hydrocarbon liquid phase inflow is present based on the logistic regression model.

A thirteenth embodiment can include the method of the twelfth embodiment, wherein the logistic regression model uses a first multivariate model having the plurality of frequency domain features as inputs to determine when the gas phase inflow is present, wherein the logistic regression model uses a second multivariate model having the plurality of frequency domain features as inputs to determine when the aqueous phase inflow is present, and wherein the logistic regression model uses a third multivariate model having the plurality of frequency domain features as inputs to determine when the hydrocarbon liquid phase inflow is present.

A fourteenth embodiment can include the method of any one of the first through the thirteenth embodiments, further comprising: determining an amplitude of each of the identified at least one of the gas phase inflow, the aqueous phase inflow, or the hydrocarbon liquid phase inflow over a time period; and determining a relative contribution of each of the gas phase inflow, the aqueous phase inflow, or the hydrocarbon liquid phase inflow based on the amplitude of each of the identified at least one of the gas phase inflow, the aqueous phase inflow, or the hydrocarbon liquid phase inflow over the time period.

A fifteenth embodiment can include the method of the fourteenth embodiment, further comprising: determining a remediation procedure based on the relative contribution of each of the gas phase inflow, the aqueous phase inflow, or the hydrocarbon liquid phase inflow; and performing the remediation procedure.

A sixteenth embodiment can include the method of any one of the twelfth through the fifteenth embodiments, wherein the plurality of frequency domain features comprise a normalized variant of the spectral spread and a normalized variant of the spectral centroid, and wherein the logistic regression model defines a relationship between a presence or absence of the gas phase inflow, the aqueous phase inflow, or the hydrocarbon liquid phase inflow.

A seventeenth embodiment can include the method of any one of the first through the sixteenth embodiments, further comprising: determining a confidence level for the identification of the at least one of the gas phase inflow, the aqueous phase inflow, or the hydrocarbon liquid phase inflow; and performing a remediation procedure based on the confidence level.

An eighteenth embodiment can include the method of any one of the first through the seventeenth embodiments, wherein obtaining the acoustic signal from the sensor within the wellbore occurs from between 30 minutes and 4 hours.

A nineteenth embodiment can include the method of any one of the first through the eighteenth embodiments, wherein the sensor comprises a fiber optic cable disposed within a production tubing within the wellbore.

A twentieth embodiment can include the method of any one of the first through the nineteenth embodiments, wherein identifying the at least one of the gas phase inflow, the aqueous phase inflow, or the hydrocarbon liquid phase inflow using the plurality of the frequency domain features comprises: identifying the at least one of the gas phase inflow, the aqueous phase inflow, or the hydrocarbon liquid phase inflow using a derivative of at least one of the plurality of the frequency domain features.

A twenty-first embodiment can include the method of any one of the first through the twentieth embodiments, wherein identifying the at least one of the gas phase inflow, the aqueous phase inflow, or the hydrocarbon liquid phase inflow using the plurality of the frequency domain features comprises: identifying the at least one of the gas phase inflow, the aqueous phase inflow, or the hydrocarbon liquid phase inflow using a ratio between at least two of the plurality of the frequency domain features.

In a twenty-second embodiment, a method of developing an inflow location model for a wellbore can comprise: performing a plurality of inflow tests, wherein each inflow test comprises introducing one or more fluids of a plurality of fluids into a flowing fluid within a conduit at predetermined locations, and wherein the plurality of fluids comprise a hydrocarbon gas, a hydrocarbon liquid, an aqueous fluid, or a combination thereof; obtaining an acoustic signal from a sensor within the conduit for each inflow test of the plurality of inflow tests, wherein the acoustic signal comprises acoustic samples across a portion of the conduit including the predetermined locations; determining one or more frequency domain features from the acoustic signal for each of the plurality of inflow tests, wherein the one or more frequency domain features are obtained across the portion of the conduit including the predetermined locations; and training a fluid flow model using the one or more frequency domain features for a plurality of the tests and the predetermined locations.

A twenty-third embodiment can include the method of the twenty-second embodiment, further comprising: validating the fluid flow model using the acoustic signals from one or more of the tests and the predetermined locations of the plurality of tests.

A twenty-fourth embodiment can include the method of the twenty-second or the twenty-third embodiment, wherein the conduit comprises a flow loop, and wherein the flowing fluid comprises an aqueous fluid, a hydrocarbon fluid, a gas, or a combination thereof.

A twenty-fifth embodiment can include the method of any one of the twenty-second through the twenty-fourth embodiments, wherein the flowing fluid comprises a liquid phase, a multi-phase mixed liquid, or a liquid-gas mixed phase.

A twenty-sixth embodiment can include the method of any one of the twenty-second through the twenty-fifth embodiments, wherein the plurality of the tests used for training the fluid flow model is a subset of the plurality of inflow tests.

A twenty-seventh embodiment can include the method of any one of the twenty-second through the twenty-sixth embodiments, wherein the fluid flow model comprises a logistic regression model, and wherein training the fluid flow model comprises: providing the one or more frequency domain features to the logistic regression model corresponding to one or more inflow tests of the plurality of inflow tests where the one or more fluids comprise a hydrocarbon gas; providing the one or more frequency domain features to the logistic regression model corresponding to one or more inflow tests of the plurality of inflow tests where the one or more fluids do not comprise a hydrocarbon gas; and determining a first multivariate model using the one or more frequency domain features as inputs, wherein the first multivariate model defines a relationship between a presence and an absence of the hydrocarbon gas in the one or more fluids.

A twenty-eighth embodiment ca include the method of any one of the twenty-second through the twenty-seventh embodiments, wherein the fluid flow model comprises a logistic regression model, and wherein training the fluid flow model comprises: providing the one or more frequency domain features to the logistic regression model corresponding to one or more inflow tests of the plurality of inflow tests where the one or more fluids comprise an aqueous fluid; providing the one or more frequency domain features to the logistic regression model corresponding to one or more inflow tests of the plurality of inflow tests where the one or more fluids do not comprise a aqueous fluid; and determining a second multivariate model using the one or more frequency domain features as inputs, wherein the second multivariate model defines a relationship between a presence and an absence of the aqueous fluid in the one or more fluids.

A twenty-ninth embodiment can include the method of any one of the twenty-second through the twenty-eighth embodiments, wherein the fluid flow model comprises a logistic regression model, and wherein training the fluid flow model comprises: providing the one or more frequency domain features to the logistic regression model corresponding to one or more inflow tests of the plurality of inflow tests where the one or more fluids comprise a hydrocarbon liquid;

providing the one or more frequency domain features to the logistic regression model corresponding to one or more inflow tests of the plurality of inflow tests where the one or more fluids do not comprise a hydrocarbon liquid; and determining a third multivariate model using the one or more frequency domain features as inputs, wherein the third multivariate model defines a relationship between a presence and an absence of the hydrocarbon liquid in the one or more fluids.

A thirtieth embodiment can include the method of any one of the twenty-second through the twenty-ninth embodiments, wherein the one or more frequency domain features comprise a normalized variant of the spectral spread (NVSS) and a normalized variant of the spectral centroid (NVSC).

A thirty-first embodiment can include the method of any one of the twenty-ninth or the thirtieth embodiments, further comprising: providing the acoustic signals from one or more of the plurality of inflow tests and the predetermined locations of the plurality of tests to each of the first multivariate model, the second multivariate model, and the third multivariate model; determining a presence of at least one of the gas in the one or more fluids, the aqueous fluid in the one or more fluids, or the hydrocarbon liquid in the one or more fluids based on an output of each of the first multivariate model, the second multivariate model, and the third multivariate model; and validating the fluid flow model using at least a portion of the plurality of inflow tests, the predetermined locations of the plurality of tests, and the presence of at least one of the gas in the one or more fluids, an aqueous fluid in the one or more fluids, or the hydrocarbon liquid in the one or more fluids as determined from the first multivariate model, the second multivariate model, and the third multivariate model.

A thirty-second embodiment can include the method of the thirty-first embodiment, further comprising: determining a confidence level based on the validating; and performing a remediation procedure based on the confidence level.

A thirty-third embodiment can include the method of any one of the twenty-second through the twenty-sixth embodiments, wherein the fluid flow model is a neural network, a Bayesian network, a decision tree, a supervised learning algorithm, a logistical regression model, or a normalized logistical regression model.

A thirty-fourth embodiment can include the method of any one of the twenty-second through the thirty-third embodiments, wherein the conduit is disposed in a loop.

A thirty-fifth embodiment can include the method of any one of the twenty-second through the thirty-fourth embodiments, wherein the sensor comprises a fiber optic cable disposed within the conduit.

A thirty-sixth embodiment can include the method of any one of the twenty-second through the thirty-fifth embodiments, wherein the flowing fluid within the conduit has a flow regime selected from the group consisting of: laminar flow, plugging flow, slugging flow, annular flow, turbulent flow, mist flow, and bubble flow.

A thirty-seventh embodiment can include the method of any one of the twenty-second through the thirty-sixth embodiments, wherein the sensor is disposed along the length of the conduit, and wherein the acoustic signal is indicative of an acoustic source along a length of the conduit.

In a thirty-eighth embodiment, a method a method of characterizing fluid inflow into a wellbore comprises: obtaining an acoustic signal from a sensor within the wellbore, wherein the acoustic signal comprises acoustic samples across a portion of a depth of the wellbore; determining a plurality of frequency domain features from the acoustic signal, wherein the plurality of frequency domain features are obtained across a plurality of depth intervals within the portion of the depth of the wellbore, and wherein the plurality of frequency domain features comprise at least two different frequency domain features; identifying one or more fluid inflow locations within the plurality of depth intervals using one or more frequency domain features of the plurality of frequency domain features; providing the plurality of frequency domain features at the identified one or more fluid inflow locations to a fluid flow model; and determining at least one of a gas phase inflow, an aqueous phase inflow, or a hydrocarbon liquid phase inflow at the identified one or more fluid inflow locations using the fluid flow model.

A thirty-ninth embodiment can include the method of the thirty-eighth embodiment, further comprising: determining an amplitude of each of the determined at least one of the gas phase inflow, the aqueous phase inflow, or the hydrocarbon liquid phase inflow over a time period at the identified one or more fluid inflow locations; and determining a relative contribution of each of the gas phase inflow, the aqueous phase inflow, or the hydrocarbon liquid phase inflow based on the amplitude of each of the identified at least one of the gas phase inflow, the aqueous phase inflow, or the hydrocarbon liquid phase inflow over the time period.

A fortieth embodiment can include the method of the thirty-eighth or the thirty-ninth embodiments, wherein the fluid flow model comprises a logistic regression model, and wherein determining at least one of the gas phase inflow, the aqueous phase inflow, or the hydrocarbon liquid phase using the fluid flow model comprises: providing the plurality of frequency domain features to the logistic regression model for each of the gas phase inflow, the aqueous phase inflow, and the hydrocarbon liquid phase inflow; and determining that at least one of the gas phase inflow, the aqueous phase inflow, or the hydrocarbon liquid phase inflow is present based on the logistic regression model.

A forty-first embodiment can include the method of the fortieth embodiment, wherein the logistic regression model uses a first multivariate model having the plurality of frequency domain features as inputs to determine when the gas phase inflow is present, wherein the logistic regression model uses a second multivariate model having the plurality of frequency domain features as inputs to determine when the aqueous phase inflow is present, and wherein the logistic regression model uses a third multivariate model having the plurality of frequency domain features as inputs to determine when the hydrocarbon liquid phase inflow is present.

A forty-second embodiment can include the method of the forty-first embodiment, wherein determining at least one of the gas phase inflow, the aqueous phase inflow, or the hydrocarbon liquid phase using the fluid flow model comprises: using the plurality of frequency domain features at the identified one or more fluid inflow locations in the first multivariate model; using the plurality of frequency domain features at the identified one or more fluid inflow locations in the second multivariate model; using the plurality of frequency domain features at the identified one or more fluid inflow locations in the third multivariate model; comparing the plurality of frequency domain features to an output of the first multivariate model, an output of the second multivariate model, and an output of the third multivariate model; and identifying at least one of the gas phase inflow, the aqueous phase inflow, or the hydrocarbon liquid phase inflow based on the comparison of the plurality of frequency domain features to the output of the first multivariate model, the output of the second multivariate model, and the output of the third multivariate model.

A forty-third embodiment can include the method of any one of the thirty-eighth through the forty-second embodiments, wherein the one or more frequency domain features comprise a normalized frequency domain feature.

A forty-fourth embodiment can include the method of any one of the thirty-eighth through the forty-third embodiments, wherein identifying the one or more fluid inflow locations within the plurality of depth intervals using the one or more frequency domain features comprises: identifying the one or more fluid inflow locations within the plurality of depth intervals using a ratio of two or more frequency domain features.

A forty-fifth embodiment can include the method of any one of the thirty-eighth through the forty-fourth embodiments, further comprising: calibrating the acoustic signal from the sensor prior to determining the plurality of frequency domain features.

A forty-sixth embodiment can include the method of the forty-fifth embodiment, wherein calibrating the acoustic signal comprises: removing a background signal from the acoustic signal.

A forty-seventh embodiment can include the method of the forty-fifth embodiment, wherein calibrating the acoustic signal comprises: identifying one or more anomalies within the acoustic signal; and removing one or more portions of the acoustic signal outside of the one or more anomalies.

A forty-eighth embodiment can include a method of identifying inflow locations along a wellbore, the method comprising: obtaining an acoustic signal from a sensor within the wellbore, wherein the acoustic signal comprises acoustic samples across a portion of a depth of the wellbore; determining one or more frequency domain features from the acoustic signal, wherein the one or more frequency domain features are obtained across a plurality of depth intervals within the portion of the depth of the wellbore; and identifying one or more fluid inflow locations within the plurality of depth intervals using the one or more frequency domain features.

A forty-ninth embodiment can include the method of the forty-eighth embodiment, further comprising identifying at least one of a gas phase inflow, an aqueous phase inflow, or a hydrocarbon liquid phase inflow at least two of the one or more frequency domain features at one or more of the one or more identified fluid inflow locations.

A fiftieth embodiment can include the method of the forty-ninth embodiment, wherein the at least two frequency domain features are selected from a spectral centroid, a spectral spread, a spectral roll-off, a spectral skewness, an RMS band energy, a total RMS energy, a spectral flatness, a spectral slope, a spectral kurtosis, a spectral flux, a spectral autocorrelation function, or a normalized variant thereof.

A fifty-first embodiment can include the method of any of the forty-eighth through the fiftieth embodiments, wherein identifying the one or more fluid inflow locations within the plurality of depth intervals using a single one of the one or more frequency domain features.

A fifty-second embodiment can include the method of the fifty-first embodiment, wherein the single one of the one or more frequency domain features comprises the RMS band energy or a spectral flatness.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as comprises, includes, and having should be understood to provide support for narrower terms such as consisting of, consisting essentially of, and comprised substantially of. Use of the term "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

I claim:

1. A method of identifying inflow locations along a wellbore, the method comprising:
   obtaining an acoustic signal from a sensor within the wellbore, wherein the acoustic signal comprises a plurality of acoustic samples across a plurality of depth intervals along the wellbore;
   determining a plurality of frequency domain features from the acoustic signal, wherein the plurality of frequency domain features are obtained for each acoustic sample of the plurality of acoustic samples across the plurality of depth intervals, and wherein the plurality of frequency domain features are determined from a frequency domain representation of the acoustic signal in the time domain;
   inputting, for each depth interval of the plurality of depth intervals, one or more frequency domain features of the plurality of frequency domain features into each fluid flow model of a plurality of fluid flow models, wherein each fluid flow model is a machine learning model, wherein each of the fluid flow models of the plurality of fluid flow models identifies as an output one of: a presence of at least one of a gas phase inflow, an aqueous phase inflow, and a hydrocarbon liquid phase inflow at one or more depth intervals of the plurality of depth intervals along the wellbore, wherein at least two of the plurality of fluid flow models are different
   determining, for each of the depth intervals of the plurality of depth intervals, the output from each fluid flow model; and
   identifying, based on the output of each fluid flow model, the presence of at least one of the gas phase inflow, the aqueous phase inflow, or the hydrocarbon liquid phase inflow at one or more of the depth intervals along the wellbore,
   identifying, using the plurality of fluid flow models, a presence of at least one of a gas phase flow, an aqueous phase flow, or a hydrocarbon liquid flow;
   identifying a fluid flow regime based on the identifying of the at least one of the gas phase inflow, the aqueous phase inflow, the hydrocarbon liquid phase inflow, the gas phase flow, the aqueous phase flow, or the hydrocarbon liquid flow using the plurality of the frequency domain features at the inflow locations.

2. The method of claim 1, wherein the plurality of frequency domain features comprises at least two different frequency domain features.

3. The method of claim 1, wherein the one or more depth intervals comprise one or more fluid inflow locations, wherein the method further comprises: identifying the one or more fluid inflow locations within the plurality of depth intervals using the one or more frequency domain features of the plurality of frequency domain features.

4. The method of claim 1, wherein the plurality of frequency domain features comprises at least two of: a spectral centroid, a spectral spread, a spectral roll-off, a spectral skewness, a root mean square (RMS) band energy, a total RMS energy, a spectral flatness, a spectral slope, a spectral kurtosis, a spectral flux, a spectral autocorrelation function, or a normalized variant thereof.

5. The method of claim 1, further comprising:
   denoising the acoustic signal prior to determining the plurality of frequency domain features, wherein the denoising the acoustic signal comprises median filtering the acoustic signal.

6. The method of claim 1, further comprising:
   normalizing the one or more frequency domain features prior to inputting the one or more frequency domain features into each fluid flow model of the plurality of fluid flow models.

7. The method of claim 1, wherein identifying the one or more depth intervals having fluid inflow comprises:
   identifying one or more anomalies in the acoustic signal using the one or more frequency domain features of the plurality of frequency domain features; and
   selecting depth intervals of the one or more anomalies as the one or more depth intervals of the plurality of depth intervals along the wellbore.

8. The method of claim 1, wherein identifying at least one of the gas phase inflow, the aqueous phase inflow, or the hydrocarbon liquid phase inflow comprises:
   wherein the plurality of fluid flow models comprise a plurality of logistic regression models for each of the gas phase inflow, the aqueous phase inflow, and the hydrocarbon liquid phase inflow; and
   determining that at least one of the gas phase inflow, the aqueous phase inflow, or the hydrocarbon liquid phase inflow is present based on the plurality of logistic regression models.

9. The method of claim 8, wherein the plurality of logistic regression models use a first multivariate model having the plurality of frequency domain features as inputs to determine when the gas phase inflow is present, wherein the plurality of logistic regression models use a second multivariate model having the plurality of frequency domain features as inputs to determine when the aqueous phase inflow is present, and wherein the plurality of logistic regression models use a third multivariate model having the plurality of frequency domain features as inputs to determine when the hydrocarbon liquid phase inflow is present.

10. The method of claim 1, further comprising:
    determining an amplitude of each of the identified at least one of the gas phase inflow, the aqueous phase inflow, or the hydrocarbon liquid phase inflow over a time period; and
    determining a relative contribution to a volumetric flow of each of the gas phase inflow, the aqueous phase inflow, or the hydrocarbon liquid phase inflow based on the amplitude of each of the identified at least one of the gas phase inflow, the aqueous phase inflow, or the hydrocarbon liquid phase inflow over the time period.

11. The method of claim 10, further comprising:
    determining a remediation procedure based on the relative contribution of each of the gas phase inflow, the aqueous phase inflow, or the hydrocarbon liquid phase inflow; and
    performing the remediation procedure.

12. The method of claim 8, wherein the plurality of frequency domain features comprise a normalized variant of a spectral spread and a normalized variant of a spectral centroid, and wherein the plurality of logistic regression models define a relationship between a presence or absence of the gas phase inflow, the aqueous phase inflow, or the hydrocarbon liquid phase inflow.

13. The method of claim 1, further comprising:
determining a confidence level for the identification of the at least one of the gas phase inflow, the aqueous phase inflow, or the hydrocarbon liquid phase inflow; and
performing a remediation procedure based on the confidence level.

14. The method of claim 1, wherein identifying the at least one of the gas phase inflow, the aqueous phase inflow, or the hydrocarbon liquid phase inflow using the plurality of the frequency domain features comprises: identifying the at least one of the gas phase inflow, the aqueous phase inflow, or the hydrocarbon liquid phase inflow using at least one of: transformations of at least one of the plurality of the frequency domain features, or a ratio between at least two of the plurality of the frequency domain features.

15. A method of characterizing fluid inflow into a wellbore, the method comprising:
obtaining an acoustic signal from a sensor within the well bore, wherein the acoustic signal comprises a plurality of acoustic samples across a plurality of depth intervals along the wellbore;
determining a plurality of frequency domain features from the acoustic signal, wherein the plurality of frequency domain features are obtained for each acoustic sample of the plurality of acoustic samples across the plurality of depth intervals, and wherein the plurality of frequency domain features comprise at least two different frequency domain features, and wherein the plurality of frequency domain features are determined from a frequency domain representation of the acoustic signal in a time domain;
identifying one or more fluid inflow locations within the plurality of depth intervals using one or more frequency domain features of the plurality of frequency domain features;
inputting, at the identified one or more fluid inflow locations, the one or more frequency domain features of the plurality of frequency domain features into each fluid flow model of a plurality of fluid flow models, wherein each fluid flow model is a machine learning model, and wherein the plurality of fluid flow models comprises a gas phase flow model, an aqueous phase flow model, and a hydrocarbon liquid phase flow model;
determining, for each of the identified one or more fluid inflow locations, an output from each fluid flow model; and
identifying, based on the output from each fluid flow model, at least one of a gas phase inflow, an aqueous phase inflow, or a hydrocarbon liquid phase inflow at the identified one or more fluid inflow locations using each fluid flow model of the plurality of fluid flow models, and wherein at least two of the plurality of fluid flow models use different parameters;
identifying a fluid flow regime based on the identifying of the at least one of the gas phase inflow, the aqueous phase inflow, the hydrocarbon liquid phase inflow, the gas phase flow, the aqueous phase flow, or the hydrocarbon liquid flow using the plurality of the frequency domain features at the identified one or more fluid inflow locations.

16. The method of claim 15, further comprising:
determining an amplitude of each of the determined at least one of the gas phase inflow, the aqueous phase inflow, or the hydrocarbon liquid phase inflow over a time period at the identified one or more fluid inflow locations; and
determining a relative contribution to a volumetric flow of each of the gas phase inflow, the aqueous phase inflow, or the hydrocarbon liquid phase inflow based on the amplitude of each of the identified at least one of the gas phase inflow, the aqueous phase inflow, or the hydrocarbon liquid phase inflow over the time period.

17. The method of claim 15, wherein the plurality of fluid flow models comprises a plurality of logistic regression models, and wherein determining at least one of the gas phase inflow, the aqueous phase inflow, or the hydrocarbon liquid phase using the plurality of fluid flow models comprises:
providing the plurality of frequency domain features to the plurality of logistic regression models corresponding to each of the gas phase inflow, the aqueous phase inflow, and the hydrocarbon liquid phase inflow; and
determining that at least one of the gas phase inflow, the aqueous phase inflow, or the hydrocarbon liquid phase inflow is present based on outputs from each of the plurality of logistic regression models.

18. The method of claim 17, wherein the plurality of logistic regression models uses a first multivariate model having a first subset of the plurality of frequency domain features as inputs to determine when the gas phase inflow is present, wherein the plurality of logistic regression models uses a second multivariate model having a second subset of the plurality of frequency domain features as inputs to determine when the aqueous phase inflow is present, and wherein the plurality of logistic regression models uses a third multivariate model having a third subset of the plurality of frequency domain features as inputs to determine when the hydrocarbon liquid phase inflow is present.

19. The method of claim 18, wherein determining at least one of the gas phase inflow, the aqueous phase inflow, or the hydrocarbon liquid phase using the fluid flow model comprises:
using the first subset of the plurality of frequency domain features at the identified one or more fluid inflow locations in the first multivariate model;
using the second subset of the plurality of frequency domain features at the identified one or more fluid inflow locations in the second multivariate model;
using the third subset of the plurality of frequency domain features at the identified one or more fluid inflow locations in the third multivariate model;
comparing the plurality of frequency domain features to an output of the first multivariate model, an output of the second multivariate model, and an output of the third multivariate model; and
identifying at least one of the gas phase inflow, the aqueous phase inflow, or the hydrocarbon liquid phase inflow based on the comparison of the plurality of frequency domain features to the output of the first multivariate model, the output of the second multivariate model, and the output of the third multivariate model.

20. The method of claim 15, further comprising:
- integrating a total acoustic energy from the acoustic signal for each of the identified gas phase inflow, the aqueous phase inflow, or the hydrocarbon liquid phase inflow at each depth corresponding to the identified one or more fluid inflow locations;
- determine an amplitude of the total acoustic energy for each of the identified gas phase inflow, the aqueous phase inflow, or the hydrocarbon liquid phase inflow at each depth corresponding to the identified one or more fluid inflow locations; and
- determine a volume of each of the gas phase inflow, the aqueous phase inflow, or the hydrocarbon liquid phase inflow at each depth corresponding to the identified one or more fluid inflow locations using the amplitude of the total acoustic energy.

\* \* \* \* \*